US012813182B2

(12) United States Patent
Hodo et al.

(10) Patent No.: US 12,813,182 B2
(45) Date of Patent: Nov. 24, 2026

(54) METHOD FOR MANUFACTURING STACK AND METHOD FOR MANUFACTURING SEMICONDUCTOR DEVICE

(71) Applicant: Semiconductor Energy Laboratory Co., Ltd., Atsugi (JP)

(72) Inventors: Ryota Hodo, Atsugi (JP); Toshiya Endo, Atsugi (JP); Masaru Nakano, Isehara (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 218 days.

(21) Appl. No.: 18/852,693

(22) PCT Filed: Apr. 6, 2023

(86) PCT No.: PCT/IB2023/053509
§ 371 (c)(1),
(2) Date: Sep. 30, 2024

(87) PCT Pub. No.: WO2023/199181
PCT Pub. Date: Oct. 19, 2023

(65) Prior Publication Data

US 2025/0226234 A1 Jul. 10, 2025

(30) Foreign Application Priority Data

Apr. 15, 2022 (JP) ................................ 2022-067489

(51) Int. Cl.
*H10P 50/28* (2026.01)
*H10D 84/01* (2026.01)
(Continued)

(52) U.S. Cl.
CPC ....... *H10P 50/283* (2026.01); *H10D 84/0126* (2025.01); *H10P 50/73* (2026.01); *H10B 12/01* (2023.02)

(58) Field of Classification Search
CPC ... H10P 50/283; H10P 50/73; H10D 84/0126; H10B 12/01
See application file for complete search history.

(56) References Cited

U.S. PATENT DOCUMENTS 8,455,868 B2 6/2013 Yamazaki et al.
8,547,771 B2 10/2013 Koyama
(Continued)

FOREIGN PATENT DOCUMENTS

CN 113924657 A 1/2022
JP 2011-151383 A 8/2011
(Continued)

OTHER PUBLICATIONS

International Search Report (Application No. PCT/IB2023/053509) Dated Jul. 18, 2023.
(Continued)

*Primary Examiner* — Anita K Alanko
(74) *Attorney, Agent, or Firm* — Eric J. Robinson; Robinson Intellectual Property Law Office, P.C.

(57) ABSTRACT

A semiconductor device that can be miniaturized or highly integrated is provided. An oxide semiconductor, a first conductor, a first insulator, a second insulator, an inorganic film, a first coating film, a second coating film, and a resist mask are formed in this order over a substrate. The second coating film is processed by a dry etching method, thereby forming an island-shaped second coating film. The first coating film is processed by a dry etching method using the island-shaped second coating film as a mask, thereby forming an island-shaped first coating film and removing the
(Continued)

resist mask. The inorganic film, the second insulator, the first insulator, and the first conductor are processed in this order by a dry etching method using the island-shaped first coating film as a mask, thereby forming an island-shaped inorganic film, an island-shaped second insulator, an island-shaped first insulator, and an island-shaped first conductor and removing the island-shaped second coating film. The oxide semiconductor is processed by a dry etching method using the island-shaped inorganic film as a mask, thereby forming an island-shaped oxide semiconductor and removing the island-shaped first coating film. The island-shaped inorganic film is removed by a dry etching method. The first insulator is a nitride. The second insulator is an oxide.

12 Claims, 30 Drawing Sheets

(51) Int. Cl.

| | |
|---|---|
| ***H10P 50/00*** | (2026.01) |
| *H10B 12/00* | (2023.01) |

(56) References Cited

U.S. PATENT DOCUMENTS

| | | | | |
|---|---|---|---|---|
| 8,995,174 | B2 | 3/2015 | Koyama | |
| 9,349,735 | B2 | 5/2016 | Yamazaki et al. | |
| 9,991,265 | B2 | 6/2018 | Yamazaki et al. | |
| 10,186,614 | B2 | 1/2019 | Asami | |
| 10,553,589 | B2 | 2/2020 | Yamazaki et al. | |
| 11,177,792 | B2 | 11/2021 | Koyama | |
| 11,456,296 | B2 | 9/2022 | Yamazaki et al. | |
| 11,677,384 | B2 | 6/2023 | Koyama | |
| 11,825,665 | B2 | 11/2023 | Yamazaki et al. | |
| 12,021,530 | B2 | 6/2024 | Koyama | |
| 12,581,747 | B2 * | 3/2026 | Yamazaki | H10D 99/00 |
| 12,635,258 | B2 * | 5/2026 | Yamazaki | H10D 99/00 |
| 2015/0221774 | A1 * | 8/2015 | Yamazaki | H10D 30/6704 257/43 |
| 2015/0280691 | A1 | 10/2015 | Koyama | |
| 2016/0300933 | A1 * | 10/2016 | Sasagawa | H10D 30/6739 |
| 2017/0125450 | A1 * | 5/2017 | Hodo | H10D 30/6734 |
| 2022/0216341 | A1 | 7/2022 | Yamazaki et al. | |
| 2022/0238719 | A1 | 7/2022 | Yamazaki et al. | |
| 2022/0416059 | A1 | 12/2022 | Yamazaki et al. | |
| 2023/0034397 | A1 | 2/2023 | Hodo et al. | |
| 2023/0413587 | A1 | 12/2023 | Yamazaki et al. | |
| 2024/0305277 | A1 | 9/2024 | Koyama | |

FOREIGN PATENT DOCUMENTS

| | | | |
|---|---|---|---|
| JP | 2012-257187 | A | 12/2012 |
| KR | 2022-0020831 | A | 2/2022 |
| TW | 202046406 | | 12/2020 |
| WO | WO-2016/125052 | | 8/2016 |
| WO | WO-2020/229914 | | 11/2020 |
| WO | WO-2020/250083 | | 12/2020 |
| WO | WO-2021/070007 | | 4/2021 |
| WO | WO-2021/130592 | | 7/2021 |

OTHER PUBLICATIONS

Written Opinion (Application No. PCT/IB2023/053509) Dated Jul. 18, 2023.

Qiuxia.X et al., "Reactive ion etching of TiSi2/n+ polysilicon polycide structure for very large scale integrated application", J. Vac. Sci. Technol. B (Journal of Vacuum Science & Technology B), Sep. 1, 1990, vol. 8, No. 5, pp. 1058-1061.

* cited by examiner

METHOD FOR MANUFACTURING STACK AND METHOD FOR MANUFACTURING SEMICONDUCTOR DEVICE

TECHNICAL FIELD

One embodiment of the present invention relates to a method for processing a stack including an oxide semiconductor layer and a conductor layer. Another embodiment of the present invention relates to a semiconductor device, a memory device, and an electronic device each including the stack. Another embodiment of the present invention relates to a method for manufacturing a semiconductor device including the stack.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a method for driving any of them, and a method for manufacturing any of them.

In this specification and the like, a semiconductor device means any device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

BACKGROUND ART

In recent years, the development of semiconductor devices has progressed, and LSIs, CPUs, memories, and the like are mainly used as the semiconductor devices. A CPU is an aggregation of semiconductor elements; the CPU includes a semiconductor integrated circuit (including at least a transistor and a memory) formed into a chip by processing a semiconductor wafer, and is provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a material of a semiconductor thin film that can be used in a transistor. As another material, an oxide semiconductor has been attracting attention.

It is known that a transistor using an oxide semiconductor has an extremely low leakage current in an off state. For example, Patent Document 1 discloses a low-power-consumption CPU utilizing a characteristically low leakage current of the transistor using an oxide semiconductor. As another example, Patent Document 2 discloses a memory device that can retain stored contents for a long time by utilizing a feature of a low leakage current of the transistor using an oxide semiconductor.

Patent Document 3 discloses a transistor having a minute structure in which a source electrode layer and a drain electrode layer are provided in contact with the top surface of an oxide semiconductor layer.

REFERENCE

Patent Document

[Patent Document 1] Japanese Published Patent Application No. 2012-257187

[Patent Document 2] Japanese Published Patent Application No. 2011-151383

[Patent Document 3] PCT International Publication No. 2016/125052

SUMMARY OF THE INVENTION

Problems to be Solved by the Invention

An object of one embodiment of the present invention is to provide a method for processing a stack that has a minute structure and includes an oxide semiconductor layer and a conductor layer. Another object of one embodiment of the present invention is to provide a method for manufacturing a semiconductor device including the stack. Another object of one embodiment of the present invention is to provide a semiconductor device that can be miniaturized or highly integrated. Another object of one embodiment of the present invention is to provide a semiconductor device with high operating speed. Another object of one embodiment of the present invention is to provide a semiconductor device with favorable electrical characteristics. Another object of one embodiment of the present invention is to provide a semiconductor device with a small variation in electrical characteristics of transistors. Another object of one embodiment of the present invention is to provide a highly reliable semiconductor device. Another object of one embodiment of the present invention is to provide a semiconductor device with a high on-state current. Another object of one embodiment of the present invention is to provide a semiconductor device with low power consumption. Another object of one embodiment of the present invention is to provide a novel semiconductor device. Another object of one embodiment of the present invention is to provide a method for manufacturing a semiconductor device with high productivity. Another object of one embodiment of the present invention is to provide a method for manufacturing a novel semiconductor device.

Another object of one embodiment of the present invention is to provide a memory device with large memory capacity. Another object of one embodiment of the present invention is to provide a memory device with high operating speed. Another object of one embodiment of the present invention is to provide a memory device with low power consumption. Another object of one embodiment of the present invention is to provide a novel memory device.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a method for manufacturing a stack, including: forming an oxide semiconductor, a first conductor, a first insulator including a nitride, a second insulator including an oxide, an inorganic film, a first coating film, and a second coating film in this order over a substrate; forming a resist mask over the second coating film; processing the second coating film by a dry etching method using the resist mask as a mask, thereby forming an island-shaped second coating film; processing the first coating film by a dry etching method using the island-shaped second coating film as a mask, thereby forming an island-shaped first coating film and removing the resist mask; processing the inorganic film, the second insulator, the first insulator, and the first conductor in this order by a dry etching method using the island-shaped first coating film as a mask, thereby forming an island-shaped inorganic film, an island-shaped second insulator, an island-shaped first insulator, and an island-shaped first conductor and removing the island-shaped second coating film; processing the oxide semiconductor by a dry etching method using the island-shaped inorganic film as a mask, thereby forming an island-shaped oxide semiconductor and removing the island-shaped first coating film; and removing the island-shaped inorganic film by a dry etching method.

In the above, the oxide semiconductor preferably includes indium, gallium, and zinc.

In the above, the first conductor preferably includes tantalum nitride.

In the above, the first conductor may have a stacked-layer structure of a layer including tantalum nitride and a layer including tungsten over the layer including tantalum nitride.

In the above, the first insulator preferably includes silicon nitride.

In the above, the second insulator preferably includes silicon oxide.

In the above, the inorganic film preferably includes tungsten.

In the above, the first coating film preferably includes carbon.

In the above, the second coating film preferably includes silicon and oxygen.

In the above, it is preferable that a third insulator and a fourth insulator be deposited in this order between the substrate and the oxide semiconductor, and after formation of the island-shaped oxide semiconductor, the fourth insulator be processed by a dry etching method using the island-shaped inorganic film as a mask to form an island-shaped fourth insulator.

In the above, it is preferable that the third insulator include hafnium oxide and the fourth insulator include silicon oxide.

Another embodiment of the present invention is a method for manufacturing a semiconductor device, including: after processing a stack by the above-described method for manufacturing a stack, dividing the first conductor into a second conductor and a third conductor; and forming a fifth insulator and a fourth conductor over the fifth insulator to overlap with a region between the second conductor and the third conductor.

Effect of the Invention

One embodiment of the present invention can provide a method for processing a stack that has a minute structure and includes an oxide semiconductor layer and a conductor layer. Another embodiment of the present invention can provide a method for manufacturing a semiconductor device including the stack. Another embodiment of the present invention can provide a semiconductor device that can be miniaturized or highly integrated. Another embodiment of the present invention can provide a semiconductor device with high operating speed. Another embodiment of the present invention can provide a semiconductor device with favorable electrical characteristics. Another embodiment of the present invention can provide a semiconductor device with a small variation in electrical characteristics of transistors. Another embodiment of the present invention can provide a highly reliable semiconductor device. Another embodiment of the present invention can provide a semiconductor device with a high on-state current. Another embodiment of the present invention can provide a semiconductor device with low power consumption. Another embodiment of the present invention can provide a novel semiconductor device. Another embodiment of the present invention can provide a method for manufacturing a semiconductor device with high productivity. Another embodiment of the present invention can provide a method for manufacturing a novel semiconductor device.

Another embodiment of the present invention can provide a memory device with large memory capacity. Another embodiment of the present invention can provide a memory device with high operating speed. Another embodiment of the present invention can provide a memory device with low power consumption. Another embodiment of the present invention can provide a novel memory device.

Note that the description of these effects does not preclude the existence of other effects. One embodiment of the present invention does not necessarily have all of these effects. Other effects can be derived from the description of the specification, the drawings, and the claims.

Figure 10A:
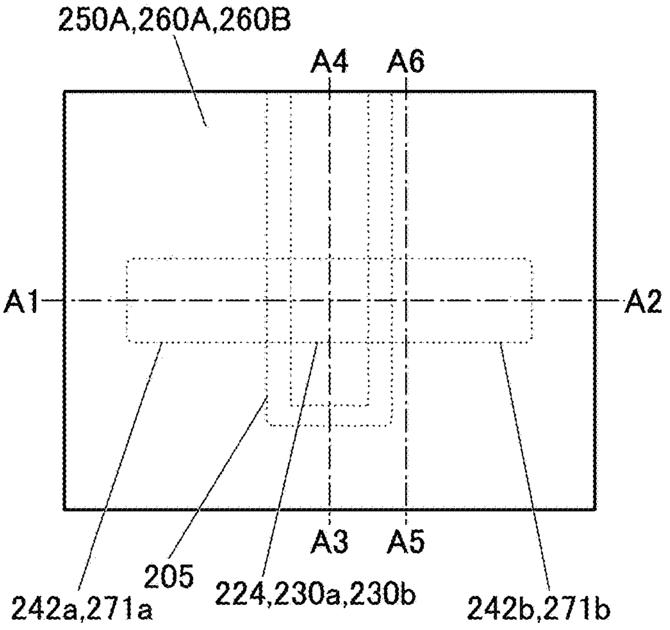
FIG. 10A is a plan view illustrating an example of a method for manufacturing a semiconductor device. FIG.
Figure 10C:
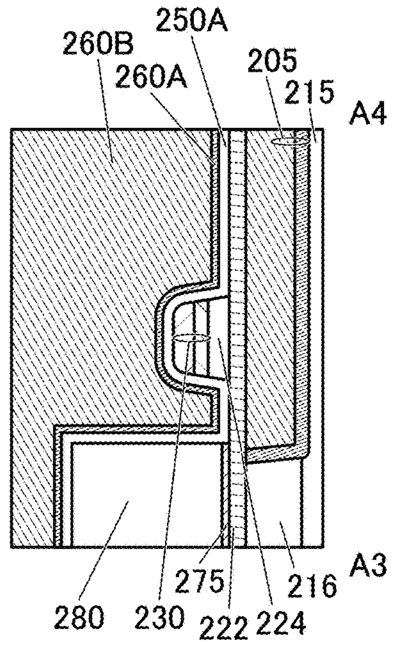
Figure 10B:
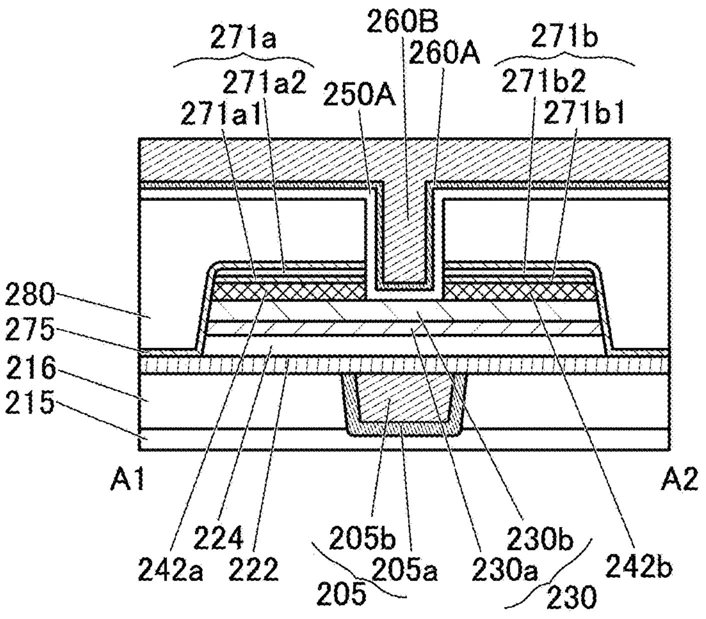
Figure 10D:
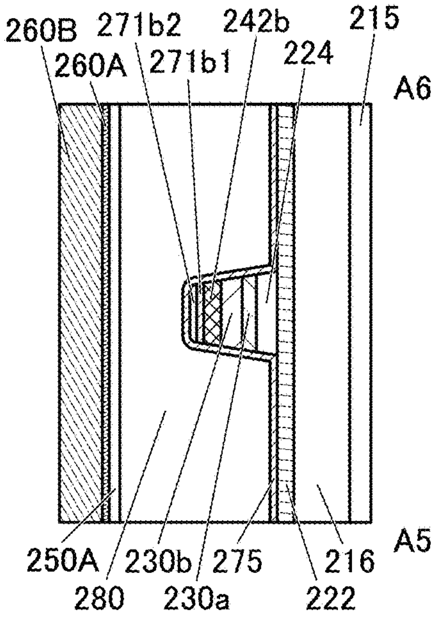

10B to FIG. 10D are cross-sectional views illustrating an example of a method for manufacturing a semiconductor device.

Figure 11A:
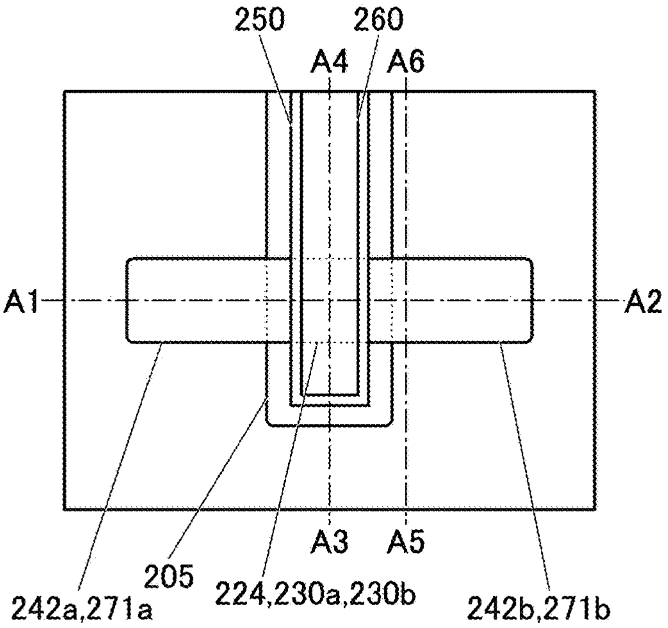
Figure 11C:
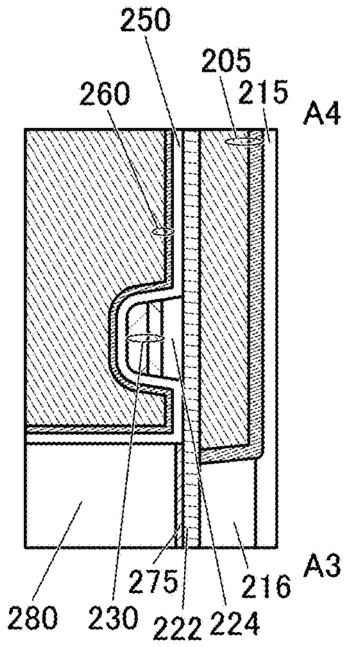
Figure 11B:
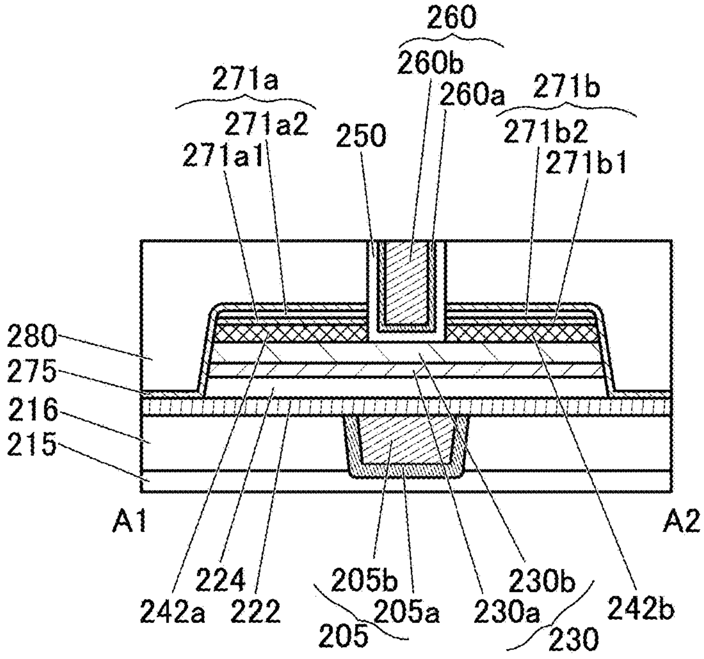
Figure 11D:
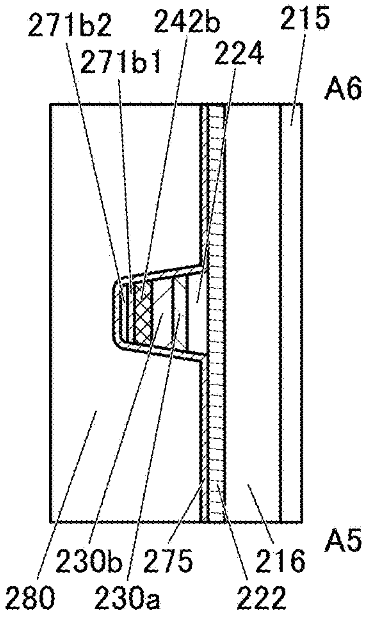

FIG. 11A is a plan view illustrating an example of a method for manufacturing a semiconductor device. FIG. 11B to FIG. 11D are cross-sectional views illustrating an example of a method for manufacturing a semiconductor device.

Figure 12:
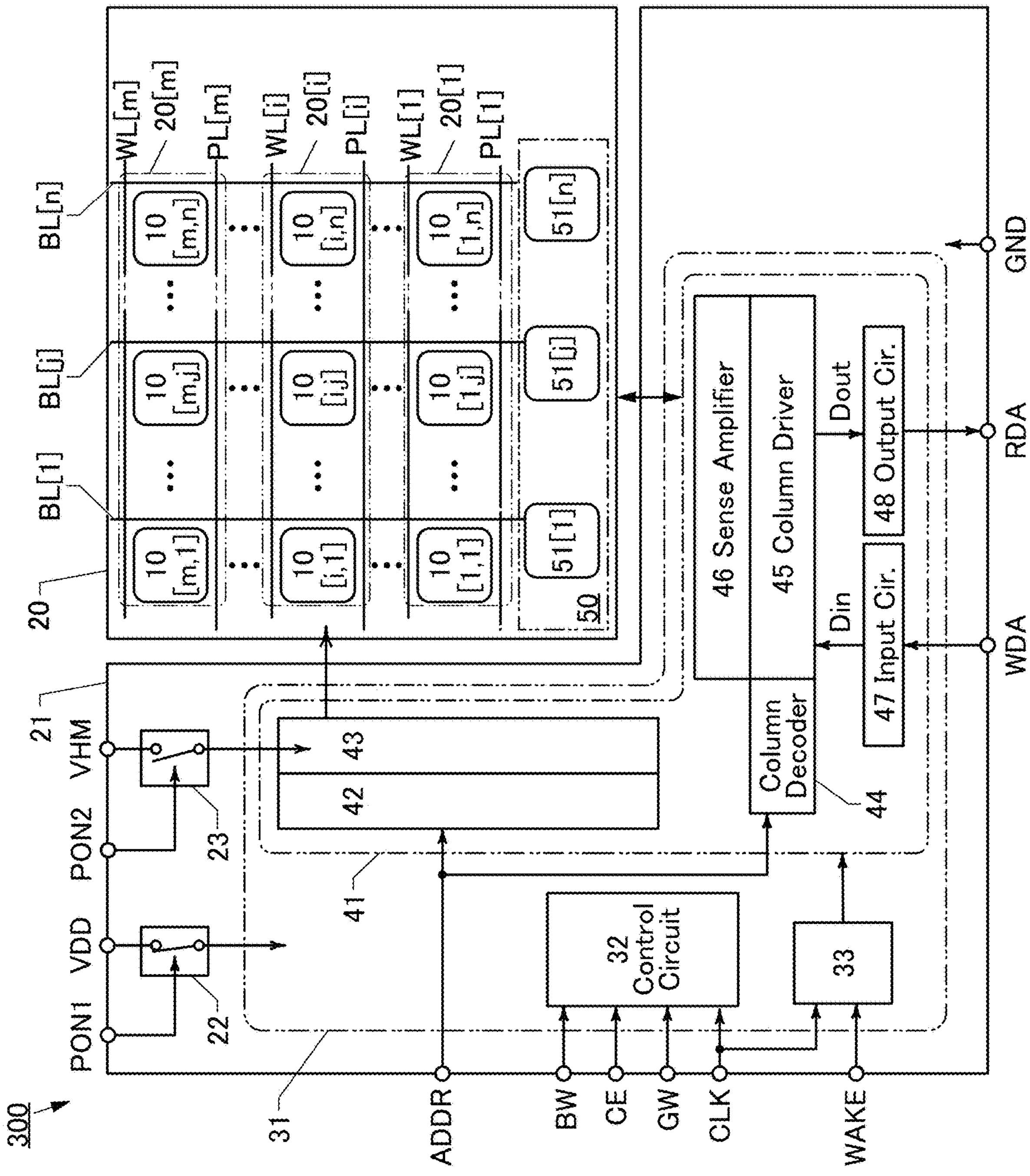

FIG. 12 is a block diagram illustrating an example of a memory device.

Figure 13A:
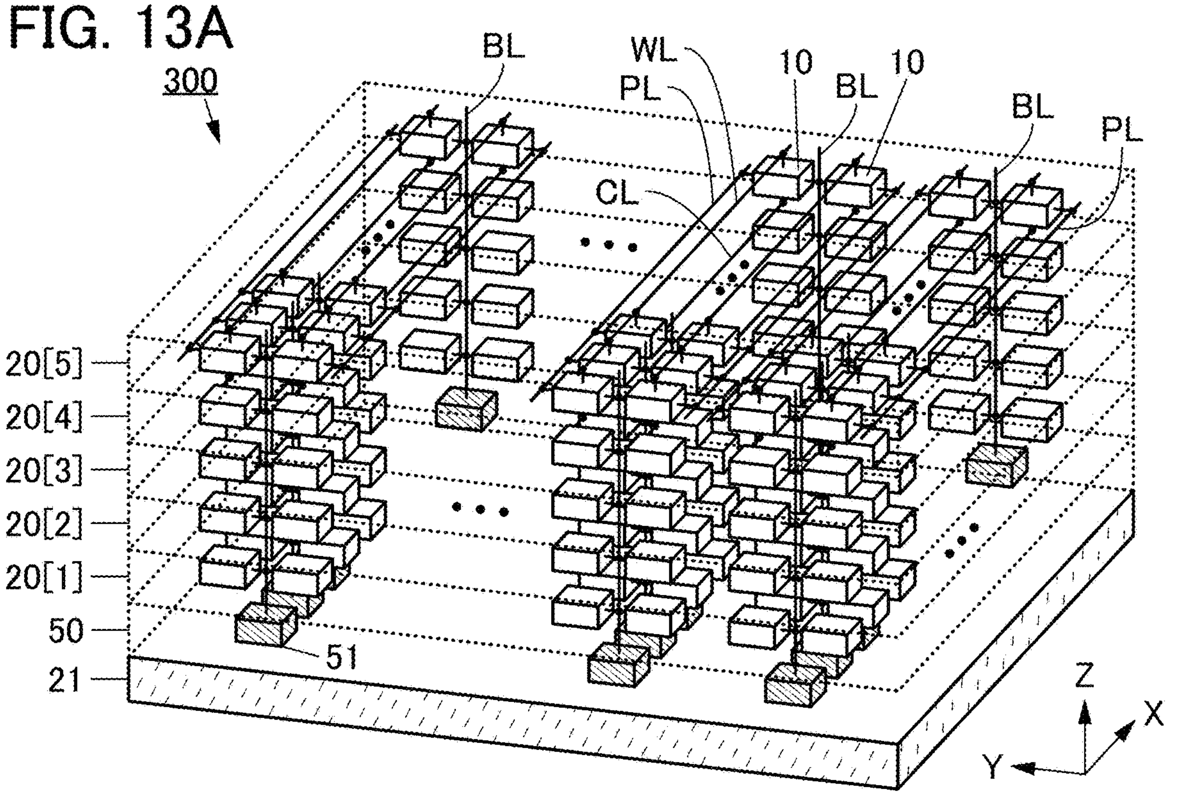
Figure 13B:
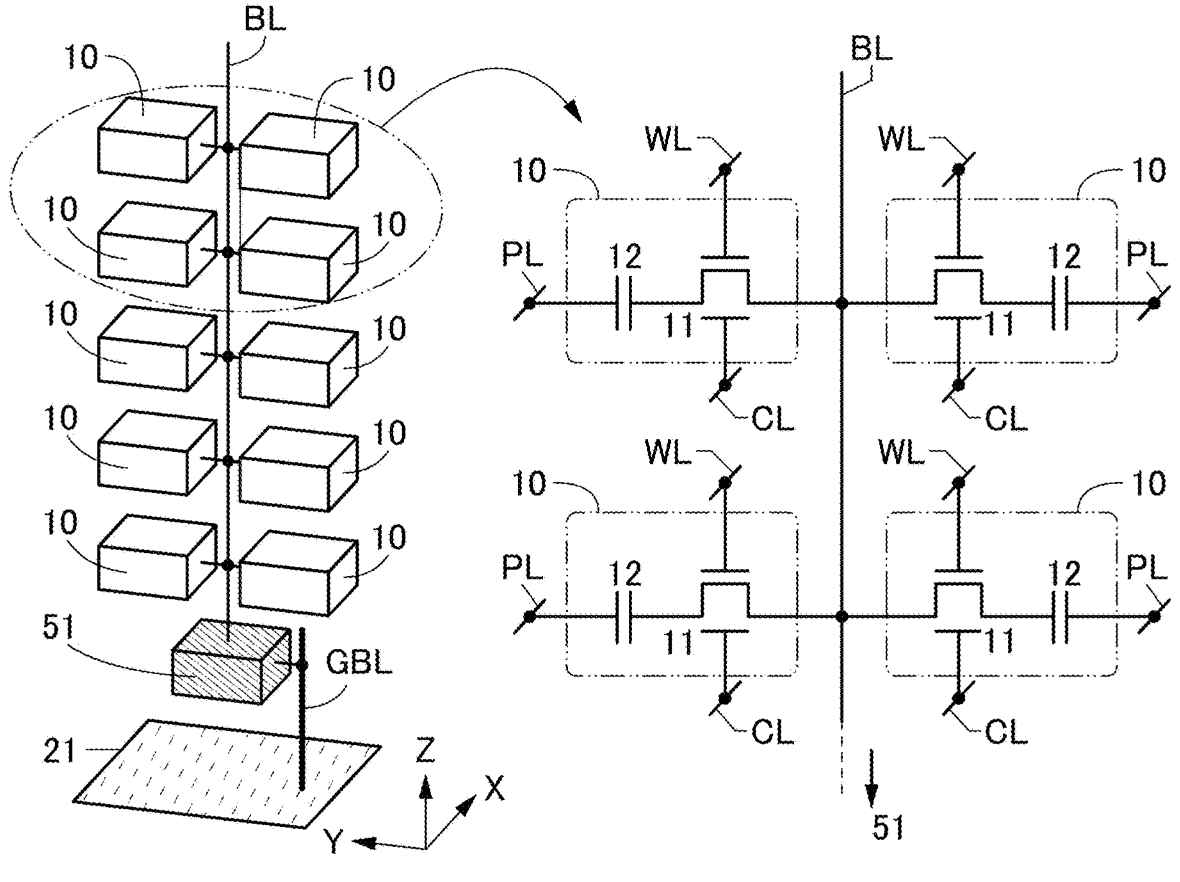

FIG. 13A and FIG. 13B are schematic views and a circuit diagram illustrating an example of a memory device.

Figure 14A:
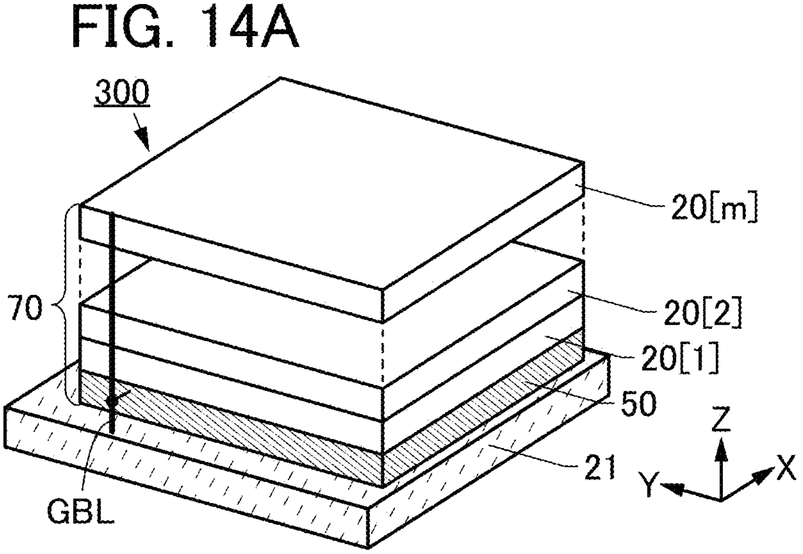
Figure 14B:
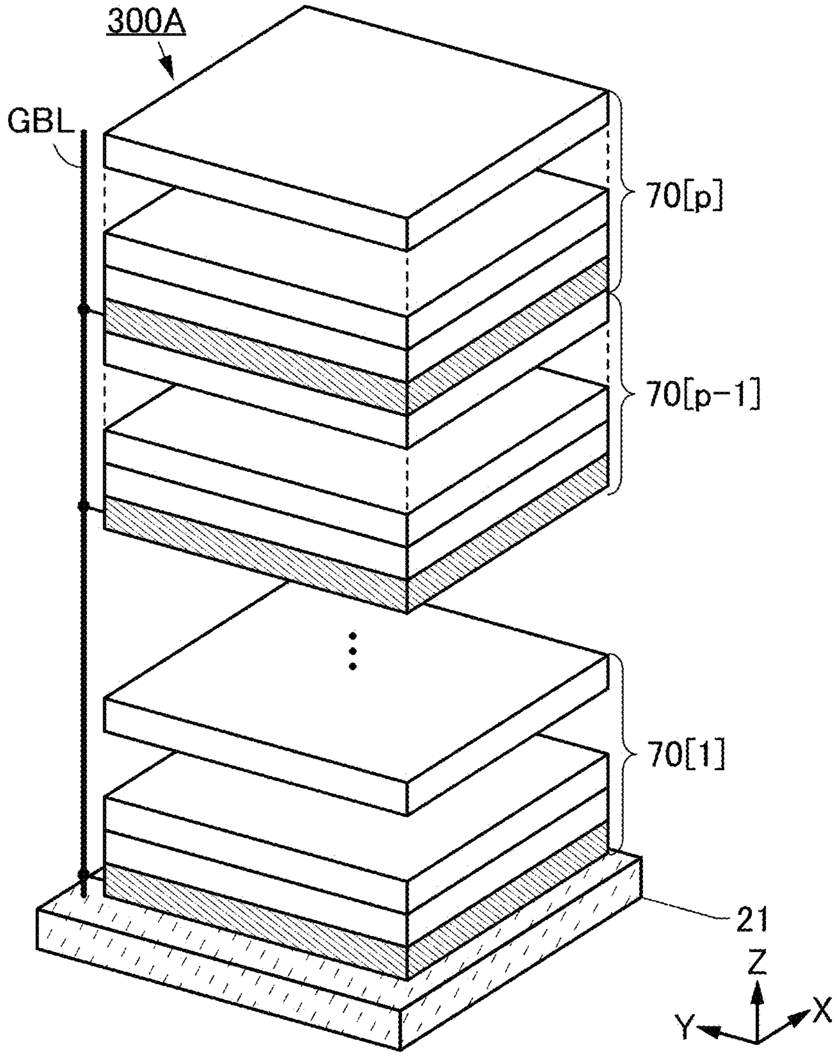

FIG. 14A and FIG. 14B are schematic views illustrating examples of a memory device.

Figure 15:
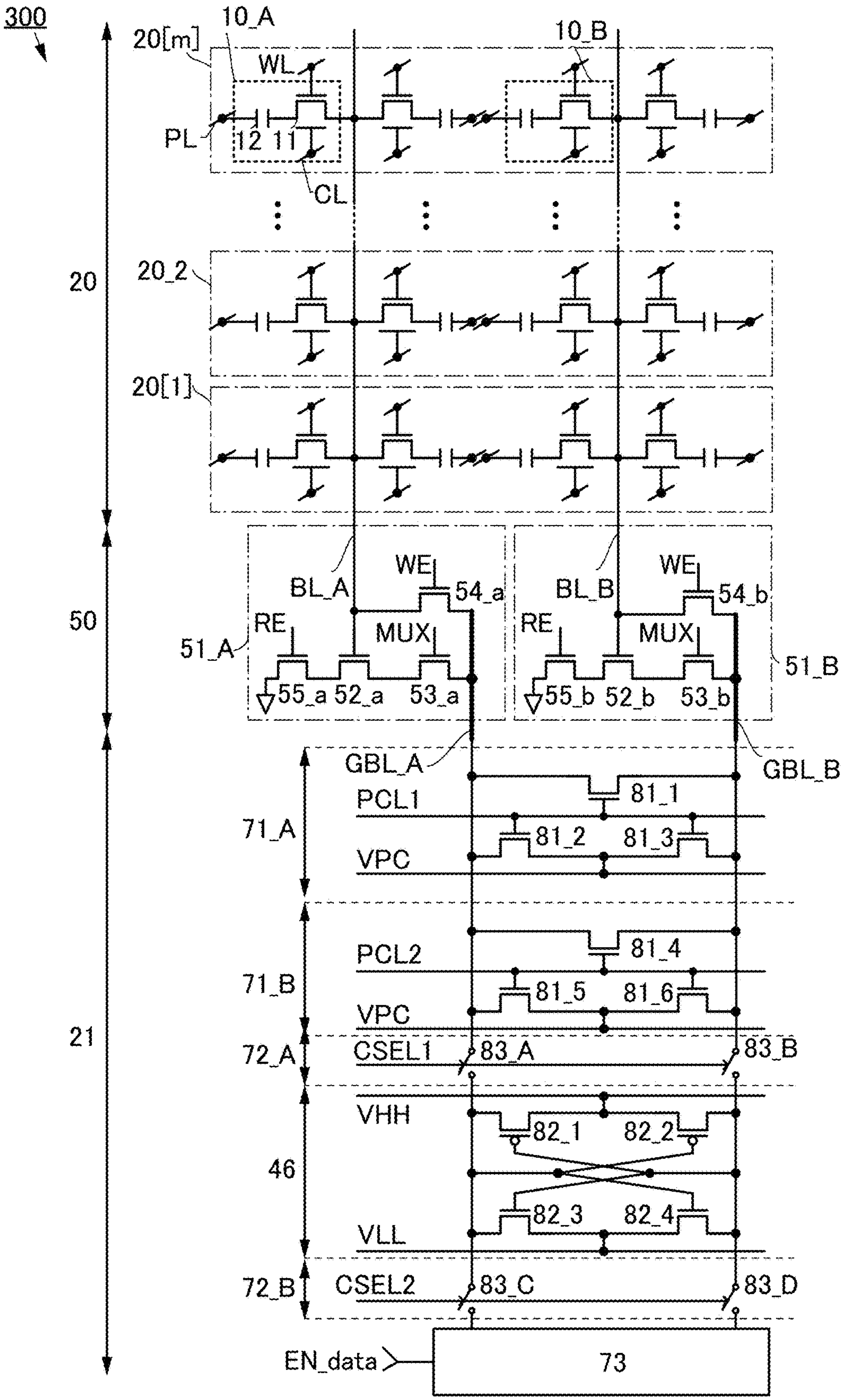

FIG. 15 is a circuit diagram illustrating an example of a memory device.

Figure 16:
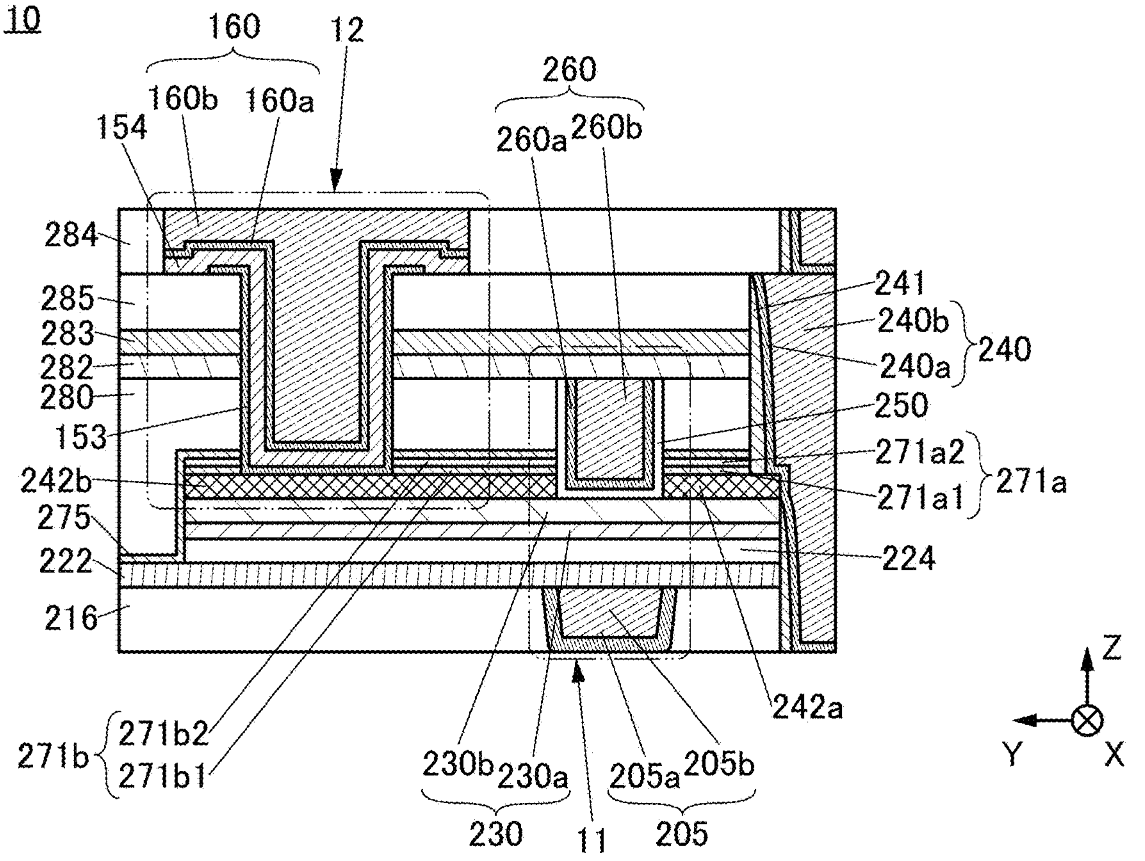

FIG. 16 is a cross-sectional view illustrating an example of a memory device.

Figure 17:
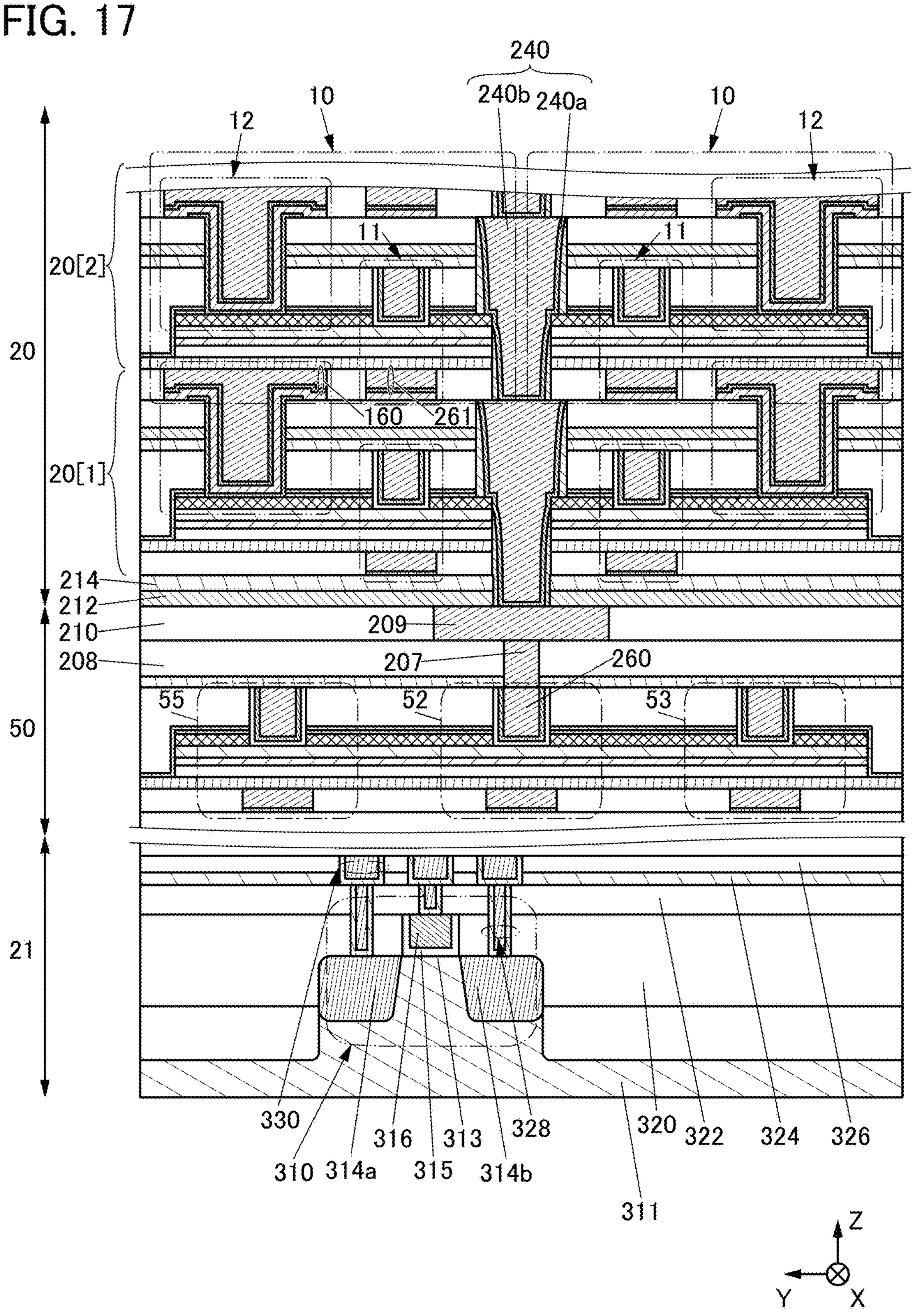

FIG. 17 is a cross-sectional view illustrating an example of a memory device.

Figure 18A:
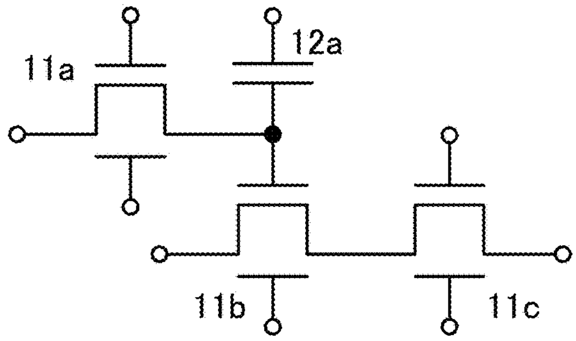
Figure 18B:
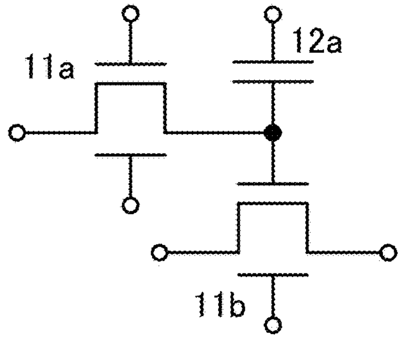
Figure 18C:
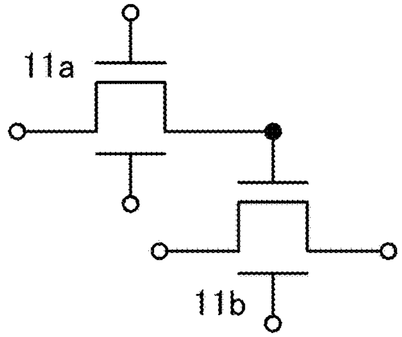

FIG. 18A to FIG. 18C are circuit diagrams illustrating examples of a memory device.

Figure 19A:
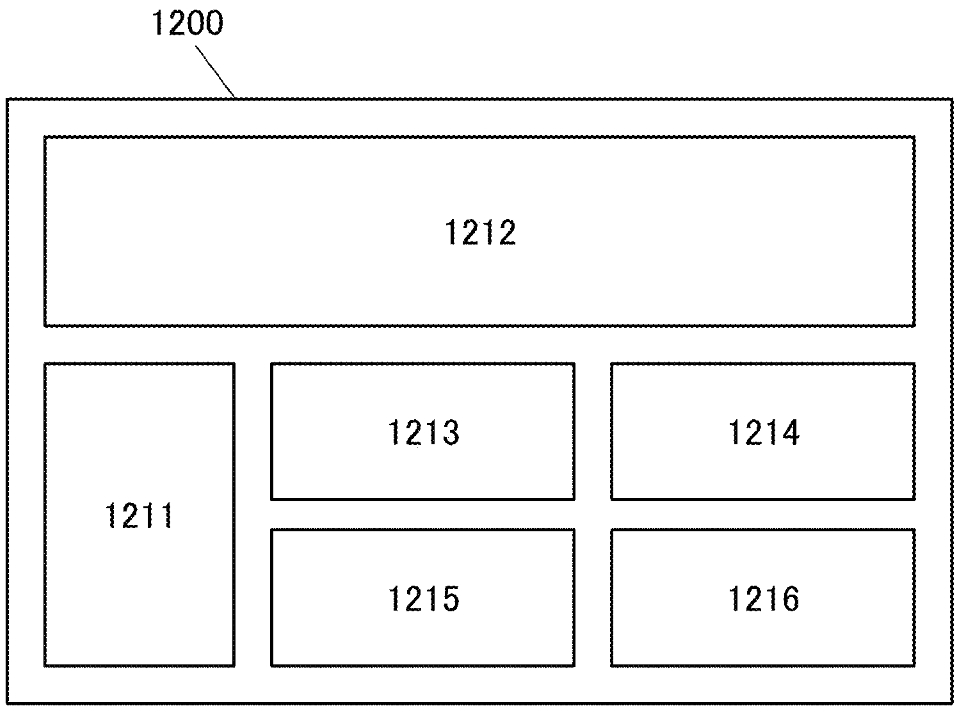
Figure 19B:
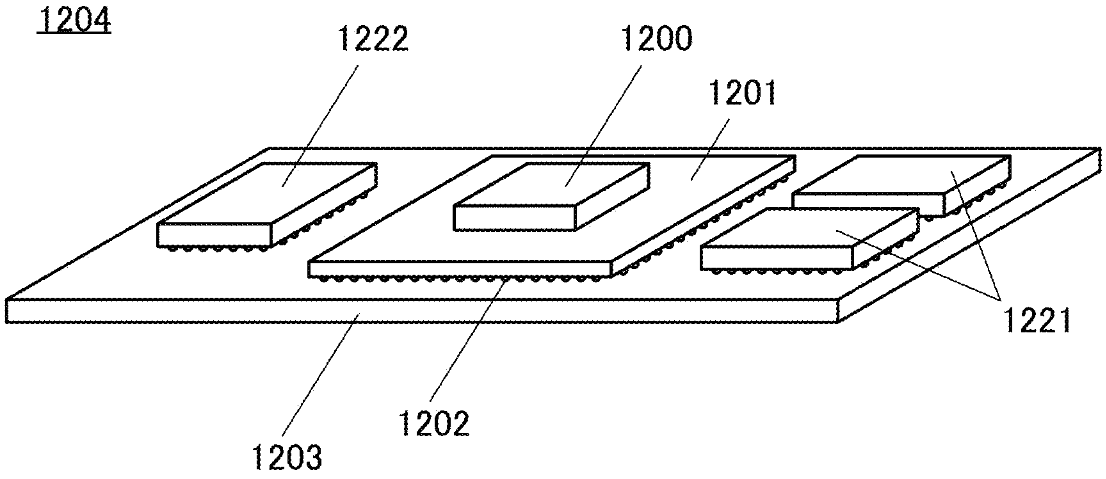

FIG. 19A and FIG. 19B are diagrams illustrating an example of a semiconductor device.

Figure 20A:
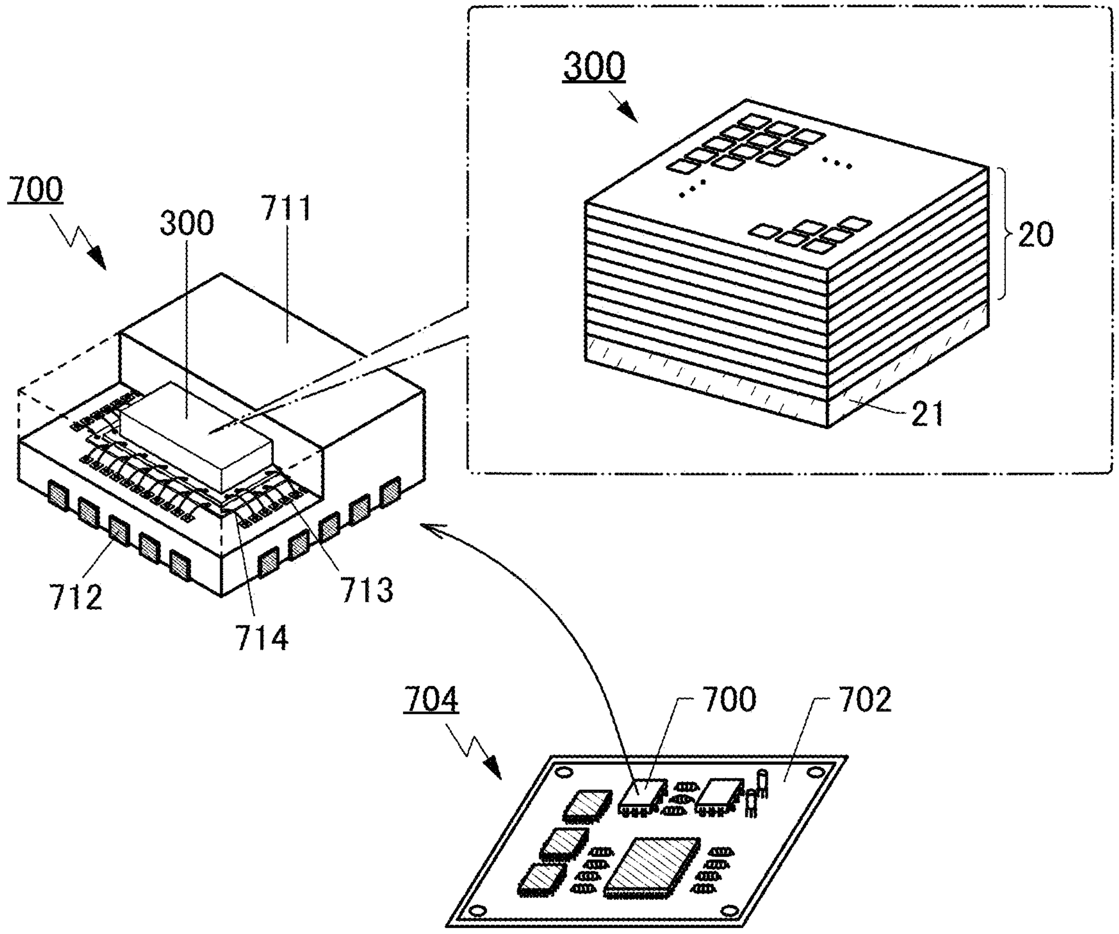
Figure 20B:
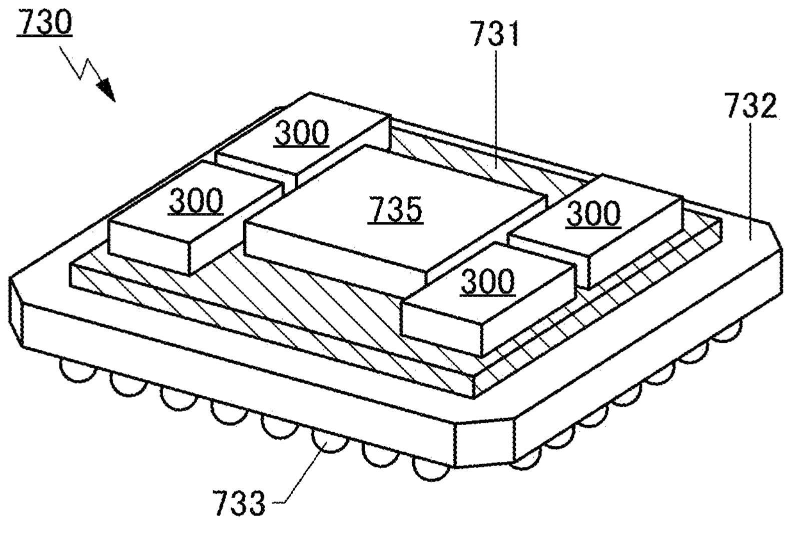

FIG. 20A and FIG. 20B are diagrams illustrating examples of electronic devices.

FIG. 21A to FIG. 21J are diagrams illustrating examples of electronic devices.

FIG. 22A to FIG. 22E are diagrams illustrating examples of electronic devices.

Figure 23A:
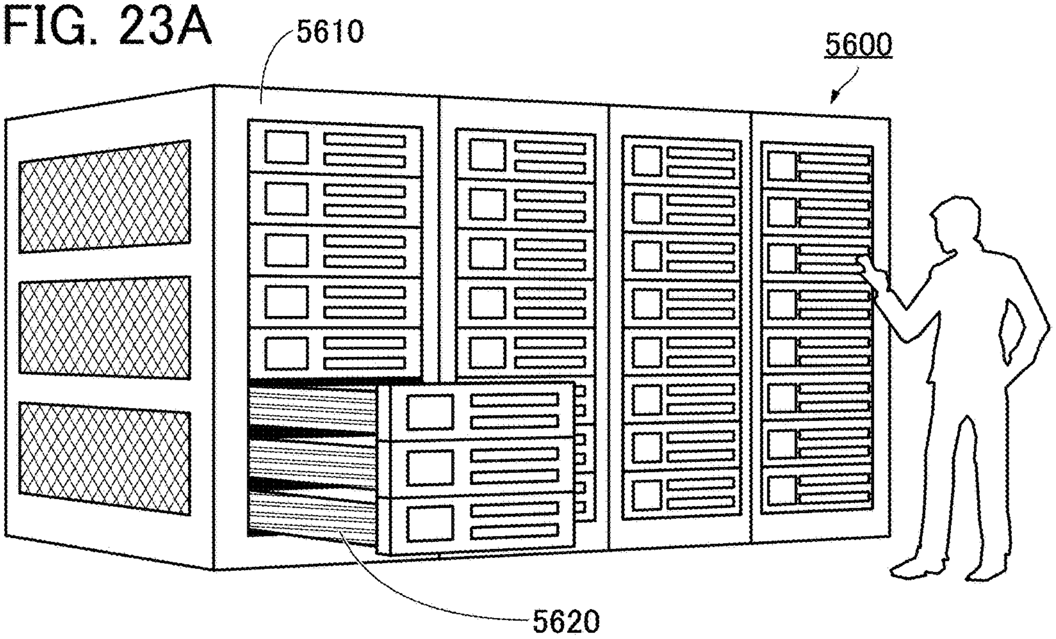
Figure 23B:
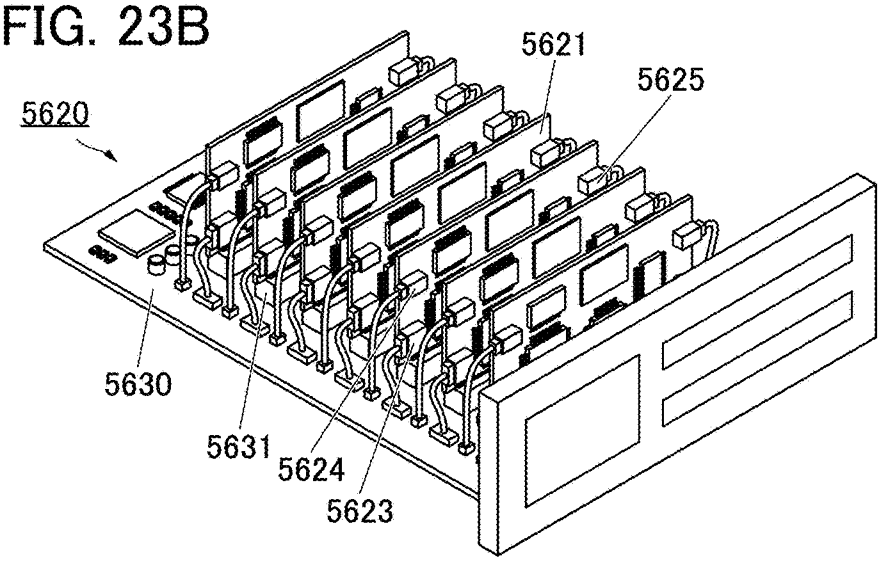
Figure 23C:
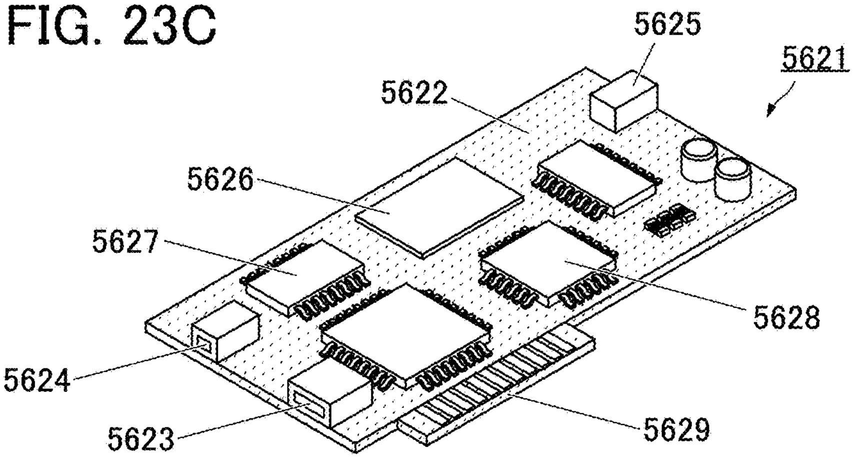

FIG. 23A to FIG. 23C are diagrams illustrating examples of an electronic device.

Figure 24:
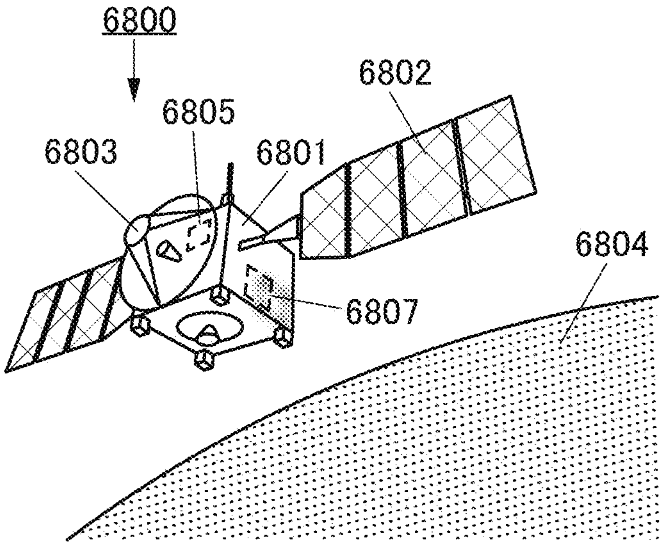

FIG. 24 is a diagram illustrating an example of a device for space.

Figure 25A:
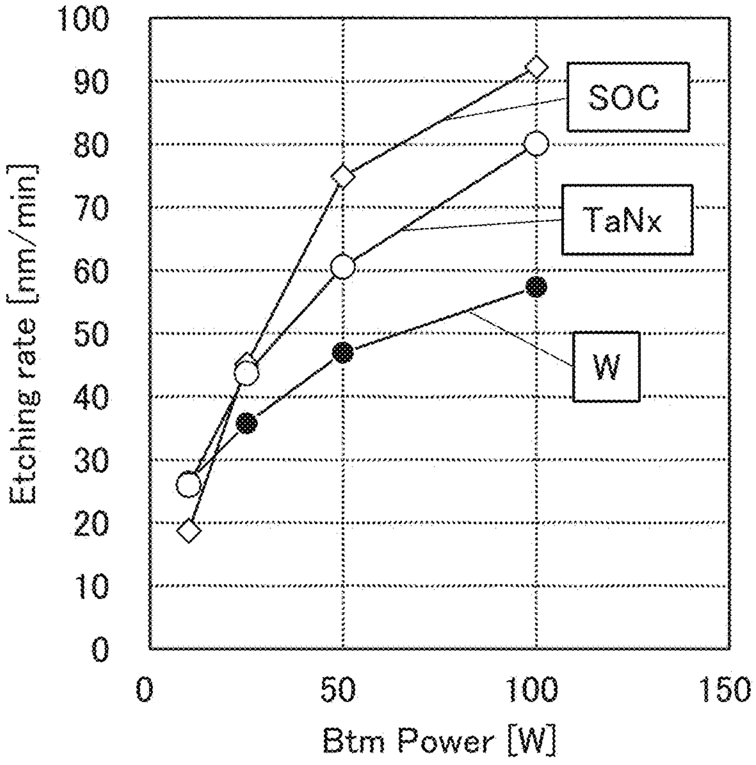
Figure 25B:
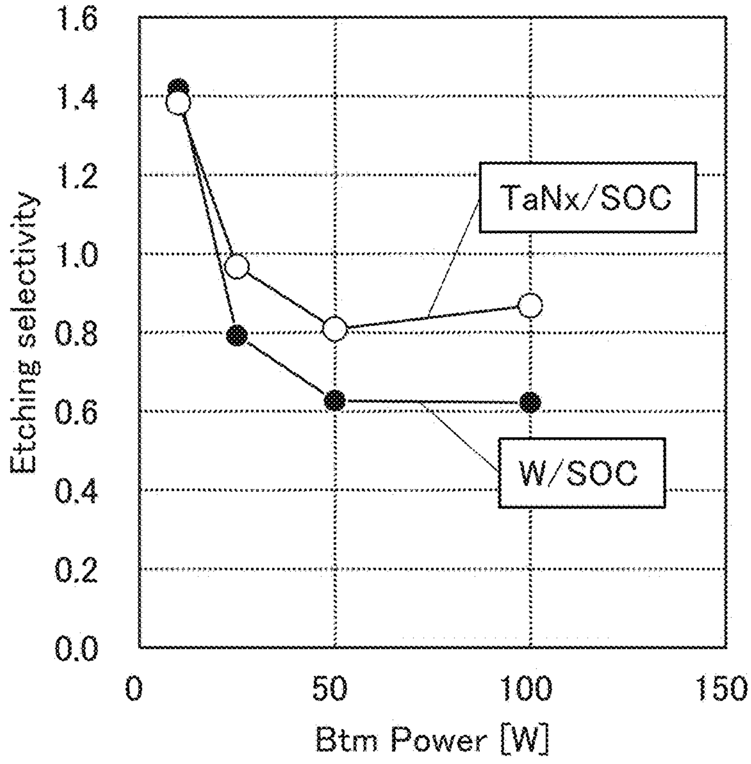

FIG. 25A and FIG. 25B are graphs in Example.

Figure 26A:
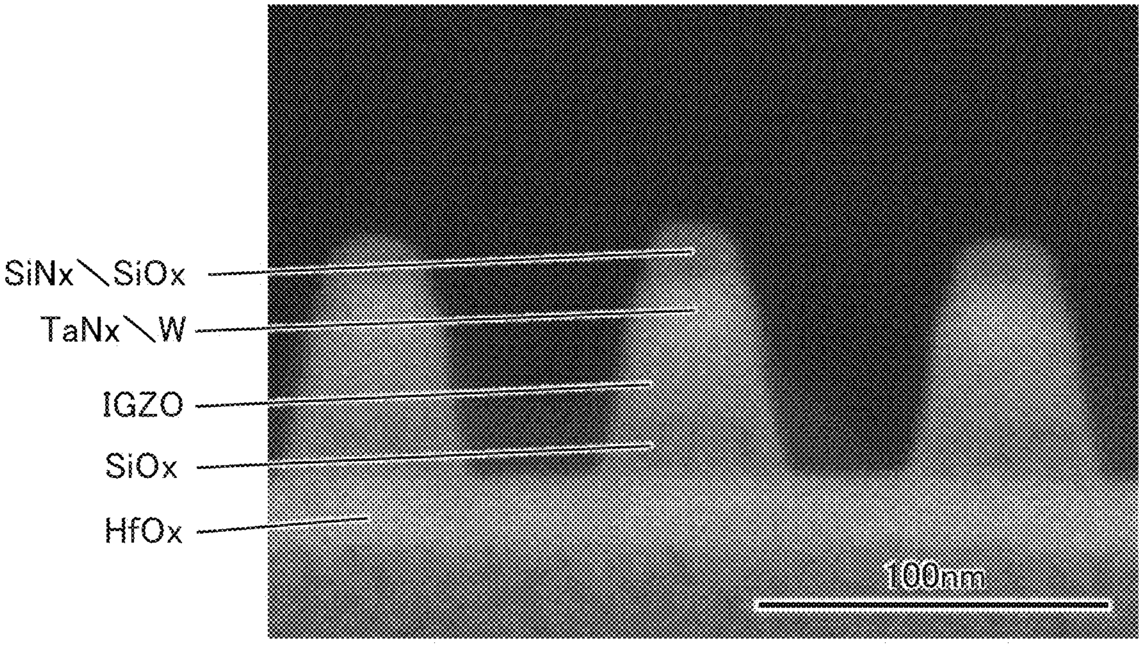
Figure 26B:
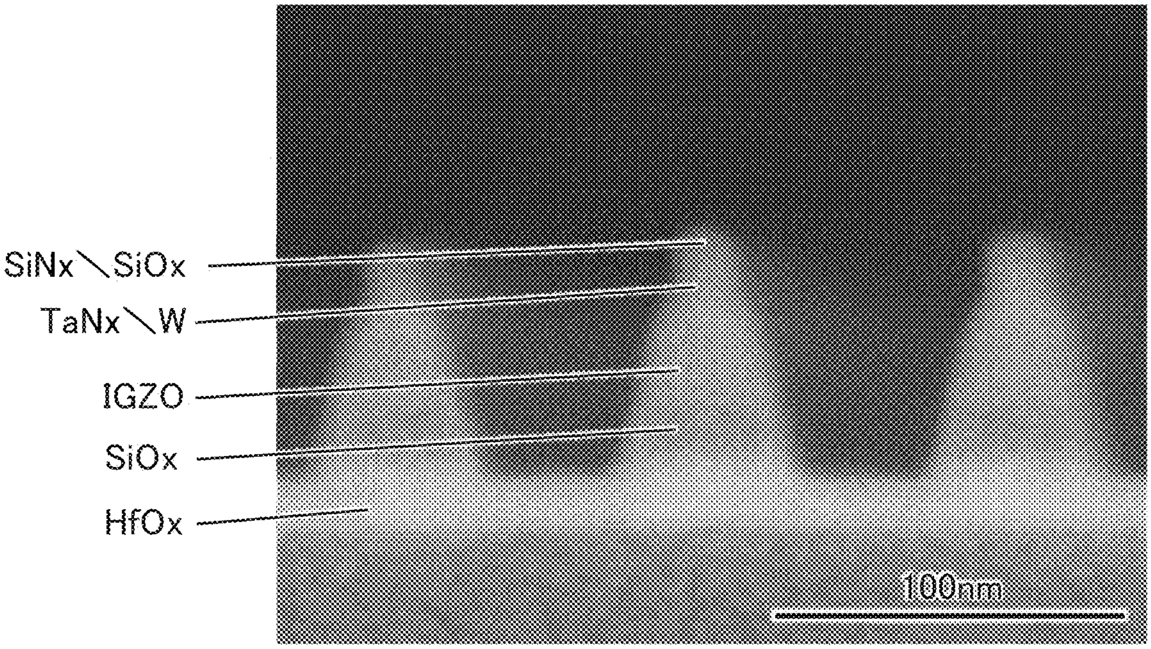

FIG. 26A and FIG. 26B are cross-sectional SEM images in Example.

Figure 27A:
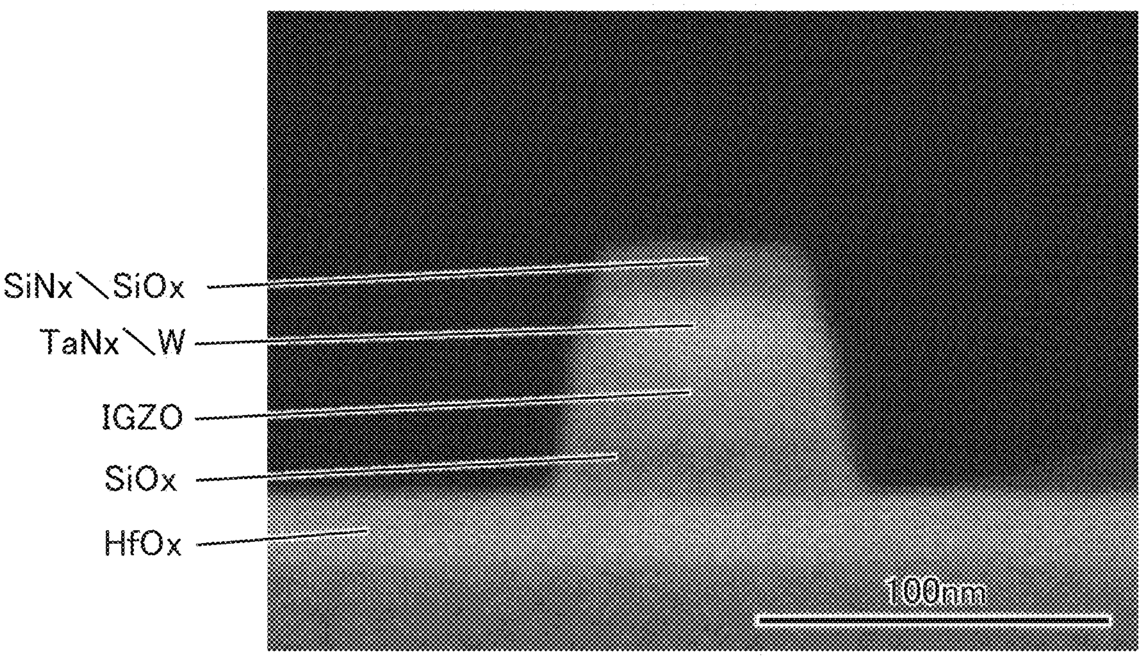
Figure 27B:
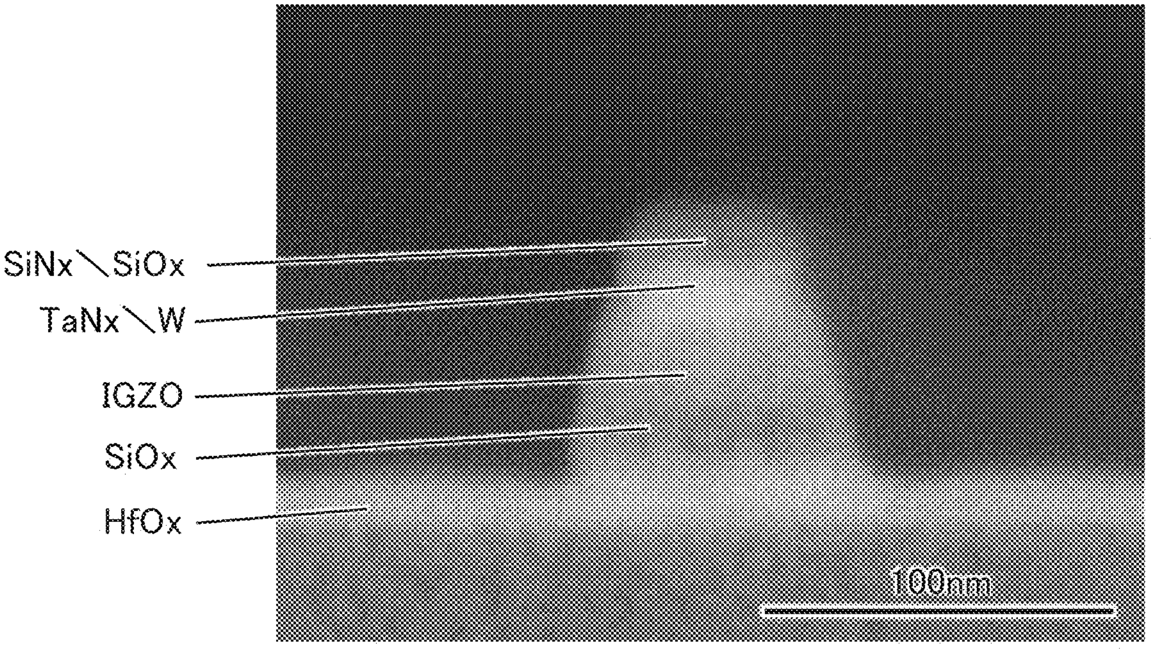

FIG. 27A and FIG. 27B are cross-sectional SEM images in Example.

Figure 28A:
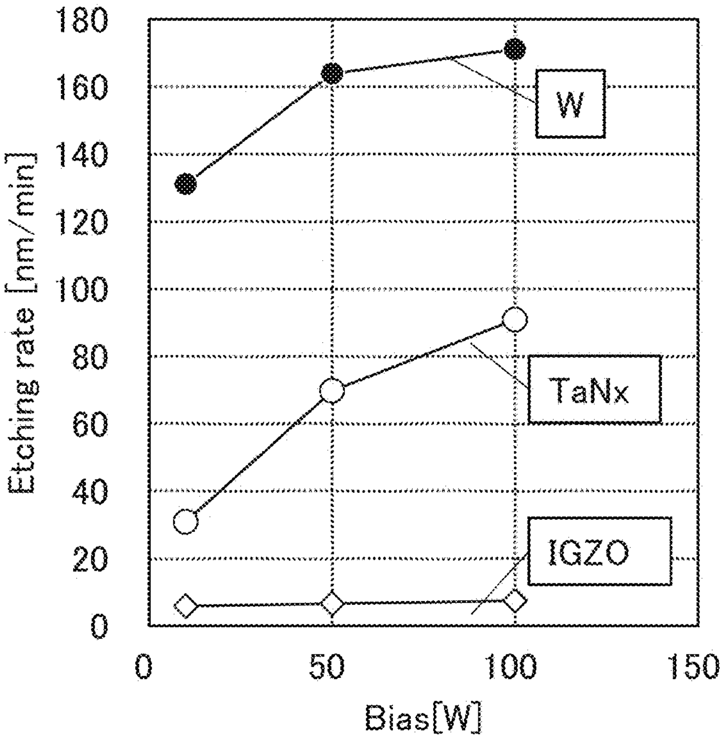
Figure 28B:
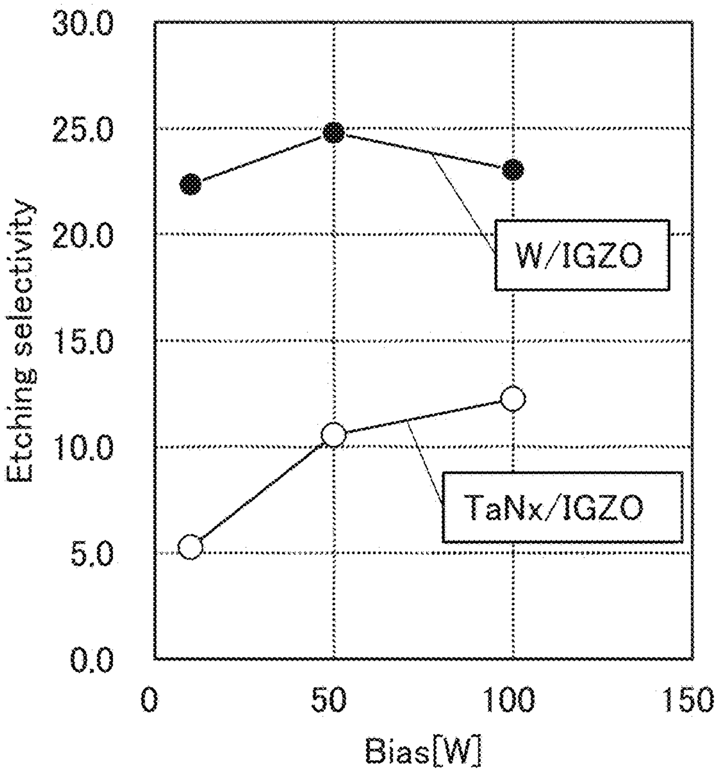

FIG. 28A and FIG. 28B are graphs in Example.

Figure 29A:
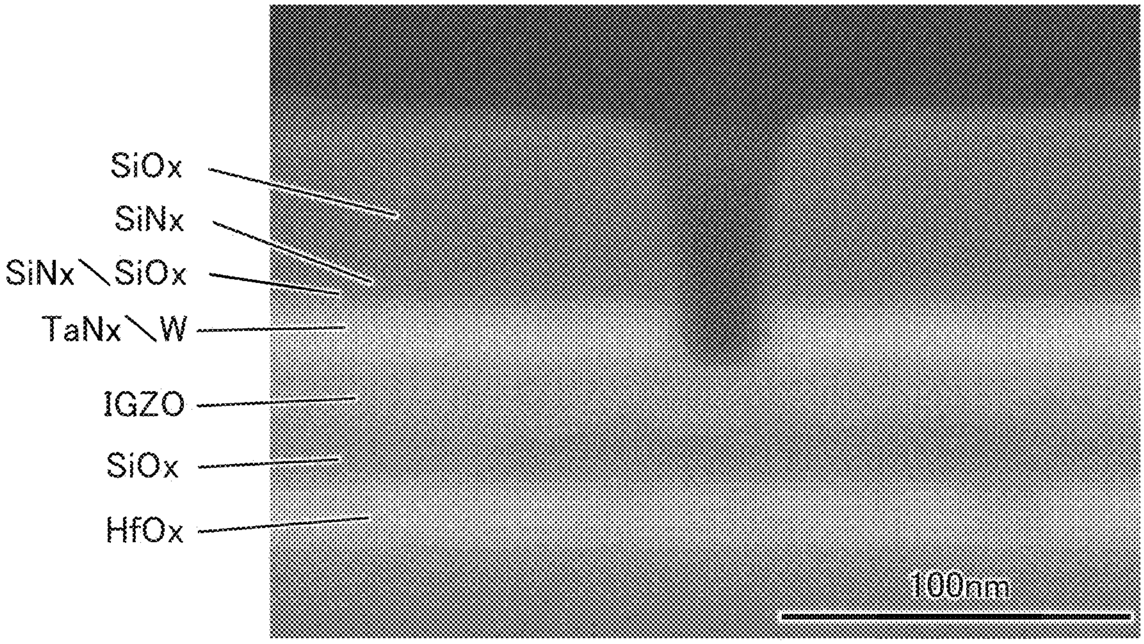
Figure 29B:
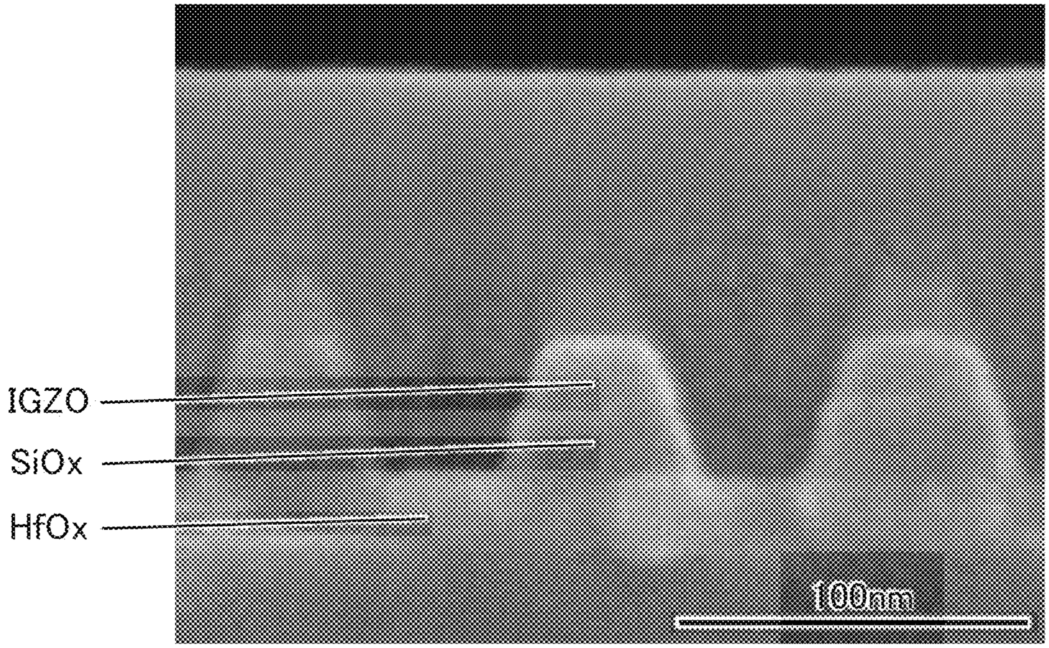

FIG. 29A and FIG. 29B are cross-sectional SEM images in Example.

Figure 30A:
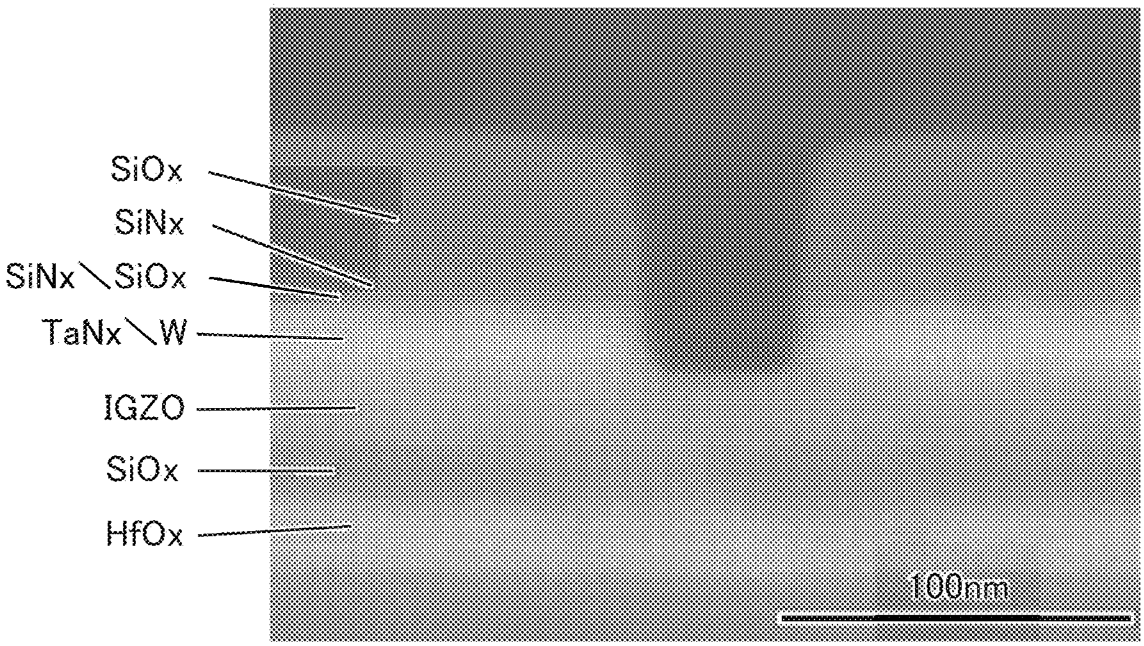
Figure 30B:
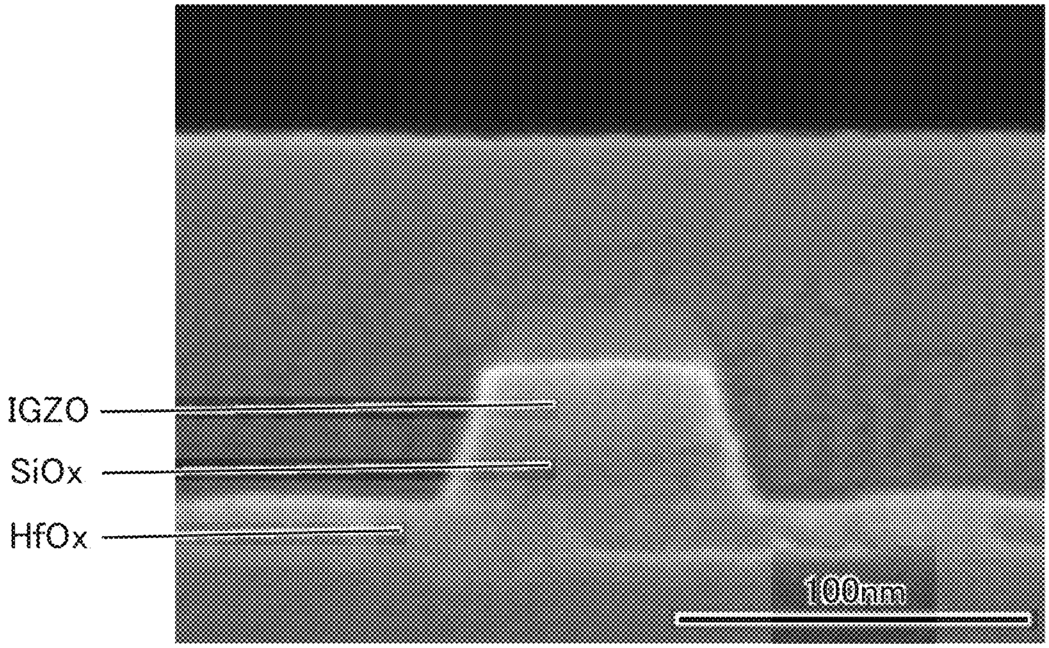

FIG. 30A and FIG. 30B are cross-sectional SEM images in Example.

MODE FOR CARRYING OUT THE INVENTION

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases.

The position, size, range, and the like of each component illustrated in drawings do not represent the actual position, size, range, and the like in some cases for easy understanding. Therefore, the disclosed invention is not necessarily limited to the position, size, range, or the like disclosed in the drawings.

Note that in this specification and the like, ordinal numbers such as "first" and "second" are used for convenience and do not limit the number of components or the order of components (e.g., the order of steps or the stacking order of layers). In some cases, an ordinal number used for a component in a certain part in this specification is not the same as an ordinal number used for the component in another part in this specification or the scope of claims.

Note that the term "film" and the term "layer" can be used interchangeably depending on the case or the circumstances. For example, the term "conductive layer" can be replaced with the term "conductive film". As another example, the term "insulating film" can be replaced with the term "insulating layer". The term "conductor" can be replaced with the term "conductive layer" or the term "conductive film" depending on the case or the circumstances. The term "insulator" can be replaced with the term "insulating layer" or the term "insulating film" depending on the case or the circumstances.

The term "opening" includes a groove and a slit, for example. A region where an opening is formed is referred to as an opening portion in some cases.

In the drawings used in embodiments, a sidewall of an insulator in an opening portion in the insulator is illustrated as being substantially perpendicular to a substrate surface or a formation surface, but the sidewall may have a tapered shape.

Note that in this specification and the like, a tapered shape refers to a shape such that at least part of a side surface of a component is inclined to a substrate surface or a formation surface. For example, a tapered shape preferably includes a region where the angle formed between the inclined side surface and the substrate surface or the formation surface (the angle is hereinafter referred to as a taper angle in some cases) is less than 90°. Note that the side surface of the component and the substrate surface are not necessarily completely flat and may be substantially flat with a slight curvature or substantially flat with slight unevenness.

Embodiment 1

In this embodiment, a method for processing a stack including an oxide semiconductor layer and a conductor layer according to one embodiment of the present invention will be described. A semiconductor device including the stack will also be described.

Example of Method for Processing Stack

An example of a method for processing a stack including an oxide semiconductor layer and a conductor layer according to one embodiment of the present invention is described with reference to FIG. 1A to FIG. 1F.

Figure 1A:
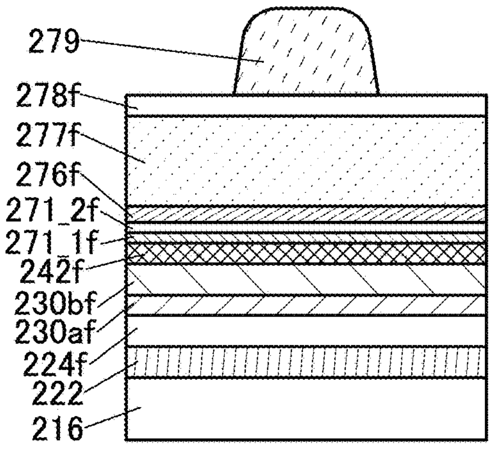
FIG. 1A to FIG. 1F are cross-sectional views illustrating an example of a method for manufacturing a stack.
Figure 1B:
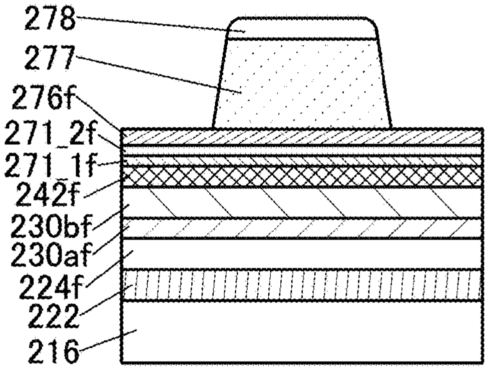
Figure 1C:
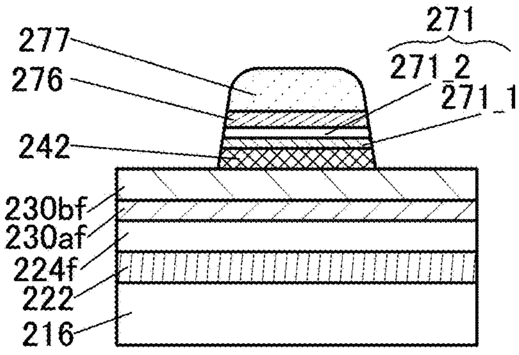
Figure 1D:
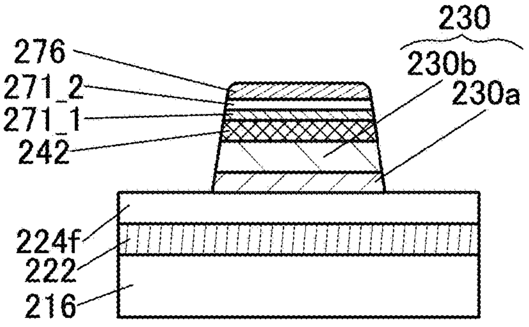
Figure 1E:
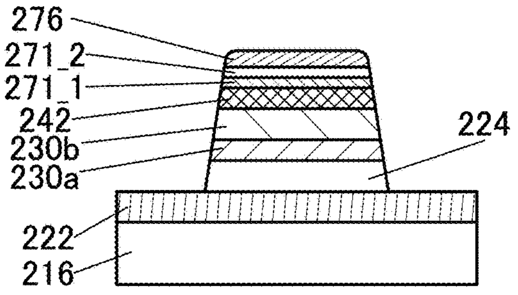
Figure 1F:
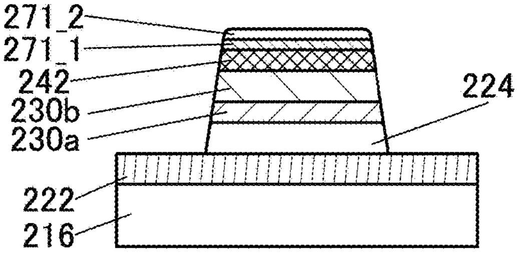

This section describes a method for forming a stack that is illustrated in FIG. 1F and includes an oxide 230 (an oxide 230*a* and an oxide 230*b*) and a conductor 242 over the oxide 230. That is, the oxide 230 is provided as the oxide semiconductor layer included in the stack, and the conductor 242 is provided as the conductor layer. The stack illustrated in FIG. 1F includes an island-shaped insulator 224, the island-shaped oxide 230 (oxide 230*a* and oxide 230*b*), the island-shaped conductor 242, and an island-shaped insulator 271 (insulator 271_1 and insulator 271_2) over an insulator 216 and an insulator 222 functioning as base insulating films.

The oxide 230 is a metal oxide functioning as an oxide semiconductor and can be used for an active layer of a transistor, for example. In this case, the conductor 242 provided in contact with the top surface of the oxide 230 can function as a source electrode or a drain electrode of the transistor.

A specific example of processing of the stack including the insulator 224, the oxide 230, the conductor 242, and the insulator 271 is described below with reference to FIG. 1A to FIG. 1F.

First, over a substrate (not illustrated), the insulator 216, the insulator 222, an insulating film 224f, an oxide film 230af, an oxide film 230bf, a conductive film 242f, an insulating film 271_1f, and an insulating film 271_2f are formed in this order (FIG. 1A). Here, the insulating film 224f is an insulating film to be the insulator 224 in a later step. The oxide film 230af is a metal oxide film to be the oxide 230a in a later step. The oxide film 230bf is a metal oxide film to be the oxide 230b in a later step. The conductive film 242f is a conductive film to be the conductor 242 in a later step. The insulating film 271_1f is an insulating film to be the insulator 271_1 in a later step. The insulating film 271_2f is an insulating film to be the insulator 271_2 in a later step.

Here, the insulating film 271_1f and the insulating film 271_2f function as etching stop films in a later step to protect the conductor 242. The insulating film 271_1f is in contact with the conductive film 242f, and thus is preferably an inorganic insulating film that does not easily oxidize the conductive film 242f. For the insulating film 271_1f, a nitride insulator is preferably used, and for example, silicon nitride is preferably used. For the insulating film 271_2f, an oxide insulator is preferably used, and for example, silicon oxide is preferably used. Note that the insulating film 271_1f and the insulating film 271_2f may be successively formed without exposure to the air.

For example, the insulator 216 and the insulating film 224f are formed using silicon oxide. For example, the insulator 222 is formed using hafnium oxide. For example, the oxide film 230af and the oxide film 230bf are formed using an oxide containing In, Ga, and Zn. For example, the conductive film 242f is formed using tantalum nitride. As another example, the conductive film 242f may have a stacked-layer structure and may have a stacked-layer structure of a layer including tantalum nitride and a layer including tungsten over the layer including tantalum nitride.

Note that the detailed structures of the insulator 216, the insulator 222, the insulating film 224f (insulator 224), the oxide film 230af (oxide 230a), the oxide film 230bf (oxide 230b), the conductive film 242f (conductor 242), the insulating film 271_1f (insulator 271_1), and the insulating film 271_2f (insulator 271_2) will be described in <Structure example of semiconductor device>.

Next, an inorganic film 276f is formed over the insulating film 271_2f (FIG. 1A). The inorganic film 276f can be formed by a sputtering method, a CVD method, an MBE method, a PLD method, an ALD method, or the like. The inorganic film 276f is a film functioning as a hard mask for forming the oxide 230a, the oxide 230b, and the insulator 224 in a later step. A metal material, an inorganic insulating material, or the like is used for the inorganic film 276f. For example, a tungsten film formed by a sputtering method is used as the inorganic film 276f. The inorganic film 276f may be successively formed without exposure to the air after the formation of the insulating film 271_1f and the insulating film 271_2f.

Subsequently, a coating film 277f is formed over the inorganic film 276f, and then a coating film 278f is formed (FIG. 1A). The coating film 277f and the coating film 278f may have a function of improving adhesion between a later-described resist mask and an inorganic film 276. The coating film 277f and the coating film 278f are formed by a spin coating method or the like, for example. For the coating film 277f and the coating film 278f, a non-photosensitive organic resin is used.

Here, the coating film 278f functions as a mask in etching treatment for processing the coating film 277f. Therefore, the etching rate of the coating film 278f is preferably lower than the etching rate of the coating film 277f under the etching conditions of the coating film 277f. For example, the coating film 277f is a film including carbon, and the coating film 278f is a film including silicon and carbon. In this embodiment, an SOC (Spin On Carbon) film is formed as the coating film 277f, and an SOG (Spin On Glass) film is formed as the coating film 278f.

Note that the coating film 277f and the coating film 278f each contain an organic solvent such as alcohol at the time of application, but such an organic substance contained may be reduced or removed in later steps or at the completion of a semiconductor device. Note that the coating films are provided as necessary; the coating film may be a single layer, or may not be provided in the case where the later-described resist mask alone functions sufficiently.

Next, a resist mask 279 is formed over the coating film 278f by a lithography method (FIG. 1A). A photosensitive organic resin, which is also called a photoresist, is used for the resist mask 279. For example, a positive photoresist or a negative photoresist can be used. The photoresist to be the resist mask 279 can be deposited by a spin coating method or the like, for example, to have a uniform thickness.

Note that in a lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask can be formed through, for example, exposure of the resist to KrF excimer laser light, ArF excimer laser light, EUV (Extreme Ultraviolet) light, or the like. A liquid immersion technique may be employed in which a gap between a substrate and a projection lens is filled with a liquid (e.g., water) in light exposure. An electron beam or an ion beam may be used instead of the light. Note that the use of a mask may be unnecessary in the case of using an electron beam or an ion beam.

In steps of FIG. 1B to FIG. 1F described below, etching treatment for the stacked films illustrated in FIG. 1A is performed by a dry etching method. A dry etching method enables anisotropic etching, and thus is suitable for forming a stack that has a minute structure, has a high aspect ratio, and includes the insulator 224, the oxide 230, the conductor 242, and the insulator 271.

Here, as an etching gas for the dry etching treatment, an etching gas containing a halogen can be used, and specifically, an etching gas containing one or more of fluorine, chlorine, and bromine can be used. As the etching gas, for example, a $C_4F_6$ gas, a $C_5F_6$ gas, a $C_4F_8$ gas, a $CF_4$ gas, a $SF_6$ gas, a $CHF_3$ gas, a $CH_2F_2$ gas, a $Cl_2$ gas, a $BCl_3$ gas, a $SiCl_4$ gas, a $BBr_3$ gas, or the like can be used alone or two or more of the gases can be mixed and used. Furthermore, an oxygen gas, a carbonic acid gas, a nitrogen gas, a helium gas, an argon gas, a hydrogen gas, a hydrocarbon gas, or the like can be added to the above etching gas as appropriate. Depending on an object to be subjected to the dry etching treatment, a gas that contains a hydrocarbon gas or a hydrogen gas and does not contain a halogen gas can be used as the etching gas. As the hydrocarbon used for the etching gas, one or more of methane ($CH_4$), ethane ($C_2H_6$), propane ($C_3H_8$), butane ($C_4H_{10}$), ethylene ($C_2H_4$), propylene ($C_3H_6$), acetylene ($C_2H_2$), and propyne ($C_3H_4$) can be used. The etching conditions can be set as appropriate depending on an object to be etched.

As a dry etching apparatus, a capacitively coupled plasma (CCP) etching apparatus including parallel plate electrodes can be used. The capacitively coupled plasma etching apparatus including parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example. The etching apparatus can be set as appropriate depending on an object to be etched.

Note that the steps of FIG. 1B to FIG. 1F are preferably performed successively without exposure to the air. For example, the processing is performed without exposure to the air by using a multi-chamber etching apparatus. Here, a CCP etching apparatus in which high-frequency voltages with different frequencies are applied to the parallel plate electrodes in the chamber is preferably used in the steps of FIG. 1B to FIG. 1F. In this case, a high-frequency voltage with a high frequency can be applied to the upper electrode, and a high-frequency voltage with a low frequency can be applied to the lower electrode on which the substrate is placed.

First, the coating film 278*f* is processed using the resist mask 279, whereby an island-shaped coating film 278 is formed. For example, in the case where an SOG film is used as the coating film 278*f*, $CHF_3$ and $O_2$ can be used as an etching gas.

Next, the coating film 277*f* is processed using the coating film 278 as a mask, whereby an island-shaped coating film 277 is formed (FIG. 1B). For example, in the case where an SOC film is used as the coating film 277*f*, $H_2$ and $N_2$ can be used as an etching gas. Here, since the SOG film is used as the coating film 278, the coating film 278 can be prevented from disappearing in the etching step of the coating film 277*f*.

The resist mask 279 is preferably removed simultaneously during the processing of the coating film 277*f*. Since the SOC film is used as the coating film 277*f*, the resist mask 279 can be easily removed. In the case where the resist mask 279 remains after the formation of the coating film 277, the resist mask 279 is preferably removed.

Then, the inorganic film 276*f*, the insulating film 271_2*f*, the insulating film 271_1*f*, and the conductive film 242*f* are processed in this order by using the coating film 277 as a mask, thereby forming the island-shaped inorganic film 276, the island-shaped insulator 271_1, the island-shaped insulator 271_2, and the island-shaped conductor 242 (FIG. 1C). For example, in the case where a tungsten film is used as the inorganic film 276*f*, $CF_4$ and $Cl_2$ can be used as an etching gas. For example, in the case where silicon nitride is used for the insulating film 271_1*f* and silicon oxide is used for the insulating film 271_2*f*, $CHF_3$ and $O_2$ can be used as an etching gas in the etching of the insulating film 271_1*f* and the insulating film 271_2*f*. For example, in the case where a tantalum nitride film is used as the conductive film 242*f*, $CHF_3$, $Cl_2$, and Ar can be used as an etching gas. In the case where a stack of a tantalum nitride layer and a tungsten layer is used as the conductive film 242*f*, $HF_3$, $Cl_2$, and Ar can be used as an etching gas as well.

Here, the same metal material (e.g., tungsten) is used for the inorganic film 276 and the conductive film 242*f* in some cases. If the coating film 277 functioning as a mask disappears during the etching of the conductive film 242*f*, the inorganic film 276 is exposed to the etching. As a result, the conductive film 242*f* and the like might be excessively etched, and the width of the conductor 242 might be narrower than the designed width.

In view of the above, in the etching step of the conductive film 242*f*, etching is preferably performed under conditions where the etching rate of the conductive film 242*f* is higher than the etching rate of the coating film 277. For example, the electric power of the lower electrode on which the substrate is placed is preferably set low in the etching step of the conductive film 242*f*. For example, the electric power of the lower electrode on which the substrate is placed is set lower than the electric power of the lower electrode at the time of etching the inorganic film 276*f*, and is preferably lower than 25 W, further preferably lower than or equal to 10 W. By performing etching under such conditions, processing can be performed as designed even in the stack having a minute structure.

Note the coating film 278 is preferably removed simultaneously during the processing of the insulating film 271_1*f* and the insulating film 271_2*f*. Since silicon-based insulating films are used as the insulating film 271_1*f* and the insulating film 271_2*f*, the coating film 278 can be easily removed.

Next, the oxide film 230*bf* and the oxide film 230*af* are processed using the inorganic film 276 as a mask, thereby forming the island-shaped oxide 230*b* and the island-shaped oxide 230*a* (FIG. 1D). For example, in the case where an oxide containing any one or more selected from In, Ga, and Zn is used for the oxide film 230*bf* and the oxide film 230*af*, $CH_4$ and Ar can be used as an etching gas. An oxide containing In, Ga, and Zn is likely to react with a $CH_3$ radical to form a metal complex with high volatility. Thus, even at a relatively low substrate temperature, the use of a gas containing $CH_4$ facilitates processing of an oxide containing In, Ga, and Zn, which is a hard-to-etch material.

Furthermore, in the case where the inorganic film 276 includes tungsten and the insulating film 224*f* includes silicon oxide, the oxide film 230*bf* and the oxide film 230*af* are preferably subjected to etching using a methane ($CH_4$) gas. By performing the etching in this manner, the etching rates of the oxide film 230*bf* and the oxide film 230*af* can be significantly higher than those of the inorganic film 276 and the insulating film 224*f*. Thus, in this step, the oxide film 230*bf* and the oxide film 230*af* can be formed into island shapes while the insulating film 224*f* is kept flat. Accordingly, in a later-described step for forming the insulating film 224*f* into an island shape, a region of the insulating film 224*f* that does not overlap with the oxide 230*a* can be removed completely and overetching of the insulator 222 can be prevented.

Note that the coating film 277 is preferably removed simultaneously during the processing of the oxide film 230*bf* and the oxide film 230*af*. Note that in the case where the coating film 277 remains after the step illustrated in FIG. 1D, the coating film 277 is removed by performing dry etching treatment such as ashing, wet etching treatment, wet etching treatment after dry etching treatment, or dry etching treatment after wet etching treatment.

After the formation of the conductor 242, the coating film 277 may be removed before the oxide film 230*bf* and the oxide film 230*af* are processed.

Next, the insulating film 224*f* is processed using the inorganic film 276, whereby the island-shaped insulator 224 is formed (FIG. 1E). For example, in the case where a silicon oxide film is used as the insulating film 224*f*, $CHF_3$ and Ar can be used as an etching gas.

Here, it is preferable that the insulator 222 not be over-etched during processing of the insulating film 224*f*. Thus, the etching is preferably performed under the condition where the etching selectivity ratio of the insulating film 224*f* with respect to the insulator 222 is high. For example, the insulator 222 preferably includes hafnium oxide in the case where the insulating film 224*f* includes silicon oxide and the etching is performed using a gas containing fluorine.

Finally, the inorganic film 276 is removed (FIG. 1F). Here, the insulator 271_1 and the insulator 271_2 function as etching stop films and protect the conductor 242. Here, since a silicon-based oxide insulating film is used as the insulator 271_2, the insulator 271_1 and the insulator 271_2 can be prevented from disappearing in the etching step of the inorganic film 276.

For example, in the case where a tungsten film is used as the inorganic film 276, $CF_4$, $Cl_2$, and $O_2$ can be used as an etching gas. Note that the inorganic film 276 is not necessarily removed when the material of the inorganic film 276 does not affect later steps or can be utilized in later steps.

Since the insulator 271_1 and the insulator 271_2 function as masks for protecting the conductor 242 in the step of removing the inorganic film 276, the conductor 242 does not have a curved surface between its side surface and top surface. Thus, an end portion at the intersection of the side surface and the top surface of the conductor 242 is angular. The cross-sectional area of the conductor 242 having an angular end portion at the intersection of the side surface and the top surface is larger than that in the case where the end portion is rounded. Furthermore, when a nitride insulator that is less likely to oxidize a metal is used for the insulator 271_1, excessive oxidation of the conductor 242 can be prevented. Accordingly, the use of the above-described stack in the transistor reduces the resistance of the conductor 242 to be the source electrode and the drain electrode, whereby the on-state current of the transistor can be increased.

In the above manner, it is possible to form an island-shaped stack in which the side surface of the conductor 242 does not excessively recede with respect to the side surface of the oxide 230, that is, a side end portion of the conductor 242 and a side end portion of the oxide 230 are substantially aligned with each other as illustrated in FIG. 1F. Manufacturing a transistor using such a stack having a minute structure can achieve miniaturization and high integration of a semiconductor device.

The insulator 224, the oxide 230*a*, the oxide 230*b*, the conductor 242, the insulator 271_1, and the insulator 271_2 can be collectively processed into an island shape. Thus, the number of steps can be smaller than that in the case where the insulator 224, the oxide 230*a*, the oxide 230*b*, the conductor 242, the insulator 271_1, and the insulator 271_2 are individually processed into island shapes. Accordingly, the productivity of the semiconductor device can be increased.

<Structure Example of Semiconductor Device>

Figure 2A:
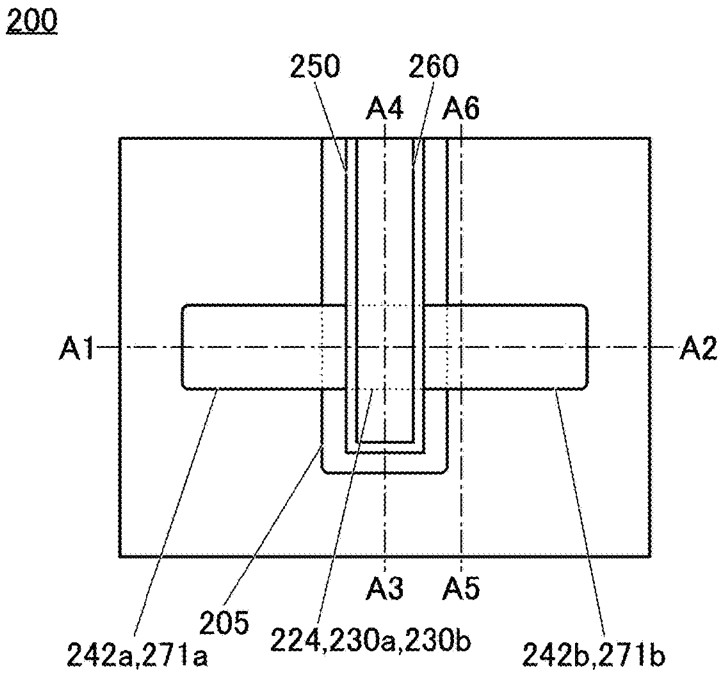
FIG. 2A is a plan view illustrating an example of a semiconductor device.
Figure 2C:
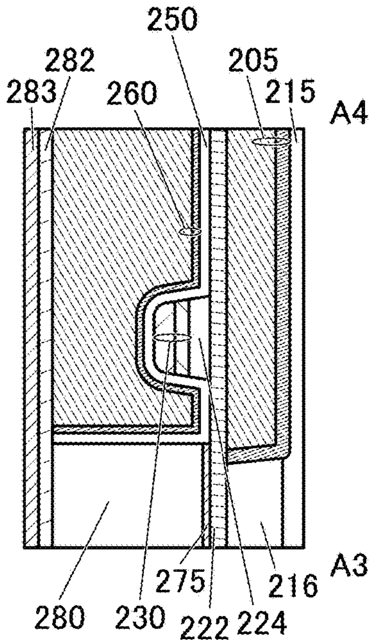
FIG. 2B to FIG. 2D are cross-sectional views illustrating an example of a semiconductor device.
Figure 2B:
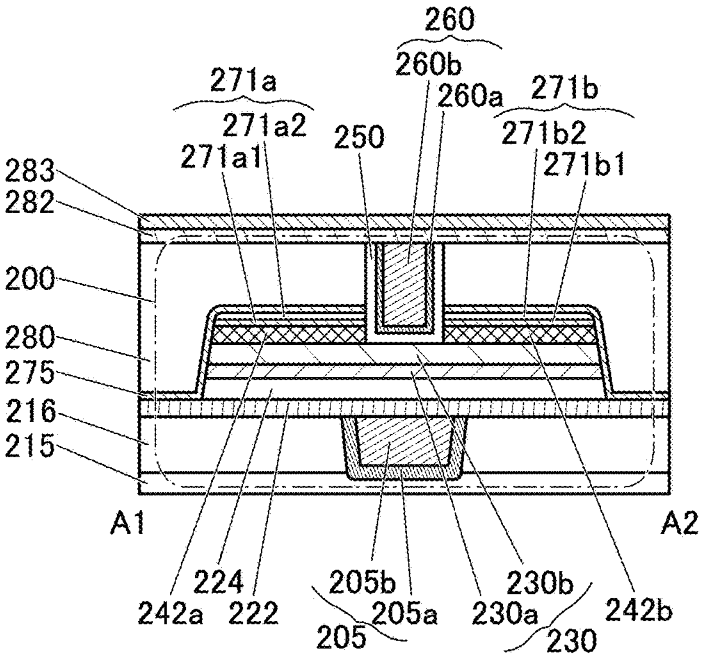
Figure 2D:
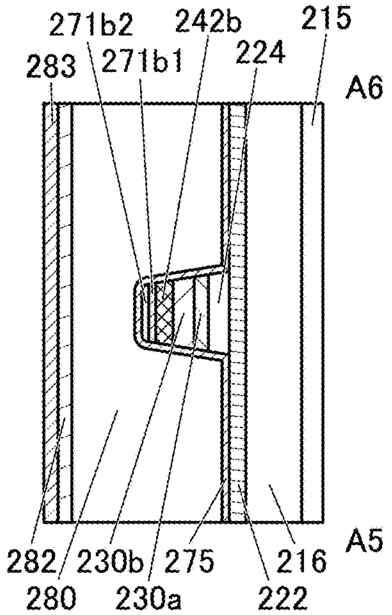
Figure 3A:
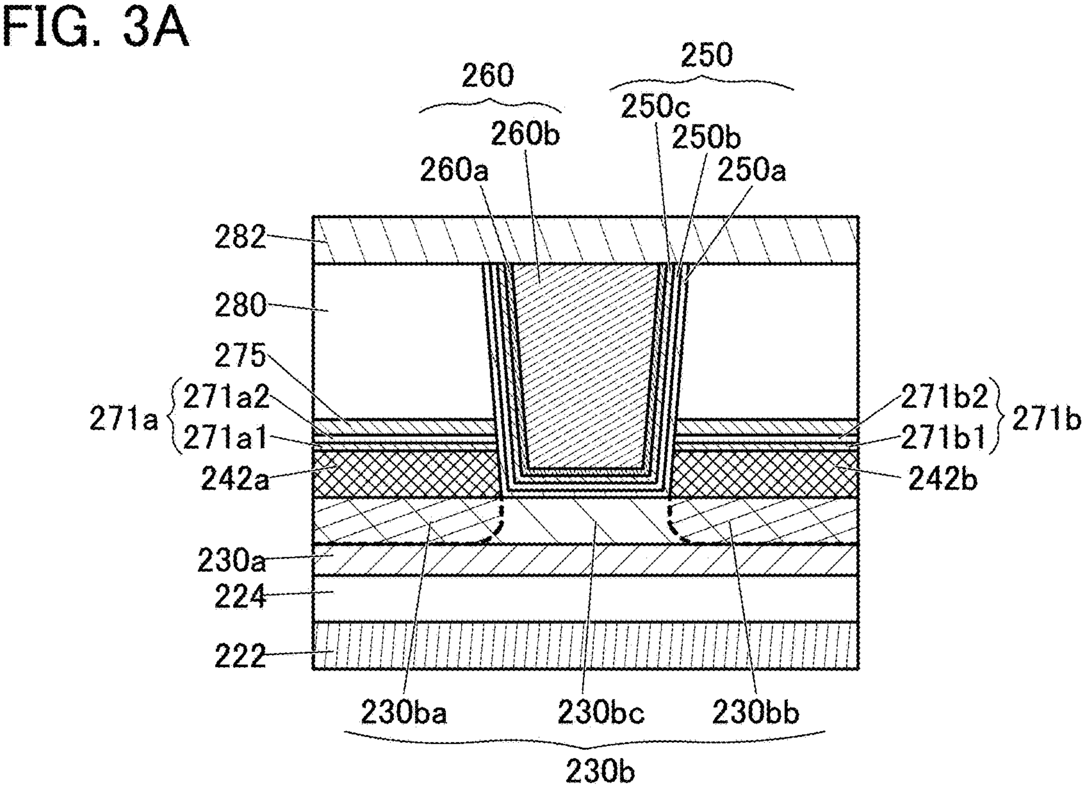
FIG. 3A and FIG. 3B are cross-sectional views illustrating examples of a semiconductor device.
Figure 3B:
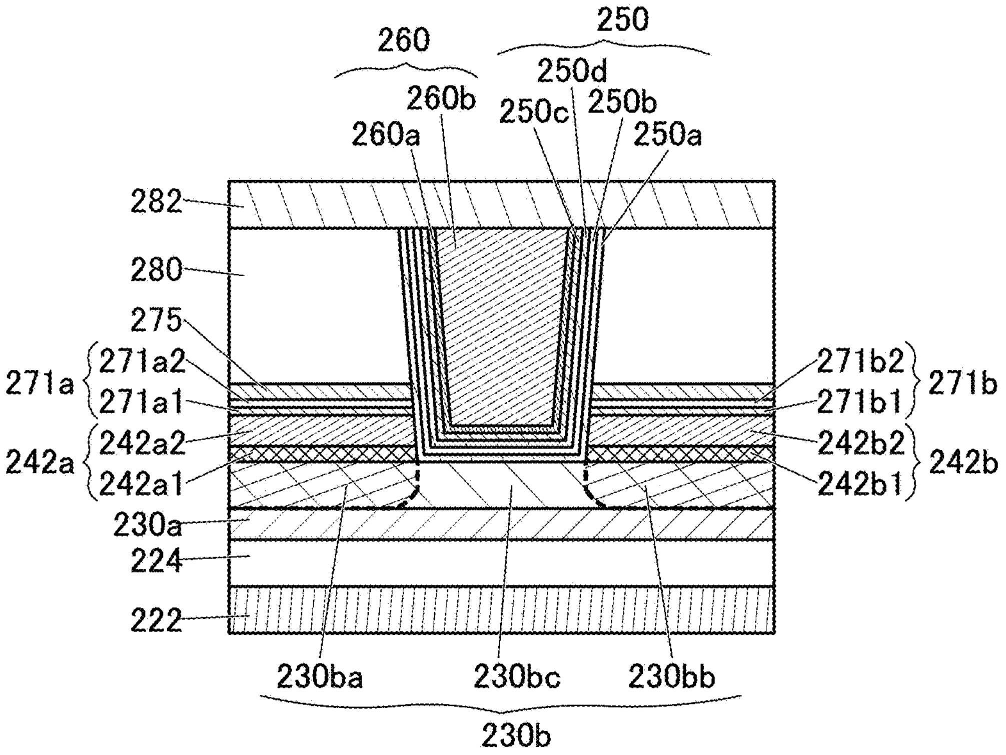
Figure 4A:
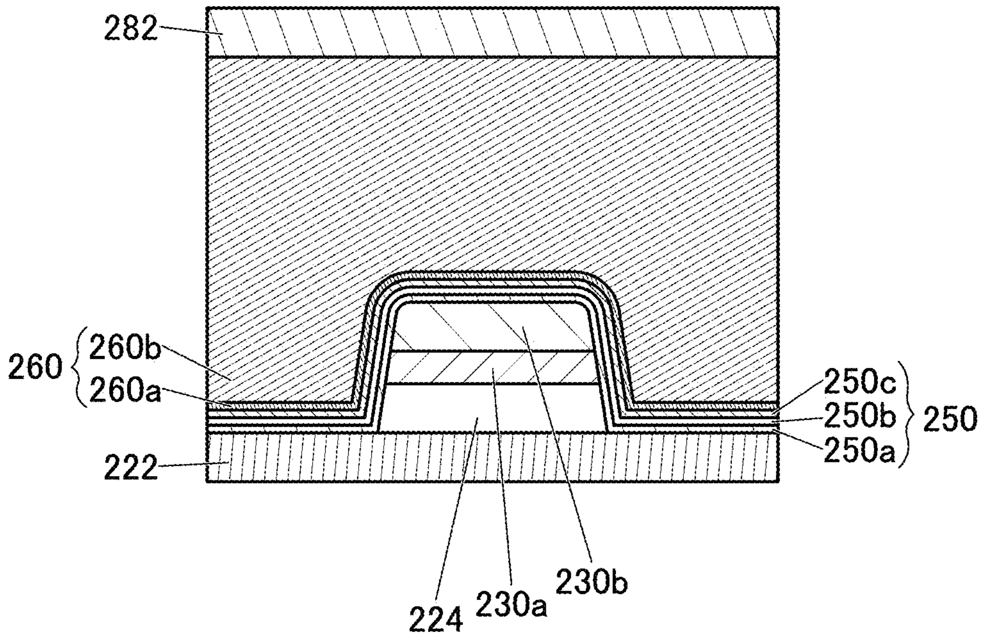
FIG. 4A and FIG. 4B are cross-sectional views illustrating examples of a semiconductor device.
Figure 4B:
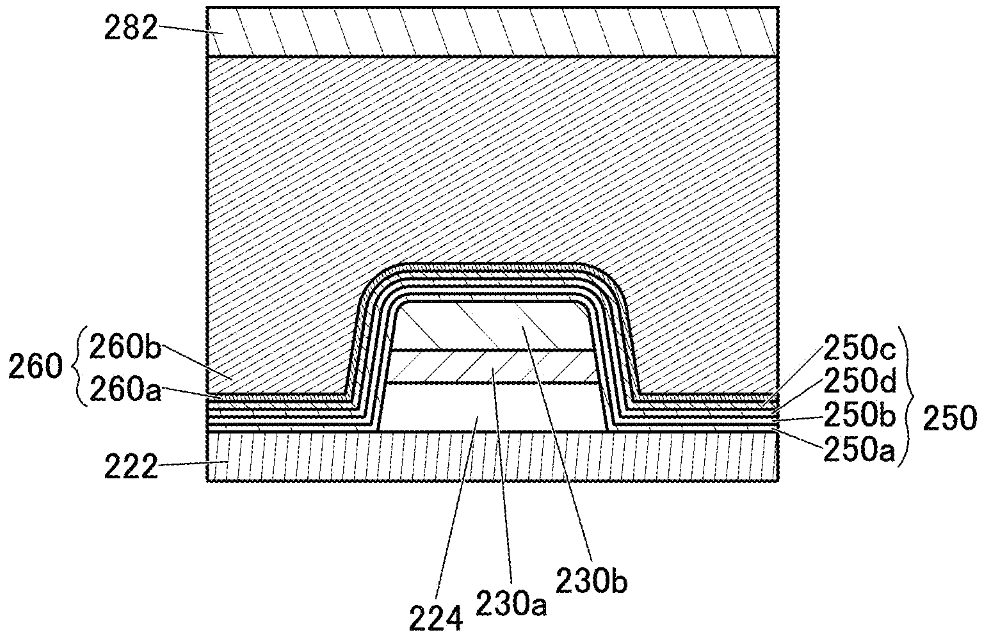
Figure 5A:
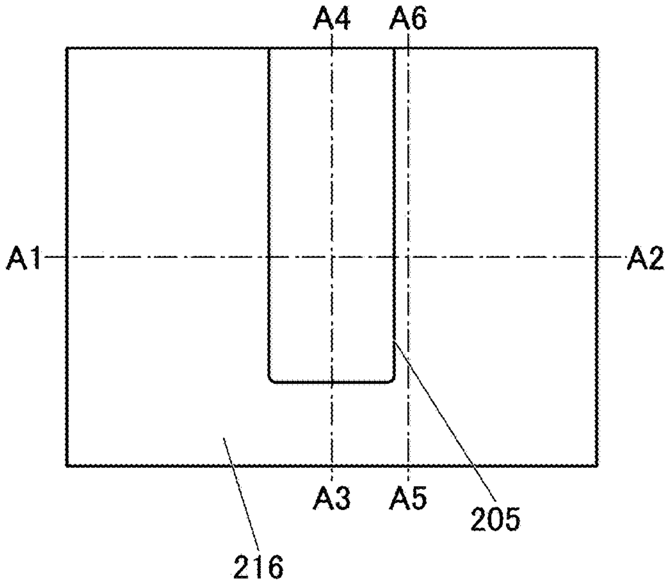
FIG. 5A is a plan view illustrating an example of a method for manufacturing a semiconductor device.
Figure 5C:
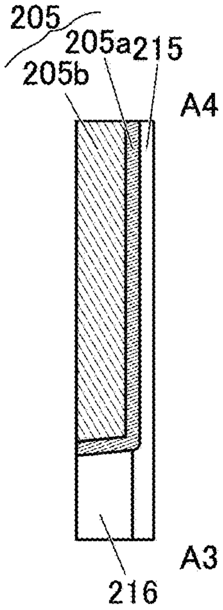
FIG. 5B to FIG. 5D are cross-sectional views illustrating an example of a method for manufacturing a semiconductor device.
Figure 5B:
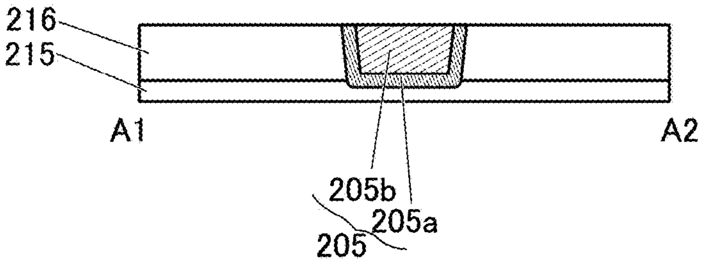
Figure 5D:
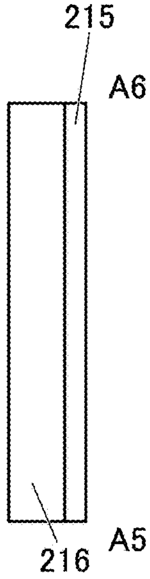
Figure 6A:
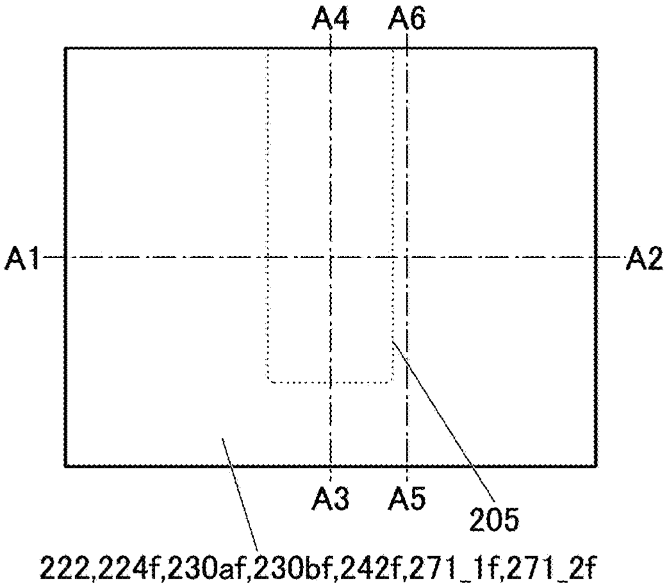
FIG. 6A is a plan view illustrating an example of a method for manufacturing a semiconductor device.
Figure 6C:
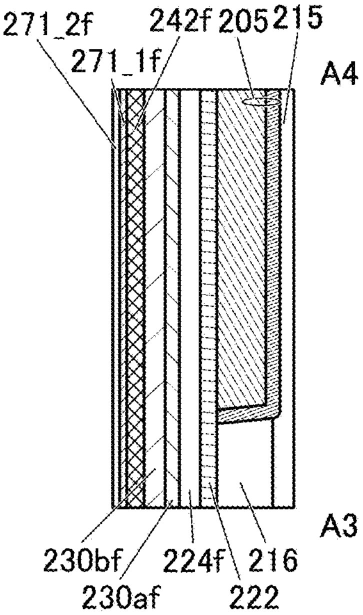
FIG. 6B to FIG. 6D are cross-sectional views illustrating an example of a method for manufacturing a semiconductor device.
Figure 6B:
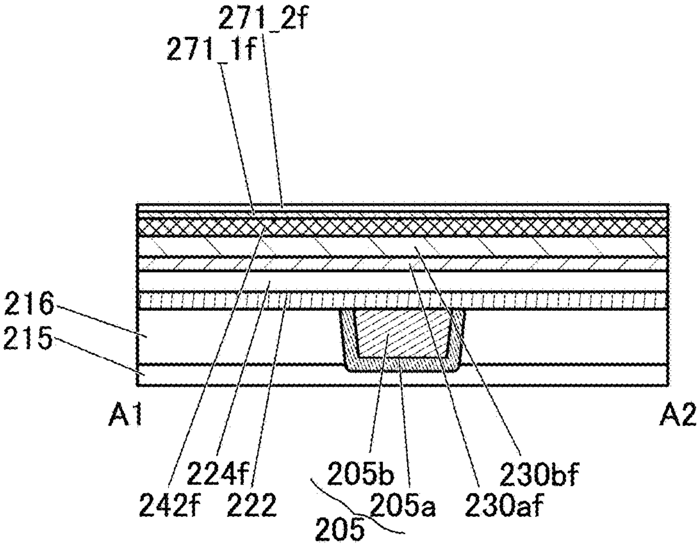
Figure 6D:
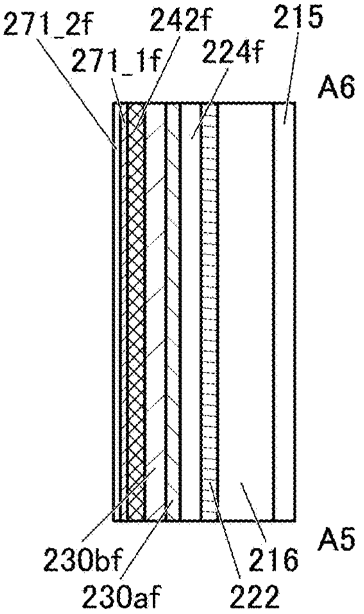

A structure example of a semiconductor device including the above-described stack will be described with reference to FIG. 2 to FIG. 4. FIG. 2A to FIG. 2D are a plan view and cross-sectional views of a semiconductor device (a transistor 200). FIG. 2A is a plan view of the semiconductor device. FIG. 2B to FIG. 2D are cross-sectional views of the semiconductor device. Here, FIG. 2B is a cross-sectional view of a portion indicated by the dashed-dotted line A1-A2 in FIG. 2A, and is also a cross-sectional view of the transistor 200 in the channel length direction. FIG. 2C is a cross-sectional view of a portion indicated by the dashed-dotted line A3-A4 in FIG. 2A, and is also a cross-sectional view of the transistor 200 in the channel width direction. FIG. 2D is a cross-sectional view of a portion indicated by the dashed-dotted line A5-A6 in FIG. 2A, and is also a cross-sectional view of the transistor 200 in the channel width direction. Note that for clarity of the drawing, some components are omitted in the plan view of FIG. 2A. FIG. 3A and FIG. 3B are enlarged cross-sectional views of the transistor 200 in the channel length direction, and FIG. 4A and FIG. 4B are enlarged cross-sectional views of the transistor 200 in the channel width direction.

The transistor 200 includes the insulator 216 over an insulator 215, a conductor 205 (a conductor 205*a* and a conductor 205*b*) provided to be embedded in the insulator 216, the insulator 222 over the insulator 216 and the conductor 205, the insulator 224 over the insulator 222, the oxide 230 (the oxide 230*a* and the oxide 230*b*) over the insulator 224, a conductor 242*a* and a conductor 242*b* over the oxide 230, an insulator 271*a* (an insulator 271*a*1 and an insulator 271*a*2) over the conductor 242*a*, an insulator 271*b* (an insulator 271*b*1 and an insulator 271*b*2) over the conductor 242*b*, an insulator 250 over the oxide 230, and a conductor 260 (a conductor 260*a* and a conductor 260*b*) over the insulator 250.

An insulator 275 is provided over the insulators 271*a* and 271*b*, and an insulator 280 is provided over the insulator 275. The insulator 250 and the conductor 260 fill an opening provided in the insulator 280 and the insulator 275. An insulator 282 is provided over the insulator 280 and the conductor 260. An insulator 283 is provided over the insulator 282.

The oxide 230 includes a region functioning as a channel formation region of the transistor 200. The conductor 260 includes a region functioning as a first gate electrode (an upper gate electrode) of the transistor 200. The insulator 250 includes a region functioning as a first gate insulator of the transistor 200. The conductor 205 includes a region functioning as a second gate electrode (a lower gate electrode) of the transistor 200. The insulator 224 and the insulator 222 each include a region functioning as a second gate insulator of the transistor 200.

The conductor 242*a* includes a region functioning as one of a source electrode and a drain electrode of the transistor 200. The conductor 242*b* includes a region functioning as the other of the source electrode and the drain electrode of the transistor 200.

As illustrated in FIG. 2B to FIG. 2D, it is preferable that one of side end portions of the conductor 242*a* be substantially aligned with one of side end portions of the oxide 230 and one of side end portions of the conductor 242*b* be substantially aligned with the other side end portion of the oxide 230 in the cross-sectional view of the transistor 200. Furthermore, it is preferable that side end portions of the insulator 224 be substantially aligned with the side end portions of the oxide 230. As described above, in one embodiment of the present invention, the insulator 224, the oxide 230, and the conductor 242 to be the conductor 242*a* and the conductor 242*b* can be collectively processed into an island shape. Accordingly, the semiconductor device of one embodiment of the present invention can be manufactured with favorable productivity. In the case of performing processing in the above manner, the side end portions of the insulator 224, the oxide 230, the conductor 242*a*, and the conductor 242*b* are substantially aligned with each other as described above.

The insulator 271*a* and the insulator 271*b* function as etching stoppers for protecting the conductor 242*a* and the conductor 242*b* in the processing into an island shape. Accordingly, as illustrated in FIG. 2B and FIG. 2D, it is preferable that a side end portion of the insulator 271*a* be substantially aligned with the side end portion of the conductor 242*a* and a side end portion of the insulator 271*b* be substantially aligned with the side end portion of the conductor 242*b* in the cross-sectional view of the transistor 200.

In the case where side end portions are aligned or substantially aligned with each other in a cross-sectional view and the case where top surface shapes are the same or substantially the same, it can be said that outlines of stacked layers at least partly overlap with each other in a top view. For example, the case where a lower part of a side end portion of an upper layer is in contact with an upper part of a side end portion of a lower layer is included. For example, the case where an upper layer and a lower layer are processed using the same mask pattern or mask patterns that are partly the same is included. Note that in some cases, the outlines do not completely overlap with each other and the upper layer is positioned inward from the lower layer or the upper layer is positioned outward from the lower layer; such cases are also represented by the expression "side end portions are substantially aligned with each other" or the expression "top surface shapes are substantially the same".

The oxide 230 preferably includes the oxide 230*a* over the insulator 224 and the oxide 230*b* over the oxide 230*a*. Including the oxide 230*a* under the oxide 230*b* makes it possible to inhibit diffusion of impurities into the oxide 230*b* from components formed below the oxide 230*a*.

Although an example in which the oxide 230 has a two-layer structure of the oxide 230*a* and the oxide 230*b* is described in this embodiment, one embodiment of the present invention is not limited thereto. The oxide 230 may have a single-layer structure of the oxide 230*b* or a stacked-layer structure of three or more layers, for example.

As illustrated in FIG. 3A, the oxide 230*b* includes a region 230*bc*, and a region 230*ba* and a region 230*bb* provided to sandwich the region 230*bc* in the transistor 200. Here, the region 230*bc* functions as a channel formation region. The region 230*ba* functions as one of a source region and a drain region, and the region 230*bb* functions as the other of the source region and the drain region. At least part of the region 230*bc* overlaps with the conductor 260. The region 230*ba* overlaps with the conductor 242*a*, and the region 230*bb* overlaps with the conductor 242*b*.

The region 230*bc* has a smaller amount of oxygen vacancies or a lower impurity concentration than the region 230*ba* and the region 230*bb*, and thus is a high-resistance region with a low carrier concentration. Hence, the region 230*bc* can be regarded as being i-type (intrinsic) or substantially i-type.

The region 230*ba* and the region 230*bb* have a large amount of oxygen vacancies or a high concentration of impurities such as hydrogen, nitrogen, and a metal element, and thus are low-resistance regions with a high carrier concentration. In other words, the region 230*ba* and the region 230*bb* are each an n-type region (a low-resistance region) having a higher carrier concentration than the region 230*bc*.

Note that the carrier concentration of the region 230*bc* is preferably lower than or equal to $1\times10^{18}$ $cm^{-3}$, lower than $1\times10^{17}$ $cm^{-3}$, lower than $1\times10^{16}$ $cm^{-3}$, lower than $1\times10^{15}$ $cm^{-3}$, lower than $1\times10^{14}$ $cm^{-3}$, lower than $1\times10^{13}$ $cm^{-3}$, lower than $1\times10^{12}$ $cm^{-3}$, lower than $1\times10^{11}$ $cm^{-3}$, or lower than $1\times10^{10}$ $cm^{-3}$. The lower limit of the carrier concentration of the region 230*bc* is not particularly limited and can be, for example, $1\times10^{-9}$ $cm^{-3}$.

In order to reduce the carrier concentration in the oxide 230*b*, the impurity concentration in the oxide 230*b* is reduced so that the density of defect states is reduced. In this specification and the like, a state with a low impurity concentration and a low density of defect states is referred to as a highly purified intrinsic or substantially highly purified intrinsic state. Note that an oxide semiconductor (or a metal oxide) having a low carrier concentration is sometimes referred to as a highly purified intrinsic or substantially highly purified intrinsic oxide semiconductor (or metal oxide).

In order to obtain stable electrical characteristics of the transistor 200, reducing the impurity concentration in the metal oxide 230*b* is effective. In order to reduce the impurity concentration in the oxide 230*b*, it is preferable that the impurity concentration in an adjacent film be also reduced. Examples of impurities include hydrogen, nitrogen, an alkali metal, an alkaline earth metal, iron, nickel, and silicon. Note that an impurity in the oxide 230*b* refers to, for example, an element other than the main components of the oxide 230*b*. For example, an element with a concentration lower than 0.1 atomic % can be regarded as an impurity.

Note that the region 230*bc*, the region 230*ba*, and the region 230*bb* may each be formed not only in the oxide 230*b* but also in the oxide 230*a*.

In the oxide 230, the boundary of each region is difficult to detect clearly in some cases. The concentrations of a metal element and impurity elements such as hydrogen and nitrogen, which are detected in each region, may be not only gradually changed between the regions but also continuously changed in each region. That is, the region closer to the region 230*bc* may have lower concentrations of a metal element and impurity elements such as hydrogen and nitrogen.

A metal oxide functioning as a semiconductor (hereinafter also referred to as an oxide semiconductor) is preferably used for the oxide 230 (the oxide 230*a* and the oxide 230*b*).

The metal oxide functioning as a semiconductor preferably has a band gap higher than or equal to 2 eV, further preferably higher than or equal to 2.5 eV. With the use of a metal oxide having a wide band gap, the off-state current of the transistor can be reduced. A transistor including a metal oxide in a channel formation region is referred to as an OS transistor. The off-state current of the OS transistor is low, so that power consumption of the semiconductor device can be adequately reduced. The OS transistor has excellent frequency characteristics, which enables the semiconductor device to operate at high speed.

The oxide 230 preferably includes a metal oxide (an oxide semiconductor). Examples of the metal oxide that can be used for the oxide 230 include indium oxide, gallium oxide, and zinc oxide. The metal oxide preferably contains at least indium (In) or zinc (Zn). The metal oxide preferably contains two or three selected from indium, an element M, and zinc. Note that the element M is a metal element or metalloid element that has a high bonding energy with oxygen, and is, for example, a metal element or metalloid element whose bonding energy with oxygen is higher than that of indium. Specific examples of the element M include aluminum, gallium, tin, yttrium, titanium, vanadium, chromium, manganese, iron, cobalt, nickel, zirconium, molybdenum, hafnium, tantalum, tungsten, lanthanum, cerium, neodymium, magnesium, calcium, strontium, barium, boron, silicon, germanium, and antimony. The element M included in the metal oxide is preferably any one or more kinds of the above elements, further preferably one or more kinds selected from aluminum, gallium, tin, and yttrium, still further preferably gallium. Note that in this specification and the like, a metal element and a metalloid element may be collectively referred to as a "metal element", and "metal element" in this specification and the like may include a metalloid element.

For the oxide 230, it is possible to use, for example, indium zinc oxide (In—Zn oxide), indium tin oxide (In—Sn oxide), indium titanium oxide (In—Ti oxide), indium gallium oxide (In—Ga oxide), indium gallium aluminum oxide (In—Ga—Al oxide), indium gallium tin oxide (In—Ga—Sn oxide), gallium zinc oxide (Ga—Zn oxide, also referred to as GZO), aluminum zinc oxide (aluminum zinc oxide), indium aluminum zinc oxide (In—Al—Zn oxide, also referred to as IAZO), indium tin zinc oxide (In—Sn—Zn oxide), indium titanium zinc oxide (In—Ti—Zn oxide), indium gallium zinc oxide (In—Ga—Zn oxide, also referred to as IGZO), indium gallium tin zinc oxide (In—Ga—Sn—Zn oxide, also referred to as IGZTO), indium gallium aluminum zinc oxide (In—Ga—Al—Zn oxide, also referred to as IGAZO or IAGZO), or the like. Alternatively, it is possible to use indium tin oxide containing silicon, gallium tin oxide (Ga—Sn oxide), aluminum tin oxide (Al—Sn oxide), or the like.

When the proportion of the number of indium atoms in the total number of atoms of all the metal elements contained in the metal oxide is increased, the field-effect mobility of the transistor can be increased.

Note that the metal oxide may contain, instead of or in addition to indium, one or more kinds of metal elements belonging to a period of a higher number in the periodic table. The larger the overlap between orbits of metal elements is, the more likely it is that the metal oxide will have high carrier conduction. Thus, a transistor including a metal element belonging to a period of a higher number in the periodic table can have high field-effect mobility in some cases. Examples of the metal element belonging to a period of a higher number in the periodic table include metal elements belonging to Period 5 and metal elements belonging to Period 6. Specific examples of the metal element include yttrium, zirconium, silver, cadmium, tin, antimony, barium, lead, bismuth, lanthanum, cerium, praseodymium, neodymium, promethium, samarium, and europium. Note that lanthanum, cerium, praseodymium, neodymium, promethium, samarium, and europium are called light rare-earth elements.

The metal oxide may contain one or more kinds of nonmetallic elements. A transistor including the metal oxide including a nonmetallic element can have high field-effect mobility in some cases. Examples of the nonmetallic element include carbon, nitrogen, phosphorus, sulfur, selenium, fluorine, chlorine, bromine, and hydrogen.

By increasing the proportion of the number of zinc atoms in the total number of atoms of all the metal elements contained in the metal oxide, the metal oxide has high crystallinity, so that diffusion of impurities in the metal oxide can be inhibited. Consequently, a change in electrical characteristics of the transistor is suppressed, and the reliability of the transistor can be increased.

By increasing the proportion of the element M atoms in the total number of atoms of all the metal elements contained in the metal oxide, oxygen vacancies can be inhibited from being formed in the metal oxide. Accordingly, generation of carriers due to oxygen vacancies is inhibited, which makes the off-state current of the transistor low. Moreover, a change in electrical characteristics of the transistor is suppressed, and the reliability of the transistor can be increased.

As described above, electrical characteristics and reliability of a transistor vary depending on the composition of the metal oxide used for the oxide 230. Therefore, by varying the composition of the metal oxide in accordance with the electrical characteristics and reliability required for the transistor, the semiconductor device can have both excellent electrical characteristics and high reliability.

The oxide 230 preferably has a stacked-layer structure of a plurality of oxide layers with different chemical compositions. For example, the atomic ratio of the element M to a metal element that is a main component in the metal oxide used for the oxide 230*a* is preferably greater than the atomic ratio of the element M to a metal element that is a main component in the metal oxide used for the oxide 230*b*. Moreover, the atomic ratio of the element M to In in the metal oxide used for the oxide 230*a* is preferably greater than the atomic ratio of the element M to In in the metal oxide used for the oxide 230*b*. With this structure, impurities and oxygen can be inhibited from diffusing into the oxide 230*b* from the components formed below the oxide 230*a*.

Furthermore, the atomic ratio of In to the element M in the metal oxide used for the oxide 230*b* is preferably greater than the atomic ratio of In to the element M in the metal oxide used for the oxide 230*a*. With this structure, the transistor 200 can have a high on-state current and excellent frequency characteristics.

When the oxide 230*a* and the oxide 230*b* include a common element as the main component besides oxygen, the density of defect states at the interface between the oxide 230*a* and the oxide 230*b* can be decreased. Thus, the influence of interface scattering on carrier conduction is small, and the transistor 200 can have a high on-state current and excellent frequency characteristics.

Specifically, for the oxide 230*a*, a metal oxide with a composition of In:M:Zn=1:3:2 [atomic ratio] or in the neighborhood thereof, a composition of In:M:Zn=1:3:4 [atomic ratio] or in the neighborhood thereof, or a composition of In:M:Zn=1:1:0.5 [atomic ratio] or in the neighborhood thereof can be used. For the oxide 230*b*, a metal oxide with a composition of In:M:Zn=1:1:1 [atomic ratio] or in the neighborhood thereof, a composition of In:M:Zn=1:1:1.2 [atomic ratio] or in the neighborhood thereof, a composition of In:M:Zn=1:1:2 [atomic ratio] or in the neighborhood thereof, or a composition of In:M:Zn=4:2:3 [atomic ratio] or in the neighborhood thereof can be used. Note that a composition in the neighborhood includes the range of ±30% of an intended atomic ratio. Gallium is preferably used as the element M. In the case where a single layer of the oxide 230*b* is provided as the oxide 230, a metal oxide that can be used for the oxide 230*a* may be used for the oxide 230*b*. The compositions of the metal oxides that can be used for the oxide 230*a* and the oxide 230*b* are not limited to the above. For example, the composition of the metal oxide that can be used for the oxide 230*a* may be applied to the oxide 230*b*. Similarly, the composition of the metal oxide that can be used for the oxide 230*b* may be applied to the oxide 230*a*.

When the metal oxide is deposited by a sputtering method, the above atomic ratio is not limited to the atomic ratio of the deposited metal oxide and may be the atomic ratio of a sputtering target used for depositing the metal oxide.

The oxide 230*b* preferably has crystallinity. It is particularly preferable to use a CAAC-OS (c-axis aligned crystalline oxide semiconductor) for the oxide 230*b*.

The CAAC-OS is a metal oxide having a dense structure with high crystallinity and small amounts of impurities and defects (e.g., oxygen vacancies). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

A clear grain boundary is difficult to observe in the CAAC-OS; thus, it can be said that a reduction in electron mobility due to the grain boundary is less likely to occur. Thus, a metal oxide including a CAAC-OS is physically stable. Accordingly, the metal oxide including a CAAC-OS is resistant to heat and has high reliability.

When an oxide having crystallinity, such as a CAAC-OS, is used for the oxide 230*b*, oxygen extraction from the oxide 230*b* by the source electrode or the drain electrode can be inhibited. This can reduce oxygen extraction from the oxide 230*b* even when heat treatment is performed; thus, the transistor 200 is stable with respect to high temperatures in the manufacturing process (what is called thermal budget).

A transistor using an oxide semiconductor is likely to have its electrical characteristics changed by impurities and oxygen vacancies in a region where a channel is formed in the oxide semiconductor, which might reduce the reliability. In some cases, hydrogen in the vicinity of an oxygen vacancy forms a defect that is the oxygen vacancy into which hydrogen enters (hereinafter sometimes referred to as VoH), which generates an electron serving as a carrier. Therefore, if the region 230*bc* where a channel is formed in the oxide semiconductor includes oxygen vacancies, the transistor is likely to have normally-on characteristics (characteristics with which, even when no voltage is applied to the gate electrode, the channel exists and current flows through the transistor). Thus, impurities, oxygen vacancies, and VoH are preferably reduced as much as possible in the region 230*bc* in the oxide semiconductor. In other words, it is preferable that the region 230*bc* in the oxide semiconductor have a reduced carrier concentration and be i-type (intrinsic) or substantially i-type.

As a countermeasure against the above, an insulator containing oxygen that is released by heating (hereinafter sometimes referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the region 230*ba* or the region 230*bb* might cause a decrease in the on-state current or field-effect mobility of the transistor 200. Furthermore, a variation of the amount of oxygen supplied to the region 230*ba* or the region 230*bb* in the substrate plane leads to a variation in characteristics of semiconductor devices including the transistors. When oxygen supplied from the insulator to the oxide semiconductor diffuses into conductors such as the gate electrode, the source electrode, and the drain electrode, the conductors might be oxidized and the conductivity might be impaired, for example, so that the electrical characteristics and reliability of the transistor might be adversely affected.

Accordingly, in the oxide semiconductor, the region 230*bc* is preferably an i-type or substantially i-type region with a reduced carrier concentration, whereas the region 230*ba* and the region 230*bb* are preferably n-type regions with a high carrier concentration. That is, the amounts of oxygen vacancies and VoH in the region 230*bc* of the oxide semiconductor are preferably reduced. Furthermore, it is preferable that the region 230*ba* and the region 230*bb* not be supplied with an excess amount of oxygen and the amount of VoH in the region 230*ba* and the region 230*bb* not be excessively reduced. In addition, a reduction in conductivity of the conductor 260, the conductor 242*a*, the conductor 242*b*, and the like is preferably inhibited. For example, oxidation of the conductor 260, the conductor 242*a*, the conductor 242*b*, and the like is preferably inhibited. Note that hydrogen in the oxide semiconductor can form VoH; thus, the hydrogen concentration needs to be reduced in order to reduce the amount of VoH.

In view of the above, in this embodiment, the semiconductor device has a structure in which the hydrogen concentration of the region 230*bc* is reduced, oxidation of the conductor 242*a*, the conductor 242*b*, and the conductor 260 is inhibited, and a reduction in hydrogen concentration of the region 230*ba* and the region 230*bb* is inhibited.

The insulator 250 in contact with the region 230*bc* of the oxide 230*b* preferably has a function of capturing and fixing hydrogen. Thus, the hydrogen concentration in the region 230*bc* of the oxide 230*b* can be reduced. Accordingly, the amount of VoH in the region 230*bc* can be reduced, whereby the region 230*bc* can be an i-type or substantially i-type region.

Here, as illustrated in FIG. 3A and FIG. 4A, the insulator 250 preferably has a stacked-layer structure including an insulator 250*a* in contact with the oxide 230, an insulator 250*b* over the insulator 250*a*, and an insulator 250*c* over the insulator 250*b*. In this case, the insulator 250*a* preferably has a function of capturing and fixing hydrogen.

Examples of insulators having a function of capturing and fixing hydrogen include a metal oxide having an amorphous structure. For the insulator 250*a*, for example, a metal oxide such as magnesium oxide or an oxide containing one or both of aluminum and hafnium is preferably used. In such a metal oxide having an amorphous structure, an oxygen atom has a dangling bond and sometimes has a property of capturing or fixing hydrogen with the dangling bond. That is, the metal oxide having an amorphous structure has high capability of capturing or fixing hydrogen.

A high dielectric constant (high-k) material is preferably used for the insulator 250*a*. An example of the high-k material is an oxide containing one or both of aluminum and hafnium. With the use of the high-k material for the insulator 250*a*, a gate potential applied during the operation of the transistor can be reduced while the physical thickness of the gate insulator is maintained. In addition, the equivalent oxide thickness (EOT) of the insulator functioning as the gate insulator can be reduced.

As described above, for the insulator 250*a*, an oxide containing one or both of aluminum and hafnium is preferably used, an oxide that has an amorphous structure and contains one or both of aluminum and hafnium is further preferably used, and aluminum oxide having an amorphous structure is still further preferably used. In this embodiment, aluminum oxide is used for the insulator 250*a*. In this case, the insulator 250*a* is an insulator that contains at least oxygen and aluminum. The aluminum oxide has an amorphous structure. In this case, the insulator 250a has an amorphous structure.

An insulator having a thermally stable structure, such as silicon oxide or silicon oxynitride, is preferably used for the insulator 250b. Note that in this specification and the like, an oxynitride refers to a material in which the oxygen content is higher than the nitrogen content, and a nitride oxide refers to a material in which the nitrogen content is higher than the oxygen content. For example, silicon oxynitride refers to a material in which the oxygen content is higher than the nitrogen content, and silicon nitride oxide refers to a material in which the nitrogen content is higher than the oxygen content.

As illustrated in FIG. 3B and FIG. 4B, an insulator 250d may be provided over the insulator 250b. In this case, as the insulator 250d, an insulator that can be used for the insulator 250a can be provided. For the insulator 250d, hafnium oxide can be used, for example. Here, when the insulator 250d is provided between the insulator 250c and the insulator 250b, hydrogen contained in the insulator 250b and the like can be captured or fixed more effectively.

In order to inhibit oxidation of the conductor 242a, the conductor 242b, and the conductor 260, a barrier insulator against oxygen is preferably provided in the vicinity of each of the conductor 242a, the conductor 242b, and the conductor 260. In the semiconductor device described in this embodiment, the insulator corresponds to the insulator 250a, the insulator 250c, the insulator 250d, and the insulator 275, for example.

Note that in this specification and the like, a barrier insulator refers to an insulator having a barrier property. A barrier property in this specification and the like means a function of inhibiting diffusion of a targeted substance (also referred to as having low permeability). Alternatively, the barrier property means a function of capturing and fixing (also referred to as gettering) a targeted substance.

Examples of the barrier insulator against oxygen include an oxide containing one or both of aluminum and hafnium, magnesium oxide, gallium oxide, indium gallium zinc oxide, silicon nitride, and silicon nitride oxide. Examples of the oxide containing one or both of aluminum and hafnium include aluminum oxide, hafnium oxide, an oxide containing aluminum and hafnium (hafnium aluminate), and an oxide containing hafnium and silicon (hafnium silicate). For example, each of the insulator 250a, the insulator 250c, and the insulator 275 preferably has a single-layer structure or a stacked-layer structure of the barrier insulator against oxygen.

The insulator 250a preferably has a barrier property against oxygen. It is preferable that oxygen be less likely to pass through the insulator 250a than at least the insulator 280. The insulator 250a includes a region in contact with a side surface of the conductor 242a and a region in contact with a side surface of the conductor 242b. When the insulator 250a has a barrier property against oxygen, oxidation of the side surfaces of the conductor 242a and the conductor 242b and formation of oxide films on the side surfaces can be inhibited. Accordingly, a decrease in the on-state current or field-effect mobility of the transistor 200 can be inhibited.

The insulator 250a is provided in contact with the top surface and a side surface of the oxide 230b, a side surface of the oxide 230a, a side surface of the insulator 224, and the top surface of the insulator 222. When the insulator 250a has a barrier property against oxygen, release of oxygen from the region 230bc of the oxide 230b at the time of performing heat treatment or the like can be inhibited. This can reduce formation of oxygen vacancies in the oxide 230a and the oxide 230b.

By providing the insulator 250a, even when the insulator 280 contains an excess amount of oxygen, excessive supply of oxygen to the oxide 230a and the oxide 230b can be inhibited and an appropriate amount of oxygen can be supplied to the oxide 230a and the oxide 230b. Accordingly, the region 230ba and the region 230bb are inhibited from being excessively oxidized, and thus a reduction in the on-state current or field-effect mobility of the transistor 200 can be inhibited.

The oxide containing one or both of aluminum and hafnium has a barrier property against oxygen and thus can be suitably used for the insulator 250a.

The insulator 250c preferably has a barrier property against oxygen. The insulator 250c is provided between the region 230bc of the oxide 230 and the conductor 260 and between the insulator 280 and the conductor 260. This structure can inhibit oxygen contained in the region 230bc of the oxide 230 from diffusing into the conductor 260 and thus can inhibit formation of oxygen vacancies in the region 230bc of the oxide 230. Moreover, oxygen contained in the oxide 230 and oxygen contained in the insulator 280 can be inhibited from diffusing into the conductor 260 and oxidizing the conductor 260. It is preferable that oxygen be less likely to pass through the insulator 250c than at least the insulator 280. For example, silicon nitride is preferably used for the insulator 250c. In this case, the insulator 250c is an insulator that contains at least nitrogen and silicon.

The insulator 250c preferably has a barrier property against hydrogen. Accordingly, diffusion of impurities contained in the conductor 260, such as hydrogen, into the oxide 230b can be prevented.

The insulator 275 preferably has a barrier property against oxygen. The insulator 275 is provided between the insulator 280 and the conductor 242a and between the insulator 280 and the conductor 242b. With this structure, oxygen contained in the insulator 280 can be inhibited from diffusing into the conductor 242a and the conductor 242b. Thus, the conductor 242a and the conductor 242b can be inhibited from being oxidized by oxygen contained in the insulator 280, so that an increase in resistivity and a reduction in on-state current can be inhibited. It is preferable that oxygen be less likely to pass through the insulator 275 than at least the insulator 280. For example, silicon nitride is preferably used for the insulator 275. In this case, the insulator 275 is an insulator that contains at least nitrogen and silicon.

In order to inhibit a reduction in the hydrogen concentration of the region 230ba and the region 230bb in the oxide 230, a barrier insulator against hydrogen is preferably provided in the vicinity of each of the region 230ba and the region 230bb. In the semiconductor device described in this embodiment, the barrier insulator against hydrogen is, for example, the insulator 275.

Examples of the barrier insulator against hydrogen include oxides such as aluminum oxide, hafnium oxide, and tantalum oxide and nitrides such as silicon nitride. For example, the insulator 275 preferably has a single-layer structure or a stacked-layer structure of the barrier insulator against hydrogen.

The insulator 275 preferably has a barrier property against hydrogen. When the insulator 275 has a barrier property against hydrogen, the insulator 250 can be inhibited from capturing and fixing hydrogen in the region 230ba and the region 230bb. Accordingly, the region 230ba and the region 230bb can be n-type regions.

With the above structure, the region 230*bc* can be an i-type or substantially i-type region, and the region 230*ba* and the region 230*bb* can be n-type regions; thus, a semiconductor device with favorable electrical characteristics can be provided. The semiconductor device with the above structure can have favorable electrical characteristics even when miniaturized or highly integrated. Miniaturization of the transistor 200 can improve the high frequency characteristics. Specifically, the cutoff frequency can be increased.

The insulator 250*a* to the insulator 250*d* function as part of the first gate insulator. The insulator 250*a* to the insulator 250*d* are provided in the opening formed in the insulator 280 and the like, together with the conductor 260. The thicknesses of the insulator 250*a* to the insulator 250*d* are preferably small for scaling down of the transistor 200. The thickness of each of the insulator 250*a* to the insulator 250*d* is preferably greater than or equal to 0.1 nm and less than or equal to 10 nm, further preferably greater than or equal to 0.1 nm and less than or equal to 5.0 nm, further preferably greater than or equal to 0.5 nm and less than or equal to 5.0 nm, still further preferably greater than or equal to 1.0 nm and less than 5.0 nm, yet still further preferably greater than or equal to 1.0 nm and less than or equal to 3.0 nm. Note that at least part of each of the insulator 250*a* to the insulator 250*d* includes a region having the above-described thickness.

To form the insulator 250*a* to the insulator 250*d* having a small thickness as described above, an atomic layer deposition (ALD) method is preferably used for deposition. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because of enabling lower-temperature deposition.

An ALD method, which enables atomic layers to be deposited one by one, has advantages such as deposition of an extremely thin film, deposition on a component with a high aspect ratio, deposition of a film with a small number of defects such as pinholes, deposition with excellent coverage, and low-temperature deposition. Therefore, the insulator 250 can be deposited on the side surface of the opening portion formed in the insulator 280 and the like, the side end portions of the conductors 242*a* and 242*b*, and the like, with a small thickness like the above-described thickness and favorable coverage.

Note that some of precursors used in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS), X-ray photoelectron spectroscopy (XPS), or auger electron spectroscopy (AES).

Although the case where the insulator 250 has a three-layer structure of the insulator 250*a* to the insulator 250*c* or a four-layer structure of the insulator 250*a* to the insulator 250*d* is described above, the present invention is not limited thereto. The insulator 250 can have a structure including at least one of the insulator 250*a* to the insulator 250*d*. When the insulator 250 is formed of one, two, or three layer(s) of the insulator 250*a* to the insulator 250*d*, the manufacturing process of the semiconductor device can be simplified and the productivity can be increased.

In addition to the above structure, the semiconductor device of this embodiment preferably has a structure that inhibits entry of hydrogen into the transistor 200 and the like. For example, an insulator having a function of inhibiting diffusion of hydrogen is preferably provided to cover one or both of the upper portion and the lower portion of the transistor 200 and the like. In the semiconductor device described in this embodiment, the insulator corresponds to the insulator 282 and the insulator 283, for example. The insulator 215 provided below the transistor 200 may have a structure similar to the structure of one or both of the insulator 282 and the insulator 283. In such a case, the insulator 215 may have a stacked-layer structure of the insulator 282 and the insulator 283; the insulator 282 may be the lower layer and the insulator 283 may be the upper layer, or the insulator 282 may be the upper layer and the insulator 283 may be the lower layer.

One or more of the insulator 282 and the insulator 283 preferably function as a barrier insulator that inhibits diffusion of impurities such as water and hydrogen into the transistor 200 and the like from the substrate side or from above the transistor 200 and the like. Thus, one or more of the insulator 282 and the insulator 283 preferably includes an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom (an insulating material through which the impurities are less likely to pass). Alternatively, it is preferable to include an insulating material having a function of inhibiting diffusion of oxygen (e.g., at least one of an oxygen atom, an oxygen molecule, and the like) (an insulating material through which the oxygen is less likely to pass).

The insulator 282 and the insulator 283 each preferably include an insulator having a function of inhibiting diffusion of oxygen and impurities such as water and hydrogen; for example, aluminum oxide, magnesium oxide, hafnium oxide, gallium oxide, indium gallium zinc oxide, silicon nitride, silicon nitride oxide, or the like can be used. For example, silicon nitride, which has a higher hydrogen barrier property, is preferably used for the insulator 283. For example, the insulator 282 preferably includes aluminum oxide, magnesium oxide, or the like, which has a function of trapping and fixing hydrogen well. Thus, impurities such as water and hydrogen can be inhibited from diffusing into the transistor 200 and the like from an interlayer insulating film and the like that are provided on the outer side of the insulator 283. Moreover, oxygen contained in the insulator 280 and the like can be inhibited from diffusing to above the transistor 200 and the like through the insulator 282 and the like. When the insulator 215 has a structure similar to that of one or both of the insulator 282 and the insulator 283, it is possible to inhibit diffusion of impurities such as water and hydrogen from the substrate side into the transistor 200 and the like through the insulator 215. Moreover, oxygen contained in the insulator 224 and the like can be inhibited from diffusing to the substrate side. In this manner, it is preferable that the transistor 200 and the like be surrounded by upper and lower insulators having a function of inhibiting diffusion of oxygen and impurities such as water and hydrogen.

In the transistor 200, the conductor 205 is placed to overlap with the oxide 230 and the conductor 260. Here, the conductor 205 is preferably provided to be embedded in an opening portion formed in the insulator 216. Moreover, the conductor 205 is preferably provided to extend in the channel width direction as illustrated in FIG. 2A and FIG. 2C. With such a structure, the conductor 205 functions as a wiring when a plurality of transistors are provided.

The conductor 205 may have a single-layer structure or a stacked-layer structure. In FIG. 2 and the like, the conductor 205 includes the conductor 205*a* and the conductor 205*b*. The conductor 205*a* is provided in contact with the bottom surface and the sidewall of the opening portion. The conductor 205*b* is provided to fill a concave portion that is defined by the conductor 205*a* and formed along the opening portion. Here, the top surface of the conductor 205 is level or substantially level with the top surface of the insulator 216.

Here, the conductor 205*a* preferably includes a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to include a conductive material having a function of inhibiting diffusion of oxygen (e.g., at least one of an oxygen atom, an oxygen molecule, and the like).

When a conductive material having a function of inhibiting diffusion of hydrogen is used for the conductor 205*a*, impurities such as hydrogen contained in the conductor 205*b* can be prevented from diffusing into the oxide 230 through the insulator 216 and the like. When a conductive material having a function of inhibiting diffusion of oxygen is used for the conductor 205*a*, the conductivity of the conductor 205*b* can be inhibited from being lowered because of oxidation. Examples of the conductive material having a function of inhibiting diffusion of oxygen include titanium, titanium nitride, tantalum, tantalum nitride, ruthenium, and ruthenium oxide. The conductor 205*a* can have a single-layer structure or a stacked-layer structure of the above conductive material. For example, the conductor 205*a* preferably includes titanium nitride.

A conductive material containing tungsten, copper, or aluminum as its main component is preferably used for the conductor 205*b*. For example, the conductor 205*b* preferably includes tungsten.

The conductor 205 can function as the second gate electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be higher, and its off-state current can be reduced. Thus, a drain current at the time when a potential applied to the conductor 260 is 0 V can be lower in the case where a negative potential is applied to the conductor 205 than in the case where the negative potential is not applied to the conductor 205.

The electrical resistivity of the conductor 205 is designed in consideration of the potential applied to the conductor 205, and the thickness of the conductor 205 is set in accordance with the electrical resistivity. The thickness of the insulator 216 is substantially equal to that of the conductor 205. Here, the conductor 205 and the insulator 216 are preferably as thin as possible in the allowable range of the design of the conductor 205. When the thickness of the insulator 216 is reduced, the absolute amount of impurities such as hydrogen contained in the insulator 216 can be reduced, inhibiting diffusion of the impurities into the oxide 230.

The insulator 222 and the insulator 224 function as the second gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of inhibiting diffusion of one or both of hydrogen and oxygen more than the insulator 224.

The insulator 222 preferably includes an insulator containing an oxide of one or both of aluminum and hafnium, which is an insulating material. For the insulator, aluminum oxide, hafnium oxide, an oxide containing aluminum and hafnium (hafnium aluminate), or the like is preferably used. Alternatively, an oxide containing hafnium and zirconium, e.g., a hafnium zirconium oxide, is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over the above insulator may be used for the insulator 222.

For example, the insulator 222 may have a single-layer structure or a stacked-layer structure of an insulator(s) containing what is called a high-k material, such as aluminum oxide, hafnium oxide, tantalum oxide, zirconium oxide, or hafnium zirconium oxide. As miniaturization and high integration of transistors progress, a problem such as a leakage current may arise because of a thinner gate insulator. When a high-k material is used for the insulator functioning as a gate insulator, a gate potential at the time of the operation of the transistor can be reduced while the physical thickness is maintained. Furthermore, a substance with a high dielectric constant, such as lead zirconate titanate (PZT), strontium titanate ($SrTiO_3$), or (Ba, Sr) $TiO_3$ (BST), can be used for the insulator 222 in some cases.

The insulator 224 that is in contact with the oxide 230 preferably includes silicon oxide or silicon oxynitride, for example. Accordingly, oxygen can be supplied from the insulator 224 to the oxide 230, so that oxygen vacancies can be reduced.

The insulator 224 is preferably processed into an island shape in the same manner as the oxide 230. Thus, in the case where a plurality of the transistors 200 are provided, the insulator 224 having a substantially same size is provided in each of the transistors 200. Accordingly, among the transistors 200, the amount of oxygen supplied from the insulator 224 to the oxide 230 is substantially the same. This can reduce variations in electrical characteristics of the transistors 200 in the substrate plane. Note that the structure is not limited to this, and it is possible not to pattern the insulator 224 as in the case of the insulator 222.

Note that the insulator 222 and the insulator 224 may each have a stacked-layer structure of two or more layers. In that case, the stacked layers are not necessarily formed of the same material and may be formed of different materials.

A conductive material that is less likely to be oxidized or a conductive material having a function of inhibiting diffusion of oxygen is preferably used for each of the conductor 242*a*, the conductor 242*b*, and the conductor 260. Examples of the conductive material include a conductive material containing nitrogen and a conductive material containing oxygen. Thus, a decrease in the conductivity of the conductor 242*a*, the conductor 242*b*, and the conductor 260 can be inhibited. In the case where a conductive material containing metal and nitrogen is used for the conductor 242*a*, the conductor 242*b*, and the conductor 260, the conductor 242*a*, the conductor 242*b*, and the conductor 260 are conductors that contain at least metal and nitrogen.

The conductors 242*a* and 242*b* may have a single-layer structure or a stacked-layer structure. The conductor 260 may have a single-layer structure or a stacked-layer structure.

For the conductors 242*a* and 242*b*, a metal nitride is preferably used; for example, a nitride containing tantalum, a nitride containing titanium, a nitride containing molybdenum, a nitride containing tungsten, a nitride containing tantalum and aluminum, or a nitride containing titanium and aluminum is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is less likely to be oxidized or a material that maintains the conductivity even after absorbing oxygen.

Note that hydrogen contained in the oxide 230*b* or the like diffuses into the conductor 242*a* or the conductor 242*b* in some cases. In particular, when a nitride containing tantalum is used for the conductor 242*a* and the conductor 242*b*, hydrogen contained in the oxide 230*b* or the like is likely to diffuse into the conductor 242*a* or the conductor 242*b*, and the diffused hydrogen is bonded to nitrogen contained in the conductor 242*a* or the conductor 242*b* in some cases. That is, hydrogen contained in the oxide 230*b* or the like is absorbed by the conductor 242*a* or the conductor 242*b* in some cases.

As illustrated in FIG. 3B, the conductors 242*a* and 242*b* may each have a two-layer structure. In this case, the conductor 242*a* is a stacked film of a conductor 242*a*1 and a conductor 242*a*2 over the conductor 242*a*1, and the conductor 242*b* is a stacked film of a conductor 242*b*1 and a conductor 242*b*2 over the conductor 242*b*1. At this time, the above-described conductive material that is less likely to be oxidized or the above-described conductive material having a function of inhibiting diffusion of oxygen is preferably used for the layers in contact with the oxide 230*b* (the conductor 242*a*1 and the conductor 242*b*1). This can inhibit a reduction in the conductivity of the conductors 242*a* and 242*b*.

The conductor 242*a*2 and the conductor 242*b*2 preferably have higher conductivity than the conductor 242*a*1 and the conductor 242*b*1. For example, the thicknesses of the conductor 242*a*2 and the conductor 242*b*2 are preferably larger than the thicknesses of the conductor 242*a*1 and the conductor 242*b*1. For the conductor 242*a*2 and the conductor 242*b*2, a conductor that can be used for the conductor 205*b* can be used. The above structure can reduce the resistances of the conductors 242*a*2 and 242*b*2. This can increase the operating speed of the transistor 200.

For example, tantalum nitride or titanium nitride can be used for the conductor 242*a*1 and the conductor 242*b*1, and tungsten can be used for the conductor 242*a*2 and the conductor 242*b*2.

To inhibit a reduction in the conductivity of the conductors 242*a* and 242*b*, an oxide having crystallinity, such as a CAAC-OS, is preferably used for the oxide 230*b*. Specifically, a metal oxide containing indium, zinc, and one or more selected from gallium, aluminum, and tin is preferably used. When a CAAC-OS is used, oxygen extraction from the oxide 230*b* by the conductor 242*a* or the conductor 242*b* can be inhibited. Furthermore, it is possible to inhibit a reduction in the conductivity of the conductor 242*a* and the conductor 242*b*.

The insulator 271*a* and the insulator 271*b* are inorganic insulators that function as etching stoppers at the time of removing the inorganic film 276 to protect the conductor 242*a* and the conductor 242*b* as described above. Since the insulator 271*a* and the insulator 271*b* are respectively in contact with the conductor 242*a* and the conductor 242*b*, the insulator 271*a* and the insulator 271*b* are preferably inorganic insulators that are less likely to oxidize the conductors 242*a* and 242*b*. Thus, the insulator 271*a* preferably has a stacked-layer structure of the insulator 271*a*1 and the insulator 271*a*2 over the insulator 271*a*1, and the insulator 271*b* preferably has a stacked-layer structure of the insulator 271*b*1 and the insulator 271*b*2 over the insulator 271*b*1. Here, the insulators 271*a*1 and 271*b*1 are preferably formed using the nitride insulator that can be used for the insulator 250*c*, so as not to easily oxidize the conductors 242*a* and 242*b*. The insulators 271*a*2 and 271*b*2 are preferably formed using the oxide insulator that can be used for the insulator 250*b*, so as to function as etching stoppers at the time of removing the inorganic film 276 as described above.

Here, the insulator 271*a*1 is in contact with the top surface of the conductor 242*a* and a part of the insulator 275, and the insulator 271*b*1 is in contact with the top surface of the conductor 242*b* and another part of the insulator 275. The insulator 271*a*2 is in contact with the top surface of the insulator 271*a*1 and the bottom surface of the insulator 275, and the insulator 271*b*2 is in contact with the top surface of the insulator 271*b*1 and the bottom surface of the insulator 275. For example, silicon nitride can be used for the insulator 271*a*1 and the insulator 271*b*1, and silicon oxide can be used for the insulator 271*a*2 and the insulator 271*b*2.

Since the insulator 271 to be the insulator 271*a* and the insulator 271*b* functions as a mask for the conductor 242 as described above, the conductor 242 does not have a curved surface between the side surface and the top surface. Thus, end portions at the intersections of the side surfaces and the top surfaces of the conductor 242*a* and the conductor 242*b* are angular. The cross-sectional area of the conductor 242 having an angular end portion at the intersection of the side surface and the top surface is larger than that in the case where the end portion is rounded. Furthermore, when a nitride insulator that is less likely to oxidize a metal is used for the insulators 271*a*1 and 271*b*1, excessive oxidation of the conductor 242 can be prevented. Accordingly, the resistance of the conductor 242 is reduced, so that the on-state current of the transistor can be increased.

As illustrated in FIG. 3A and FIG. 4A, the conductor 260 is placed in the opening formed in the insulator 280 and the insulator 275. The conductor 260 is provided in the opening to cover the side surface of the insulator 224, the side surface of the oxide 230*a*, the side surface of the oxide 230*b*, and the top surface of the oxide 230*b*, with the insulator 250 therebetween. The conductor 260 is placed such that its top surface is substantially level with the uppermost portion of the insulator 250 and the top surface of the insulator 280.

Note that a sidewall of the opening portion which is provided in the insulator 280 and the like and in which the conductor 260 and the insulator 250 are placed may be substantially perpendicular to the top surface of the insulator 222 or may be tapered. The tapered shape of the sidewall can improve the coverage with the insulator 250 and the like provided in the opening portion in the insulator 280; as a result, defects such as voids can be reduced.

The conductor 260 functions as the first gate electrode of the transistor 200. Here, the conductor 260 is preferably provided to extend in the channel width direction as illustrated in FIG. 2B, FIG. 4A, and FIG. 4B. With such a structure, the conductor 260 functions as a wiring when a plurality of transistors are provided.

In the case where the above-described structure is employed, a curved surface may be provided between the side surface of the oxide 230*b* and the top surface of the oxide 230*b* in the cross-sectional view of the transistor 200 in the channel width direction, as illustrated in FIG. 4A and FIG. 4B. That is, an end portion of the side surface and an end portion of the top surface may be curved (hereinafter also referred to as rounded).

The radius of curvature of the curved surface is preferably greater than 0 nm and less than the thickness of the oxide 230*b* in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 230*b* with the insulator 250 and the conductor 260.

Note that in this specification and the like, a transistor structure where a channel formation region is electrically surrounded by at least the electric field of a first gate electrode is referred to as a surrounded channel (S-channel) structure. In addition, the S-channel structure disclosed in this specification and the like has a structure different from a Fin-type structure and a planar structure. Meanwhile, the S-channel structure disclosed in this specification and the like can be regarded as a kind of the Fin-type structure. Note that in this specification and the like, the Fin-type structure refers to a structure where at least two or more surfaces (specifically, two surfaces, three surfaces, four surfaces, or the like) of a channel are covered with a gate electrode. With the Fin-type structure and the S-channel structure, resistance to a short-channel effect can be increased, that is, a transistor in which a short-channel effect is less likely to occur can be provided.

When the transistor 200 has the above-described S-channel structure, the channel formation region can be electrically surrounded. Note that since the S-channel structure is a structure where the channel formation region is electrically surrounded, it can also be said that the S-channel structure is a structure substantially equivalent to a GAA (Gate All Around) structure or an LGAA (Lateral Gate All Around) structure. When the transistor 200 has the S-channel structure, the GAA structure, or the LGAA structure, the channel formation region that is formed at the interface between the oxide 230 and the gate insulator or in the vicinity of the interface can correspond to the entire bulk of the oxide 230. Accordingly, the density of current flowing through the transistor can be increased, which can be expected to increase the on-state current of the transistor or increase the field-effect mobility of the transistor.

In this embodiment, the insulator 224 with an island shape is provided as described above. Accordingly, as illustrated in FIG. 4A and FIG. 4B, at least part of the bottom surface of the conductor 260 can be positioned lower than the bottom surface of the oxide 230*b*. Thus, the conductor 260 can be provided to face the top surface and the side surface of the oxide 230*b*, so that an electric field of the conductor 260 can be applied to the top surface and the side surface of the oxide 230*b*. When the insulator 224 with an island shape is provided in this manner, the transistor 200 can have the S-channel structure.

Although FIG. 4A and FIG. 4B illustrate a transistor with the S-channel structure as the transistor 200, the semiconductor device of one embodiment of the present invention is not limited thereto. For example, a transistor structure that can be used in one embodiment of the present invention may be one or more selected from the planar structure, the Fin-type structure, and the GAA structure.

FIG. 2B and the like illustrate the conductor 260 having a two-layer structure. Here, the conductor 260 preferably includes the conductor 260*a* and the conductor 260*b* placed over the conductor 260*a*. For example, the conductor 260*a* is preferably placed to cover the bottom surface and a side surface of the conductor 260*b*. In this case, a conductive material that is less likely to be oxidized or a conductive material having a function of inhibiting diffusion of oxygen is preferably used for the conductor 260*a*.

For the conductor 260*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, it is preferable to use a conductive material having a function of inhibiting diffusion of oxygen (e.g., at least one of an oxygen atom, an oxygen molecule, and the like).

When the conductor 260*a* has a function of inhibiting diffusion of oxygen, the conductivity of the conductor 260*b* can be inhibited from being lowered because of oxidation due to oxygen contained in the insulator 280 or the like. As the conductive material having a function of inhibiting diffusion of oxygen, titanium, titanium nitride, tantalum, tantalum nitride, ruthenium, or ruthenium oxide is preferably used, for example.

For the conductor 260*b*, a conductor having high conductivity is preferably used. For example, a conductive material containing tungsten, copper, or aluminum as its main component can be used for the conductor 260*b*. The conductor 260*b* may have a stacked-layer structure; for example, a stacked-layer structure of titanium or titanium nitride and the above conductive material may be employed.

In the transistor 200, the conductor 260 is formed in a self-aligned manner to fill the opening formed in the insulator 280 and the like. The formation of the conductor 260 in this manner allows the conductor 260 to be placed properly in a region between the conductor 242*a* and the conductor 242*b* without alignment.

The insulator 216 and the insulator 280 each preferably have a lower dielectric constant than an insulator 214. When a material with a low dielectric constant is used for an interlayer film, parasitic capacitance generated between wirings can be reduced.

For example, the insulator 216 and the insulator 280 each preferably include one or more of silicon oxide, silicon oxynitride, silicon oxide to which fluorine is added, silicon oxide to which carbon is added, silicon oxide to which carbon and nitrogen are added, and porous silicon oxide.

In particular, silicon oxide and silicon oxynitride, which are thermally stable, are preferable. A material such as silicon oxide, silicon oxynitride, or porous silicon oxide is particularly preferably used, in which case a region including oxygen that is released by heating can be easily formed.

The top surfaces of the insulator 216 and the insulator 280 may be planarized.

The concentration of impurities such as water and hydrogen in the insulator 280 is preferably reduced. For example, the insulator 280 preferably includes an oxide containing silicon, such as silicon oxide or silicon oxynitride.

<Constituent Materials for Semiconductor Device>

Constituent materials that can be used for the semiconductor device will be described below. Note that each layer included in the semiconductor device may have a single-layer structure or a stacked-layer structure.

<<Substrate>>

As a substrate where the transistor is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is the above-described semiconductor substrate including an insulator region, e.g., an SOI (Silicon On Insulator) substrate. Examples of the conductor substrate include a graphite substrate, a metal substrate, an alloy substrate, and a conductive resin substrate. Other examples of substrates include a substrate including a metal nitride, a substrate including a metal oxide, an insulator substrate provided with a conductor or a semiconductor, a semiconductor substrate provided with a conductor or an insulator, and a conductor substrate provided with a semiconductor or an insulator. Alternatively, these substrates provided with one or more kinds of elements may be used. Examples of the element provided for the substrate include a capacitor, a resistor, a switching element, a light-emitting element, and a memory element.

<<Insulator>>

Examples of the insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as a leakage current may arise because of a thinner gate insulator. When a high-k material is used for the insulator functioning as a gate insulator, the voltage at the time of the operation of the transistor can be reduced while the physical thickness is maintained. In contrast, when a material with a low relative permittivity is used for the insulator functioning as an interlayer film, parasitic capacitance generated between wirings can be reduced. Thus, a material is preferably selected depending on the function of the insulators.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including a metal oxide is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, one or more of boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum can be used. Specific examples of the insulator having a function of inhibiting passage of oxygen and impurities such as hydrogen include a metal oxide such as aluminum oxide, magnesium oxide, gallium oxide, germanium oxide, yttrium oxide, zirconium oxide, lanthanum oxide, neodymium oxide, hafnium oxide, and tantalum oxide and a metal nitride such as aluminum nitride, silicon nitride oxide, and silicon nitride.

The insulator functioning as the gate insulator is preferably an insulator including a region containing oxygen to be released by heating. For example, when silicon oxide or silicon oxynitride including a region containing oxygen to be released by heating is in contact with the oxide 230, oxygen vacancies included in the oxide 230 can be compensated for.

<<Conductor>>

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. Examples of the conductor include tantalum nitride, titanium nitride, tungsten, a nitride containing titanium and aluminum, a nitride containing tantalum and aluminum, ruthenium oxide, ruthenium nitride, an oxide containing strontium and ruthenium, and an oxide containing lanthanum and nickel. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are less likely to be oxidized or materials that maintain their conductivity even after absorbing oxygen. Alternatively, a semiconductor having high electrical conductivity, typified by polycrystalline silicon containing an impurity element such as phosphorus, or silicide such as nickel silicide may be used.

In the case of using a conductor having a stacked-layer structure, for example, a stacked-layer structure combining a material containing the above metal element and a conductive material containing oxygen, a stacked-layer structure combining a material containing the above metal element and a conductive material containing nitrogen, or a stacked-layer structure combining a material containing the above metal element, a conductive material containing oxygen, and a conductive material containing nitrogen may be employed.

In the case where an oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side.

When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used. For example, a conductive material containing nitrogen, such as titanium nitride or tantalum nitride, may be used. One or more of indium tin oxide, indium oxide containing tungsten oxide, indium zinc oxide containing tungsten oxide, indium oxide containing titanium oxide, indium tin oxide containing titanium oxide, indium zinc oxide, and indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

For the oxide 230, a metal oxide functioning as a semiconductor (an oxide semiconductor) is preferably used. A metal oxide that can be used for the oxide 230 of one embodiment of the present invention will be described below.

The metal oxide preferably contains at least indium or zinc. In particular, indium and zinc are preferably contained. Moreover, aluminum, gallium, yttrium, tin, antimony, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, an element M, and zinc is considered. The element M is aluminum, gallium, yttrium, tin, or antimony. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that a combination of two or more of the above elements may be used as the element M. In particular, the element Mis preferably one or more kinds selected from gallium, aluminum, yttrium, and tin.

Note that in this specification and the like, a metal oxide containing nitrogen is also collectively referred to as a metal oxide in some cases. A metal oxide containing nitrogen may be referred to as a metal oxynitride.

Hereinafter, an In—Ga—Zn oxide is described as an example of the metal oxide.

Examples of crystal structures of an oxide semiconductor include amorphous (including completely amorphous), CAAC (c-axis-aligned crystalline), nc (nanocrystalline), CAC (cloud-aligned composite), single crystal, and polycrystalline structures.

Note that oxide semiconductors might be classified in a manner different from the above-described one when classified in terms of the structure. For example, oxide semiconductors are classified into a single crystal oxide semiconductor and a non-single-crystal oxide semiconductor. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the maximum diameter of the crystal region may be approximately several tens of nanometers.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can also be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

[a-like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state where one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter also referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

In a material composition of a CAC-OS in an In—Ga—Zn oxide that contains In, Ga, Zn, and O, there are regions containing In as a main component (first regions) in part of the CAC-OS and regions containing Ga as a main component (second regions) in another part of the CAC-OS. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. In the case of forming the CAC-OS by a sputtering method, one or more selected from an inert gas (typically, argon), an oxygen gas, and a nitrogen gas can be used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is higher than or equal to 0% and lower than 30%, preferably higher than or equal to 0% and lower than or equal to 10%.

Here, the first region is a region having higher conductivity than the second region. That is, when carriers flow through the first region, the conductivity of a metal oxide is exhibited. Accordingly, when the first regions are distributed in a metal oxide like a cloud, high field-effect mobility (μ) can be achieved.

On the other hand, the second region is a region having a higher insulating property than the first region. That is, when the second regions are distributed in a metal oxide, leakage current can be inhibited.

Thus, in the case where the CAC-OS is used for a transistor, the complementary action of the conductivity due to the first region and the insulating property due to the second region enables the CAC-OS to have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility (μ), and favorable switching operation can be achieved.

A transistor using the CAC-OS has high reliability. Thus, the CAC-OS is most suitable for a variety of semiconductor devices such as a display device.

Oxide semiconductors have various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

<<Other Semiconductor Materials>>

A semiconductor material that has a band gap (a semiconductor material that is not a zero-gap semiconductor) may be used for the semiconductor layer of the transistor. For example, a single-element semiconductor such as silicon or a compound semiconductor such as gallium arsenide may be used.

For the semiconductor layer of the transistor, transition metal chalcogenide functioning as a semiconductor is preferably used, for example. Specific examples of the transition metal chalcogenide that can be used for the semiconductor layer of the transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$). The use of the transition metal chalcogenide for the semiconductor layer of the transistor can provide a semiconductor device with a high on-state current.

<Example of Method for Manufacturing Semiconductor Device>

An example of a method for manufacturing the semiconductor device of one embodiment of the present invention will be described with reference to FIG. 5A to FIG. 11D. Here, the case of manufacturing the semiconductor device illustrated in FIG. 2A to FIG. 2D is described as an example.

Note that A of each drawing is a plan view. Moreover, B of each drawing is a cross-sectional view corresponding to a portion indicated by the dashed-dotted line A1-A2 in A of each drawing, and is also a cross-sectional view in the channel length direction of the transistor 200. Furthermore, C of each drawing is a cross-sectional view corresponding to a portion indicated by the dashed-dotted line A3-A4 in A of each drawing, and is also a cross-sectional view in the channel width direction of the transistor 200. Moreover, D of each drawing is a cross-sectional view corresponding to a portion indicated by the dashed-dotted line A5-A6 in A of each drawing, and is also a cross-sectional view in the channel width direction of the transistor 200. Note that for clarity of the drawing, some components are not illustrated in the plan view of A of each drawing.

Hereinafter, an insulating material for forming an insulator, a conductive material for forming a conductor, or a semiconductor material for forming a semiconductor can be deposited by a sputtering method, a chemical vapor deposition (CVD) method, a molecular beam epitaxy (MBE)

method, a pulsed laser deposition (PLD) method, an ALD method, or the like as appropriate.

Examples of a sputtering method include an RF sputtering method in which a high-frequency power source is used as a sputtering power source, a DC sputtering method in which a DC power source is used, and a pulsed DC sputtering method in which a voltage applied to an electrode is changed in a pulsed manner. An RF sputtering method is mainly used to form an insulating film, and a DC sputtering method is mainly used to form a metal conductive film. A pulsed DC sputtering method is mainly used to deposit a compound such as an oxide, a nitride, or a carbide by a reactive sputtering method.

Note that CVD methods can be classified into a plasma CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method depending on a source gas to be used.

A high-quality film can be obtained at a relatively low temperature by a plasma CVD method. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device may be charged up by receiving electric charge from plasma. In that case, accumulated electric charge may break the wiring, the electrode, the element, or the like included in the semiconductor device. By contrast, such plasma damage is not caused in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD method, in which a reactant excited by plasma is used, and the like can be used.

A CVD method and an ALD method are different from a sputtering method in which particles ejected from a target or the like are deposited. Thus, a CVD method and an ALD method are deposition methods that enable good step coverage almost regardless of the shape of an object. In particular, an ALD method enables excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

By a CVD method, a film with a certain composition can be deposited depending on the flow rate ratio of the source gases. For example, by a CVD method, a film whose composition is continuously changed can be deposited by changing the flow rate ratio of the source gases during deposition. In the case where the film is deposited while the flow rate ratio of the source gases is changed, as compared with the case where the film is deposited using a plurality of deposition chambers, the time taken for the deposition can be shortened because the time taken for transfer or pressure adjustment is not required. Thus, the productivity of the semiconductor device can be increased in some cases.

By an ALD method, a film with a certain composition can be deposited by concurrently introducing different kinds of precursors. In the case where different kinds of precursors are introduced, a film with a certain composition can be deposited by controlling the number of cycles for each of the precursors.

First, a substrate (not illustrated) is prepared, and the insulator 215 is deposited over the substrate (see FIG. 5A to FIG. 5D). As described above, the insulator 215 can be formed using an insulator similar to any one of the insulator 224, the insulator 282, and the insulator 283 or a stack including two or more thereof. As the disposition method for the insulator 215, a sputtering method, a CVD method, an MBE method, a PLD method, or an ALD method can be used, for example. It is preferable to use a sputtering method that does not need to use a molecule containing hydrogen as a deposition gas, in which case the hydrogen concentration in the insulator 215 can be reduced.

Next, the insulator 216 is deposited over the insulator 215. The insulator 216 is preferably deposited by a sputtering method. By using a sputtering method that does not need to use a molecule containing hydrogen as a deposition gas, the hydrogen concentration in the insulator 216 can be reduced. Without limitation to a sputtering method, the insulator 216 may be deposited by a CVD method, an MBE method, a PLD method, an ALD method, or the like as appropriate.

In this embodiment, for the insulator 216, silicon oxide is deposited by a pulsed DC sputtering method using a silicon target in an atmosphere containing an oxygen gas. The use of a pulsed DC sputtering method can achieve more uniform film thickness and improve the sputtering rate and film quality.

The insulator 215 and the insulator 216 are preferably deposited successively without exposure to the air. For example, a multi-chamber deposition apparatus is used. As a result, the amounts of hydrogen in the deposited insulator 215 and insulator 216 can be reduced, and furthermore, entry of hydrogen into the films in intervals between deposition steps can be inhibited.

Then, an opening reaching the insulator 215 is formed in the insulator 216. Wet etching may be used for the formation of the opening; however, dry etching is preferably used for microfabrication. As the insulator 215, it is preferable to select an insulator that functions as an etching stopper film at the time of forming a groove by etching the insulator 216. For example, in the case where silicon oxide or silicon oxynitride is used for the insulator 216 in which the groove is to be formed, silicon nitride, aluminum oxide, or hafnium oxide is preferably used for the insulator 215.

After the formation of the opening, a conductive film to be the conductor 205*a* is formed. The conductive film to be the conductor 205*a* desirably includes a conductor having a function of inhibiting passage of oxygen. For example, tantalum nitride, tungsten nitride, or titanium nitride can be used. Alternatively, a stacked film of the conductor having a function of inhibiting passage of oxygen and tantalum, tungsten, titanium, molybdenum, aluminum, copper, or a molybdenum-tungsten alloy can be used. The conductive film to be the conductor 205*a* can be formed by a sputtering method, a CVD method, an MBE method, a PLD method, an ALD method, or the like.

In this embodiment, titanium nitride is deposited for the conductive film to be the conductor 205*a*. When such a metal nitride is used for a layer below the conductor 205*b*, oxidation of the conductor 205*b* by the insulator 216 or the like can be inhibited. Furthermore, even when a metal that is likely to diffuse, such as copper, is used for the conductor 205*b*, the metal can be prevented from diffusing to the outside through the conductor 205*a*.

Next, a conductive film to be the conductor 205*b* is formed. Tantalum, tungsten, titanium, molybdenum, aluminum, copper, a molybdenum-tungsten alloy, or the like can be used for the conductive film to be the conductor 205*b*. The conductive film can be formed by a plating method, a sputtering method, a CVD method, an MBE method, a PLD method, an ALD method, or the like. In this embodiment, tungsten is deposited for the conductive film to be the conductor 205*b*.

Subsequently, by performing CMP treatment, the conductive film to be the conductor 205*a* and the conductive film to be the conductor 205*b* are partly removed to expose the insulator 216 (see FIG. 5A to FIG. 5D). As a result, the conductor 205*a* and the conductor 205*b* remain only in the opening portion. Note that the insulator 216 is partly removed by the CMP treatment in some cases.

Next, the insulator 222 is deposited over the insulator 216 and the conductor 205 (see FIG. 6A to FIG. 6D).

An insulator containing an oxide of one or both of aluminum and hafnium is preferably deposited as the insulator 222. Note that as the insulator containing an oxide of one or both of aluminum and hafnium, for example, aluminum oxide, hafnium oxide, or an oxide containing aluminum and hafnium (hafnium aluminate) is preferably used. Alternatively, hafnium-zirconium oxide is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor are inhibited from diffusing into the transistor through the insulator 222, and generation of oxygen vacancies in the oxide 230 can be inhibited.

Alternatively, the insulator 222 can be a stacked film of the insulator containing an oxide of one or both of aluminum and hafnium and silicon oxide, silicon oxynitride, silicon nitride, or silicon nitride oxide.

The insulator 222 can be deposited by a sputtering method, a CVD method, an MBE method, a PLD method, or an ALD method, for example. In this embodiment, for the insulator 222, hafnium oxide is deposited by an ALD method. Alternatively, a stack of silicon nitride deposited by a PEALD method and hafnium oxide deposited by an ALD method may be used as the insulator 222.

Then, an insulating film 224*f* is formed over the insulator 222 (see FIG. 6A to FIG. 6D). For the insulating film 224*f*, an insulator corresponding to the insulator 224 is used.

The insulating film 224*f* can be formed by a sputtering method, a CVD method, an MBE method, a PLD method, or an ALD method, for example. In this embodiment, for the insulating film 224*f*, silicon oxide is deposited by a sputtering method. By using a sputtering method that does not need to use a molecule containing hydrogen as a deposition gas, the hydrogen concentration in the insulating film 224*f* can be reduced. The hydrogen concentration in the insulating film 224*f* is preferably reduced in this manner because the insulating film 224*f* is in contact with the oxide 230*a* in a later step.

Note that heat treatment may be performed before the insulating film 224*f* is formed. The heat treatment may be performed under reduced pressure, and the insulating film 224*f* may be successively formed without exposure to the air. Such treatment can remove moisture and hydrogen adsorbed onto the surface of the insulator 222 and can reduce the moisture concentration and the hydrogen concentration in the insulator 222. The heat treatment temperature is preferably higher than or equal to 100° C. and lower than or equal to 400° C. In this embodiment, the heat treatment is performed at 250° C.

Next, the oxide film 230*af* is formed over the insulating film 224*f*, and the oxide film 230*bf* is formed over the oxide film 230*af* (see FIG. 6A to FIG. 6D). A metal oxide corresponding to the oxide 230*a* is used for the oxide film 230*af*, and a metal oxide corresponding to the oxide 230*b* is used for the oxide film 230*bf*. Note that the oxide film 230*af* and the oxide film 230*bf* are preferably formed successively without being exposed to an atmospheric environment. By the deposition without exposure to the air, impurities or moisture from the atmospheric environment can be prevented from being attached onto the oxide film 230*af* and the oxide film 230*bf*, so that the vicinity of the interface between the oxide film 230*af* and the oxide film 230*bf* can be kept clean.

The oxide film 230*af* and the oxide film 230*bf* can each be formed by a sputtering method, a CVD method, an MBE method, a PLD method, or an ALD method, for example. In this embodiment, the oxide film 230*af* and the oxide film 230*bf* are formed by a sputtering method.

For example, in the case where the oxide film 230*af* and the oxide film 230*bf* are formed by a sputtering method, oxygen or a mixed gas of oxygen and a noble gas is used as a sputtering gas. Increasing the proportion of oxygen contained in the sputtering gas can increase the amount of excess oxygen in the formed oxide films. In the case where the oxide films are formed by a sputtering method, an In-M-Zn oxide target or the like can be used.

In particular, when the oxide film 230*af* is formed, part of oxygen contained in the sputtering gas is supplied to the insulating film 224*f* in some cases. Thus, the proportion of oxygen contained in the sputtering gas is preferably higher than or equal to 70%, further preferably higher than or equal to 80%, still further preferably 100%.

In the case where the oxide film 230*bf* is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. A transistor including an oxygen-excess oxide semiconductor in its channel formation region can have relatively high reliability. Note that one embodiment of the present invention is not limited thereto. In the case where the oxide film 230*bf* is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in its channel formation region can have relatively high field-effect mobility.

Furthermore, when the deposition is performed while the substrate is being heated, the crystallinity of the oxide film can be improved.

In this embodiment, the oxide film 230*af* is formed by a sputtering method using an oxide target with In:Ga:Zn=1:3:2 [atomic ratio] or an oxide target with In:Ga:Zn=1:3:4 [atomic ratio]. In addition, the oxide film 230*bf* is formed by a sputtering method using an oxide target with In:Ga:Zn=1:1:1 [atomic ratio], an oxide target with In:Ga:Zn=1:1:1.2 [atomic ratio], an oxide target with In:Ga:Zn=4:2:4.1 [atomic ratio], or an oxide target with In:Ga:Zn=1:1:2 [atomic ratio]. Note that each of the oxide films is preferably formed so as to have characteristics required for the oxide 230*a* and the oxide 230*b* by selecting the deposition conditions and the atomic ratios as appropriate.

Note that the insulating film 224*f*, the oxide film 230*af*, and the oxide film 230*bf* are preferably formed by a sputtering method without exposure to the air. For example, a multi-chamber deposition apparatus is preferably used. Thus, entry of hydrogen into the insulating film 224*f*, the oxide film 230*af*, and the oxide film 230*bf* in intervals between deposition steps can be inhibited.

Next, heat treatment is preferably performed. The heat treatment is performed in a temperature range where the oxide film 230*af* and the oxide film 230*bf* do not become polycrystals. The temperature of the heat treatment is preferably higher than or equal to 100° C., higher than or equal to 250° C., or higher than or equal to 350° C. and lower than or equal to 650° C., lower than or equal to 600° C., or lower than or equal to 550° C.

Note that the heat treatment is performed in a nitrogen gas or inert gas atmosphere, or an atmosphere containing an oxidizing gas at higher than or equal to 10 ppm, higher than or equal to 1%, or higher than or equal to 10%. For example, in the case where the heat treatment is performed in an atmosphere of mixing a nitrogen gas and an oxygen gas, the proportion of the oxygen gas is preferably approximately 20%. The heat treatment may be performed under reduced pressure. Alternatively, heat treatment may be performed in a nitrogen gas or inert gas atmosphere, and then another heat treatment may be performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is preferably 1 ppb or less, further preferably 0.1 ppb or less, still further preferably 0.05 ppb or less. The heat treatment using a highly purified gas can prevent entry of moisture or the like into the oxide film 230*af*, the oxide film 230*bf*, and the like as much as possible.

In this embodiment, the heat treatment is performed at 450° C. for one hour with the flow rate ratio of nitrogen gas to oxygen gas being 4:1. Through such heat treatment using the oxygen gas, impurities such as carbon, water, and hydrogen in the oxide film 230*af* and the oxide film 230*bf* can be reduced. The reduction of impurities in the films in this manner improves the crystallinity of the oxide film 230*bf*, thereby offering a dense structure with a higher density. Thus, crystalline regions in the oxide film 230*af* and the oxide film 230*bf* are expanded, so that in-plane variations of the crystalline regions in the oxide film 230*af* and the oxide film 230*bf* can be reduced. Accordingly, an in-plane variation of electrical characteristics of transistors can be reduced.

By performing the heat treatment, hydrogen in the insulator 216, the insulating film 224*f*, the oxide film 230*af*, and the oxide film 230*bf* moves into the insulator 222 and is absorbed by the insulator 222. In other words, hydrogen in the insulator 216, the insulating film 224*f*, the oxide film 230*af*, and the oxide film 230*bf* diffuses into the insulator 222. Accordingly, the hydrogen concentration in the insulator 222 increases, while the hydrogen concentrations in the insulator 216, the insulating film 224*f*, the oxide film 230*af*, and the oxide film 230*bf* decrease.

Specifically, the insulating film 224*f* (to be the insulator 224 later) functions as the second gate insulator of the transistor 200, and the oxide film 230*af* and the oxide film 230*bf* (to be the oxide 230*a* and the oxide 230*b* later) function as the channel formation region of the transistor 200. The transistor 200 formed using the insulating film 224*f*, the oxide film 230*af*, and the oxide film 230*bf* with reduced hydrogen concentrations is preferable because of its favorable reliability.

Next, the conductive film 242*f* is formed over the oxide film 230*bf* (see FIG. 6A to FIG. 6D). For the conductive film 242*f*, a conductor corresponding to the conductor 242 is used. After the formation of the oxide film 230*bf*, the conductive film 242*f* is formed over and in contact with the oxide film 230*bf* without inserting an etching step or the like, so that the top surface of the oxide film 230*bf* can be protected by the conductive film 242*f*. Thus, diffusion of impurities into the oxide 230 included in the transistor can be reduced, whereby the electrical characteristics and reliability of the semiconductor device can be improved.

The conductive film 242*f* can be formed by a sputtering method, a CVD method, an MBE method, a PLD method, a plating method, or an ALD method.

In this embodiment, for the conductive film 242*f*, tantalum nitride is deposited by a sputtering method. Note that heat treatment may be performed before the formation of the conductive film 242*f*. This heat treatment may be performed under reduced pressure, and the conductive film 242*f* may be successively formed without exposure to the air. Such treatment can remove moisture and hydrogen adsorbed onto the surface of the oxide 230*b*, and further can reduce the moisture concentration and the hydrogen concentration in the oxide 230*a* and the oxide 230*b*. The heat treatment temperature is preferably higher than or equal to 100° C. and lower than or equal to 400° C. In this embodiment, the heat treatment is performed at 250° C.

Note that the conductive film 242*f* may be a stacked film. For example, in the case where a stacked-layer structure of the conductors 242*a*1 and 242*a*2 and a stacked-layer structure of the conductors 242*b*1 and 242*b*2 are employed as illustrated in FIG. 3B and the like, tantalum nitride is deposited by a sputtering method and tungsten is deposited thereover by a sputtering method as the conductive film 242*f*.

Then, the insulating film 271_1*f* is formed over the conductive film 242*f*, and then the insulating film 271_2*f* is formed thereover (see FIG. 6A to FIG. 6D). An insulator corresponding to the insulator 271_1 is used for the insulating film 271_1*f*, and an insulator corresponding to the insulator 271_2 is used for the insulating film 271_2*f*. Here, by using an insulating film having a function of inhibiting passage of oxygen as the insulating film 271_1*f* as described above, oxidation of the conductive film 242*f* in the following steps can be inhibited.

The insulating film 271_1*f* and the insulating film 271_2*f* can be formed by a sputtering method, a CVD method, an MBE method, a PLD method, an ALD method, or the like. For example, a silicon nitride film is formed by a sputtering method as the insulating film 271_1*f*, and a silicon oxide film is formed by a sputtering method as the insulating film 271_2*f*.

Here, it is preferable to form the insulating film 271_1*f* and the insulating film 271_2*f* successively without exposure to the air. By the formation without exposure to the air, impurities or moisture from the atmospheric environment can be prevented from being attached onto the insulating film 271_1*f* and the insulating film 271_2*f*, so that the vicinity of the interface between the insulating film 271_1*f* and the insulating film 271_2*f* can be kept clean. It is further preferable to form the components from the conductive film 242*f* to the insulating film 271_2*f* successively without exposure to the air.

Note that heat treatment may be performed before the formation of the insulating film 271_1*f* and the insulating film 271_2*f*. The heat treatment may be performed under reduced pressure, and the insulating film 271_1*f* and the insulating film 271_2*f* may be successively formed without exposure to the air. Such treatment can remove moisture and hydrogen adsorbed onto the surface of the conductive film 242*f* and can reduce the moisture concentration and the hydrogen concentration in the conductive film 242*f*. The heat treatment temperature is preferably higher than or equal to 100° C. and lower than or equal to 400° C. In this embodiment, the heat treatment is performed at 250° C.

Next, the insulating film 224*f*, the oxide film 230*af*, the oxide film 230*bf*, the conductive film 242*f*, the insulating film 271_1*f*, and the insulating film 271_2*f* are processed into an island shape by a lithography method, thereby forming the insulator 224, the oxide 230*a*, the oxide 230*b*, the conductor 242, the insulator 271_1, and the insulator 271_2 (see FIG. 7A to FIG. 7D). The insulating film 224*f*, the oxide film 230*af*, the oxide film 230*bf*, the conductive film 242*f*, the insulating film 271_1*f*, and the insulating film 271_2*f* can be processed by the method according to FIG. 1B to FIG. 1F described above.

Processing by the method described in <Example of method for processing stack> enables formation of an island-shaped stack in which the side surface of the conductor 242 does not excessively recede with respect to the side surface of the oxide 230, that is, the side end portion of the conductor 242 and the side end portion of the oxide 230 are substantially aligned with each other. Manufacturing the transistor 200 using such a stack having a minute structure can achieve miniaturization and high integration of the semiconductor device.

It is preferable that the insulator 224, the oxide 230*a*, the oxide 230*b*, the conductor 242, the insulator 271_1, and the insulator 271_2 be collectively processed into an island shape. In this case, it is preferable that the side end portion of the conductor 242 be substantially aligned with the side end portion of the oxide 230*a* and the side end portion of the oxide 230*b*. Furthermore, it is preferable that the side end portion of the insulator 224 be substantially aligned with the side end portion of the oxide 230. Moreover, it is preferable that the side end portion of the insulator 271 be substantially aligned with the side end portion of the conductor 242. With such a structure, the number of steps for the semiconductor device of one embodiment of the present invention can be reduced. Thus, a method for manufacturing a semiconductor device with high productivity can be provided.

The insulator 224, the oxide 230*a*, the oxide 230*b*, the conductor 242, and the insulator 271_1 are formed to at least partly overlap with the conductor 205. The insulator 222 is exposed in a region where the insulator 222 does not overlap with the insulator 224, the oxide 230*a*, the oxide 230*b*, the conductor 242, the insulator 271_1, and the insulator 271_2.

Since the insulator 271 functions as a mask for the conductor 242 in the step of removing the inorganic film 276, the conductor 242 does not have a curved surface between the side surface and the top surface. Thus, end portions at the intersections of the side surfaces and the top surfaces of the conductor 242*a* and the conductor 242*b* to be formed later are angular. The cross-sectional area of the conductor 242 having an angular end portion at the intersection of the side surface and the top surface is larger than that in the case where the end portion is rounded. Furthermore, when a nitride insulator that is less likely to oxidize a metal is used for the insulator 271_1, excessive oxidation of the conductor 242 can be prevented. Accordingly, the resistance of the conductor 242 is reduced, so that the on-state current of the transistor can be increased.

By processing the insulator 224 into an island shape, the insulator 275 can be provided in contact with the side surface of the insulator 224 and the top surface of the insulator 222 in a step to be described later. That is, the insulator 224 can be isolated from the insulator 280 by the insulator 275. Such a structure can prevent an excess amount of oxygen and impurities such as hydrogen from entering the oxide 230 from the insulator 280 through the insulator 224.

In the case where a plurality of the transistors 200 are provided, processing the insulator 224 into an island shape makes the insulator 224 having a substantially same size to be provided in each of the transistors 200. Accordingly, among the transistors 200, the amount of oxygen supplied from the insulator 224 to the oxide 230 is substantially the same. This can reduce variations in electrical characteristics of the transistors 200 in the substrate plane. Note that the structure is not limited to this, and it is possible not to pattern the insulator 224 as in the case of the insulator 222.

Figure 7A:
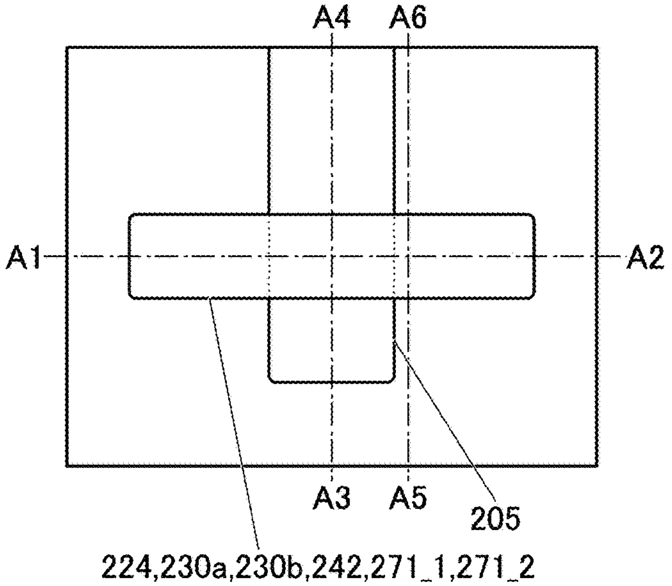
FIG. 7A is a plan view illustrating an example of a method for manufacturing a semiconductor device.
Figure 7C:
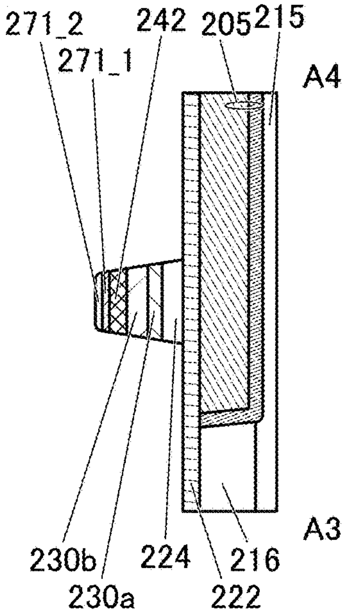
FIG. 7B to FIG. 7D are cross-sectional views illustrating an example of a method for manufacturing a semiconductor device.
Figure 7B:
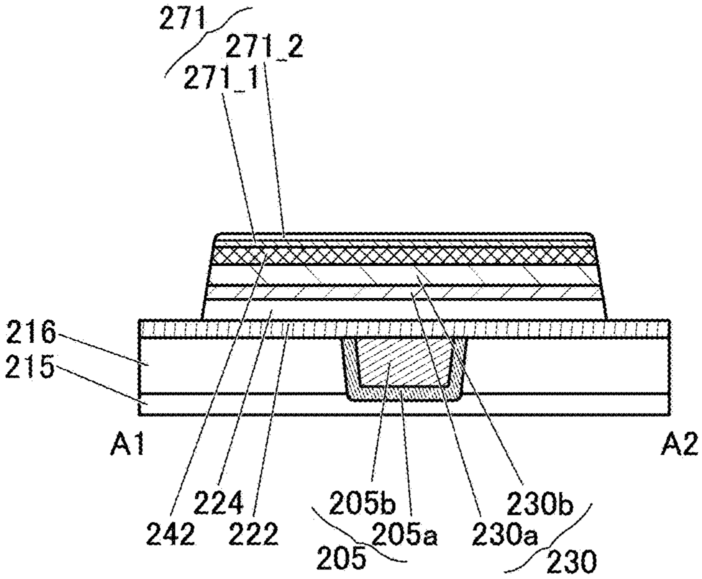
Figure 7D:
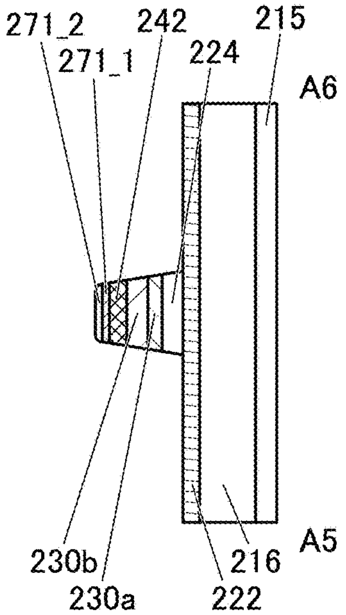

As illustrated in FIG. 7B to FIG. 7D, the side surfaces of the insulator 224, the oxide 230*a*, the oxide 230*b*, the conductor 242, the insulator 271_1, and the insulator 271_2 may have tapered shapes. The taper angle of the side surfaces of the insulator 224, the oxide 230*a*, the oxide 230*b*, the conductor 242, the insulator 271_1, and the insulator 271_2 may be, for example, greater than or equal to 60° and less than 90°. With such tapered shapes of the side surfaces, the coverage with the insulator 275 and the like can be improved in a later step, so that defects such as voids can be reduced.

Not being limited to the above, the insulator 224, the oxide 230*a*, the oxide 230*b*, the conductor 242, the insulator 271_1, and the insulator 271_2 may have side surfaces that are substantially perpendicular to the top surface of the insulator 222. With such a structure, a plurality of transistors can be provided with high density in a small area.

Next, the insulator 275 is deposited to cover the insulator 224, the oxide 230*a*, the oxide 230*b*, the conductor 242, the insulator 271_1, and the insulator 271_2, and then the insulator 280 is deposited over the insulator 275. The above-described insulators can be used for the insulator 275 and the insulator 280.

Here, it is preferable that the insulator 275 be in contact with the top surface of the insulator 222.

As the insulator 280, an insulator having a flat top surface is preferably formed by forming an insulating film to be the insulator 280 and then performing CMP treatment on the insulating film. Note that, for example, silicon nitride may be deposited over the insulator 280 by a sputtering method and CMP treatment may be performed on the silicon nitride until the insulator 280 is reached.

The insulator 275 and the insulator 280 can each be deposited by a sputtering method, a CVD method, an MBE method, a PLD method, or an ALD method, for example.

For the insulator 275, an insulator having a function of inhibiting passage of oxygen is preferably used. For example, for the insulator 275, silicon nitride is preferably deposited by a PEALD method. Alternatively, for the insulator 275, it is preferable that aluminum oxide be deposited by a sputtering method and silicon nitride be deposited thereover by a PEALD method. When the insulator 275 has the above-described structure, the function of inhibiting diffusion of oxygen and impurities such as water and hydrogen can be improved.

In this manner, the oxide 230*a*, the oxide 230*b*, and the conductor 242 can be covered with the insulator 275, which has a function of inhibiting diffusion of oxygen. This structure can reduce direct diffusion of oxygen from the insulator 280 or the like into the insulator 224, the oxide 230*a*, the oxide 230*b*, and the conductor 242 in a later step.

For the insulator 280, silicon oxide is preferably deposited by a sputtering method. When the insulating film to be the insulator 280 is formed by a sputtering method in an oxygen-containing atmosphere, the insulator 280 containing excess oxygen can be formed. By using a sputtering method that does not need to use a molecule containing hydrogen as a deposition gas, the hydrogen concentration in the insulator 280 can be reduced. Note that heat treatment may be performed before the formation of the insulating film. The heat treatment may be performed under reduced pressure, and the insulating film may be successively deposited without exposure to the air. Such treatment can remove moisture and hydrogen adsorbed onto the surface of the insulator 275 and the like, and further can reduce the moisture concentration and the hydrogen concentration in the oxide 230*a*, the oxide 230*b*, and the insulator 224. For the heat treatment, the above heat treatment conditions can be used.

Next, the conductor 242, the insulator 271_1, the insulator 271_2, the insulator 275, and the insulator 280 are processed by a lithography method, thereby forming an opening reaching the oxide 230*b* (see FIG. 8A to FIG. 8D). The opening reaching the oxide 230*b* is provided in a region where the oxide 230*b* and the conductor 205 overlap with each other.

A dry etching method or a wet etching method can be used for the processing. Processing by a dry etching method is suitable for microfabrication. The conductor 242, the insulator 271_1, the insulator 271_2, the insulator 275, and the insulator 280 may be processed under different conditions. In particular, in the case where a dry etching method is used for processing the conductor 242, an ICP etching apparatus is preferably used. In this case, the etching treatment is preferably performed by applying bias power to increase the etching rate with respect to the conductor 242.

By this processing, the conductor 242 is divided into the island-shaped conductors 242*a* and 242*b*. Similarly, the insulator 271_1 is divided into the island-shaped insulators 271*a*1 and 271*b*1. Similarly, the insulator 271_2 is divided into the island-shaped insulators 271*a*2 and 271*b*2.

The width of the opening is preferably small because the channel length of the transistor 200 reflects the width. For example, the width of the opening is preferably less than or equal to 60 nm, less than or equal to 50 nm, less than or equal to 40 nm, less than or equal to 30 nm, less than or equal to 20 nm, or less than or equal to 10 nm and greater than or equal to 1 nm or greater than or equal to 5 nm. In order to process the opening minutely, a lithography method using an electron beam or short-wavelength light such as EUV light is preferably employed.

By the above etching treatment, impurities might be attached onto the side surface of the oxide 230*a*, the top surface and the side surface of the oxide 230*b*, the side surfaces of the conductors 242*a* and 242*b*, the side surfaces of the insulators 271*a* and 271*b*, the side surface of the insulator 275, the side surface of the insulator 280, and the like or the impurities might be diffused thereinto. A step of removing the impurities may be performed. In addition, a damaged region might be formed on the surface of the oxide 230*b* by the above dry etching. Such a damaged region may be removed. The impurities come from components contained in the insulator 280, the insulator 275, the insulators 271*a* and 271*b*, and the conductors 242*a* and 242*b*; components contained in a member of an apparatus used to form the opening; and components contained in a gas or a liquid used for etching, for instance. Examples of the impurities include hafnium, aluminum, silicon, tantalum, fluorine, and chlorine.

In particular, impurities such as aluminum and silicon might reduce the crystallinity of the oxide 230*b*. Thus, it is preferable that impurities such as aluminum and silicon be removed from the surface of the oxide 230*b* and the vicinity thereof. The concentration of the impurities is preferably reduced. For example, the concentration of aluminum atoms at the surface of the oxide 230*b* and the vicinity thereof is preferably lower than or equal to 5.0 atomic %, further preferably lower than or equal to 2.0 atomic %, still further preferably lower than or equal to 1.5 atomic %, yet further preferably lower than or equal to 1.0 atomic %, yet still further preferably lower than 0.3 atomic %.

Note that since the density of a crystal structure is reduced in a low-crystallinity region of the oxide 230*b* due to impurities such as aluminum and silicon, a large amount of VoH is formed; thus, the transistor is likely to be normally on. Hence, the low-crystallinity region of the oxide 230*b* is preferably reduced or removed.

In contrast, the oxide 230*b* preferably has a layered CAAC structure. In particular, the CAAC structure preferably reaches a lower end portion of a drain in the oxide 230*b*. Here, in the transistor, the conductor 242*a* or the conductor 242*b* preferably functions as the drain. In other words, the oxide 230*b* in the vicinity of the lower end portion of the conductor 242*a* or the conductor 242*b* preferably has a CAAC structure. In this manner, the low-crystallinity region of the oxide 230*b* is removed and the CAAC structure is formed also in the end portion of the drain, which significantly affects the drain withstand voltage, so that a variation in electrical characteristics of transistors can be further suppressed. In addition, the reliability of the transistor can be improved.

In order to remove impurities and the like attached to the surface of the oxide 230*b* in the above etching step, cleaning treatment is performed. Examples of the cleaning method include wet cleaning using a cleaning solution or the like (which can also be referred to as wet etching treatment), plasma treatment using plasma, and cleaning by heat treatment, and any of these cleaning methods may be performed in combination as appropriate.

The wet cleaning may be performed using an aqueous solution in which one or more of ammonia water, oxalic acid, phosphoric acid, and hydrofluoric acid is diluted with carbonated water or pure water; pure water; carbonated water; or the like. Alternatively, ultrasonic cleaning using such an aqueous solution, pure water, or carbonated water may be performed. Alternatively, such cleaning methods may be performed in combination as appropriate.

Note that in this specification and the like, in some cases, an aqueous solution in which hydrofluoric acid is diluted with pure water is referred to as diluted hydrofluoric acid, and an aqueous solution in which ammonia water is diluted with pure water is referred to as diluted ammonia water. The concentration, temperature, and the like of the aqueous solution are adjusted as appropriate in accordance with an impurity to be removed, the structure of a semiconductor device to be cleaned, or the like. The concentration of ammonia in the diluted ammonia water is preferably higher than or equal to 0.01% and lower than or equal to 5%, further preferably higher than or equal to 0.1% and lower than or equal to 0.5%. The concentration of hydrogen fluoride in the diluted hydrofluoric acid is preferably higher than or equal to 0.01 ppm and lower than or equal to 100 ppm, further preferably higher than or equal to 0.1 ppm and lower than or equal to 10 ppm.

For the ultrasonic cleaning, a frequency higher than or equal to 200 kHz is preferable, and a frequency higher than or equal to 900 kHz is further preferable. Damage to the oxide 230*b* and the like can be reduced with such a frequency.

The cleaning treatment may be performed a plurality of times, and the cleaning solution may be changed in every cleaning treatment. For example, first cleaning treatment may use diluted hydrofluoric acid or diluted ammonia water, and second cleaning treatment may use pure water or carbonated water.

As the cleaning treatment in this embodiment, wet cleaning using diluted ammonia water is performed. The cleaning treatment can remove impurities that are attached onto the surfaces of the oxide 230*a*, the oxide 230*b*, and the like or diffused into the oxide 230*a*, the oxide 230*b*, and the like. Furthermore, the crystallinity of the oxide 230*b* can be increased.

After the etching or the cleaning, heat treatment may be performed. The temperature of the heat treatment is preferably higher than or equal to 100° C., higher than or equal to 250° C., or higher than or equal to 350° C. and lower than or equal to 650° C., lower than or equal to 600° C., lower than or equal to 550° C., or lower than or equal to 400° C. Note that the heat treatment is performed in a nitrogen gas or inert gas atmosphere, or an atmosphere containing an oxidizing gas at higher than or equal to 10 ppm, higher than or equal to 1%, or higher than or equal to 10%. For example, heat treatment is preferably performed at 350° C. for one hour at a flow rate ratio of a nitrogen gas to an oxygen gas of 4:1. Accordingly, oxygen can be supplied to the oxide 230*a* and the oxide 230*b* to reduce oxygen vacancies. In addition, the crystallinity of the oxide 230*b* can be improved by such heat treatment. Furthermore, hydrogen remaining in the oxide 230*a* and the oxide 230*b* reacts with supplied oxygen, so that the hydrogen can be removed as $H_2O$ (dehydration). This can inhibit recombination of hydrogen remaining in the oxide 230*a* and the oxide 230*b* with oxygen vacancies and formation of VoH. The heat treatment may be performed under reduced pressure. Alternatively, heat treatment may be performed in an oxygen atmosphere, and then heat treatment may be successively performed in a nitrogen atmosphere without exposure to the air.

In the case where heat treatment is performed in the state where the conductor 242*a* and the conductor 242*b* are in contact with the oxide 230*b*, the sheet resistance of the oxide 230*b* in a region overlapping with the conductor 242*a* and a region overlapping with the conductor 242*b* is decreased in some cases. Furthermore, the carrier concentration is sometimes increased. Thus, the resistance of the oxide 230*b* in the region overlapping with the conductor 242*a* and the region overlapping with the conductor 242*b* can be lowered in a self-aligned manner.

Note that the above heat treatment may be omitted. For example, in the case where the conductors 242*a* and 242*b* each have a stacked-layer structure as illustrated in FIG. 3B and the like and a tungsten film or the like, which is relatively easily oxidized, is used for the conductors 242*a*2 and 242*b*2, the heat treatment may be omitted. Thus, the conductors 242*a*2 and 242*b*2 can be prevented from being excessively oxidized by the heat treatment.

Then, an insulating film 250A to be the insulator 250 is formed to fill the opening (see FIG. 9A to FIG. 9D). The insulating film 250A can be formed by a sputtering method, a CVD method, an MBE method, a PLD method, or an ALD method, for example. The insulating film 250A is preferably formed by an ALD method. The insulator 250 is preferably formed to have a small thickness, and a variation in the film thickness needs to be reduced. Since an ALD method is a deposition method in which a precursor and a reactant (e.g., an oxidizer) are alternately introduced and the film thickness can be adjusted with the number of repetition times of the cycle, accurate control of the film thickness is possible. Furthermore, the insulator 250 needs to be formed to favorably cover the bottom surface and the side surface of the opening. By an ALD method, atomic layers can be deposited one by one on the bottom surface and the side surface of the opening, whereby the insulator 250 can be formed in the opening with good coverage.

In the case where the insulating film 250A is formed by an ALD method, ozone ($O_3$), oxygen ($O_2$), water ($H_2O$), or the like can be used as the oxidizer. When an oxidizer without containing hydrogen, such as ozone ($O_3$) or oxygen ($O_2$), is used, the amount of hydrogen diffusing into the oxide 230*b* can be reduced.

The insulator 250 can have a stacked-layer structure as illustrated in FIG. 3A and FIG. 4A, and FIG. 3B and FIG. 4B. In the case of the structure illustrated in FIG. 3A and FIG. 4A, aluminum oxide can be deposited by a thermal ALD method as the insulating film to be the insulator 250*a*, silicon oxide can be deposited by a PEALD method as the insulating film to be the insulator 250*b*, and silicon nitride can be deposited by a PEALD method as the insulating film to be the insulator 250*c*. In the case of the structure illustrated in FIG. 3B and FIG. 4B, hafnium oxide can be deposited by a thermal ALD method as the insulating film to be the insulator 250*d*.

Next, it is preferable to perform microwave treatment in an oxygen-containing atmosphere. Here, the microwave treatment refers to, for example, treatment using an apparatus including a power source that generates high-density plasma with the use of a microwave. In this specification and the like, a microwave refers to an electromagnetic wave having a frequency greater than or equal to 300 MHz and less than or equal to 300 GHz. Note that in the case where the insulator 250 has a stacked-layer structure, the microwave treatment is not necessarily performed after the formation of the entire insulating film 250A. For example, in the case of the structure illustrated in FIG. 3A and FIG. 4A, microwave treatment may be performed after the insulating film to be the insulator 250*a* and the insulating film to be the insulator 250*b* are formed, and then the insulating film to be the insulator 250*c* may be formed. For example, in the case of the structure illustrated in FIG. 3B and FIG. 4B, the steps may be performed in the following order: formation of the insulating film to be the insulator 250*a* and the insulating film to be the insulator 250*b*, microwave treatment, formation of the insulating film to be the insulator 250*d*, microwave treatment, and formation of the insulating film to be the insulator 250*c*. In the above manner, the microwave treatment in an oxygen-containing atmosphere may be performed multiple times (at least two or more times).

The microwave treatment is preferably performed with a microwave treatment apparatus including a power source for generating high-density plasma using microwaves, for example. Here, the frequency of the microwave treatment apparatus is preferably set to greater than or equal to 300 MHz and less than or equal to 300 GHz, further preferably greater than or equal to 2.4 GHz and less than or equal to 2.5 GHZ, and can be set to 2.45 GHz, for example. Oxygen radicals at a high density can be generated with high-density plasma. The electric power of the power source that applies microwaves of the microwave treatment apparatus is preferably set to higher than or equal to 1000 W and lower than or equal to 10000 W, further preferably higher than or equal to 2000 W and lower than or equal to 5000 W. The microwave treatment apparatus may be provided with a power source that applies RF to the substrate side. Furthermore, application of RF to the substrate side allows oxygen ions generated by the high-density plasma to be introduced into the oxide 230*b* efficiently.

The microwave treatment is preferably performed under reduced pressure, and the pressure is preferably set to higher than or equal to 10 Pa and lower than or equal to 1000 Pa, further preferably higher than or equal to 300 Pa and lower than or equal to 700 Pa. The treatment temperature is preferably set to lower than or equal to 750° C., further preferably lower than or equal to 500° C., and can be approximately 250° C., for example. The oxygen plasma treatment may be followed successively by heat treatment without exposure to the air. The temperature of the heat treatment is preferably higher than or equal to 100° C. and lower than or equal to 750° C., further preferably higher than or equal to 300° C. and lower than or equal to 500° C., for example.

The microwave treatment can be performed using an oxygen gas and an argon gas, for example. Here, the oxygen flow rate ratio ($O_2/(O_2+Ar)$) is higher than 0% and lower than or equal to 100%. The oxygen flow rate ratio ($O_2/(O_2+Ar)$) is preferably higher than 0% and lower than or equal to 50%. The oxygen flow rate ratio ($O_2/(O_2+Ar)$) is further preferably higher than or equal to 10% and lower than or equal to 40%. The oxygen flow rate ratio ($O_2/(O_2+Ar)$) is still further preferably higher than or equal to 10% and lower than or equal to 30%. The carrier concentration in the oxide 230*b* can be reduced by thus performing the microwave treatment in an oxygen-containing atmosphere. In addition, the carrier concentrations in the oxide 230*b* can be prevented from being excessively reduced by preventing an excess amount of oxygen from being introduced into the chamber in the microwave treatment.

The microwave treatment in an oxygen-containing atmosphere can convert an oxygen gas into plasma using a high-frequency wave such as a microwave or RF, and apply the oxygen plasma to a region of the oxide 230*b* which is between the conductor 242*a* and the conductor 242*b*. By the effect of the plasma, the microwave, or the like, VoH in the region can be divided into an oxygen vacancy and hydrogen, and hydrogen can be removed from the region. Here, in the case of employing the structure illustrated in FIG. 3A or FIG. 3B, an insulating film having a function of capturing and fixing hydrogen (e.g., aluminum oxide) is preferably used as the insulating film to be the insulator 250*a*. With such a structure, hydrogen generated by the microwave treatment can be captured or fixed in the insulator 250*a*. Accordingly, VoH contained in the channel formation region can be reduced. In the above manner, oxygen vacancies and VoH in the channel formation region can be reduced to lower the carrier concentration. In addition, oxygen radicals generated by the oxygen plasma can be supplied to oxygen vacancies in the channel formation region, thereby further reducing oxygen vacancies in the channel formation region and lowering the carrier concentration.

The oxygen implanted into the channel formation region has any of a variety of forms such as an oxygen atom, an oxygen molecule, an oxygen ion, and an oxygen radical (also referred to as O radical, which is an atom, a molecule, or an ion having an unpaired electron). Note that the oxygen implanted into the channel formation region has any one or more of the above forms, particularly suitably an oxygen radical. Furthermore, the film quality of the insulator 250 can be improved, leading to higher reliability of the transistor.

Meanwhile, the oxide 230*b* includes a region overlapping with the conductor 242*a* or 242*b*. The region can function as a source region or a drain region. Here, the conductors 242*a* and 242*b* preferably function as blocking films preventing the effect caused by the high-frequency wave such as a microwave or RF, the oxygen plasma, or the like in the microwave treatment in an oxygen-containing atmosphere. Therefore, the conductors 242*a* and 242*b* preferably have a function of blocking an electromagnetic wave of greater than or equal to 300 MHz and less than or equal to 300 GHz, for example, greater than or equal to 2.4 GHz and less than or equal to 2.5 GHz.

The effect of the high-frequency wave such as a microwave or RF, the oxygen plasma, or the like is blocked by the conductors 242*a* and 242*b* and does not affect the region of the oxide 230*b* overlapping with the conductor 242*a* or 242*b*. Hence, a reduction in VoH and supply of an excess amount of oxygen do not occur in the source region and the drain region in the microwave treatment, preventing a decrease in carrier concentration.

The insulator 250 having a barrier property against oxygen is provided in contact with the side surfaces of the conductors 242*a* and 242*b*. This can inhibit formation of oxide films on the side surfaces of the conductors 242*a* and 242*b* by the microwave treatment.

Furthermore, the film quality of the insulator 250 can be improved, leading to higher reliability of the transistor.

In the above manner, oxygen vacancies and VoH can be selectively removed from the channel formation region in the oxide semiconductor, whereby the channel formation region can be an i-type or substantially i-type region. Furthermore, supply of an excess amount of oxygen to the regions functioning as the source region and the drain region can be inhibited, and the conductivity (the state of the low-resistance regions) before the microwave treatment is performed can be maintained. As a result, a change in the electrical characteristics of the transistor can be inhibited, and thus a variation in the electrical characteristics of transistors in the substrate plane can be inhibited.

In the microwave treatment, thermal energy is directly transmitted to the oxide 230*b* in some cases owing to an electromagnetic interaction between the microwave and a molecule in the oxide 230*b*. The oxide 230*b* may be heated by this thermal energy. Such heat treatment is sometimes referred to as microwave annealing. When microwave treatment is performed in an oxygen-containing atmosphere, an effect equivalent to that of oxygen annealing is sometimes obtained. In the case where hydrogen is contained in the oxide 230*b*, it is probable that the thermal energy is transmitted to the hydrogen in the oxide 230*b* and the hydrogen activated by the energy is released from the oxide 230*b*.

Note that the microwave treatment may be performed not after the formation of the insulating film 250A but before the formation of the insulating film 250A.

After the microwave treatment after the formation of the insulating film 250A, heat treatment may be performed with a reduced pressure being maintained. Such treatment enables hydrogen in the insulating film, the oxide 230*b*, and the oxide 230*a* to be removed efficiently. Part of hydrogen is gettered by the conductors 242*a* and 242*b* in some cases. Alternatively, the step of performing microwave treatment and then performing heat treatment with the reduced pressure being maintained may be repeated a plurality of cycles. The repetition of the heat treatment enables hydrogen in the insulating film, the oxide 230*b*, and the oxide 230*a* to be removed more efficiently. Note that the temperature of the heat treatment is preferably higher than or equal to 300° C. and lower than or equal to 500° C. The microwave treatment, i.e., the microwave annealing may also serve as the heat treatment. The heat treatment is not necessarily performed in the case where the oxide 230*b* and the like are adequately heated by the microwave annealing.

The microwave treatment improves the film quality of the insulating film 250A, thereby inhibiting diffusion of hydrogen, water, impurities, and the like. Accordingly, hydrogen, water, impurities, and the like can be inhibited from diffusing into the oxide 230*b*, the oxide 230*a*, and the like through the insulator 250 in a later step such as formation of a conductive film to be the conductor 260 or later treatment such as heat treatment.

Next, a conductive film 260A to be the conductor 260*a* and a conductive film 260B to be the conductor 260*b* are formed in this order (see FIG. 10A to FIG. 10D). The conductive film 260A and the conductive film 260B can each be formed by a sputtering method, a CVD method, an MBE method, a PLD method, a plating method, or an ALD method, for example. In this embodiment, titanium nitride is deposited by an ALD method for the conductive film 260A, and tungsten is deposited by a CVD method for the conductive film 260B.

Then, the insulating film 250A, the conductive film 260A, and the conductive film 260B are polished by CMP treatment until the insulator 280 is exposed. That is, portions of the insulating film 250A, the conductive film 260A, and the conductive film 260B exposed from the opening are removed. Thus, the insulator 250 and the conductor 260 (the conductor 260*a* and the conductor 260*b*) are formed in the opening overlapping with the conductor 205 (see FIG. 11A to FIG. 11D).

Accordingly, the insulator 250 is provided in contact with the inner wall and the side surface of the opening overlapping with the oxide 230*b*. The conductor 260 is positioned to fill the opening with the insulator 250 therebetween. In this manner, the transistor 200 is formed.

Next, the insulator 282 is formed over the insulator 250, the conductor 260, and the insulator 280. The insulator 282 can be deposited by a sputtering method, a CVD method, an MBE method, a PLD method, or an ALD method, for example. The insulator 282 is preferably deposited by a sputtering method. By using a sputtering method that does not need to use a molecule containing hydrogen as a deposition gas, the hydrogen concentration in the insulator 282 can be reduced.

In this embodiment, for the insulator 282, aluminum oxide is deposited by a pulsed DC sputtering method using an aluminum target in an atmosphere containing an oxygen gas. The use of a pulsed DC sputtering method can achieve more uniform film thickness and improve the sputtering rate and film quality. The RF power applied to the substrate is lower than or equal to 1.86 W/cm$^2$. The RF power is preferably higher than or equal to 0 W/cm$^2$ and lower than or equal to 0.62 W/cm$^2$. Note that the RF power of 0 W/cm$^2$ means no application of RF power to the substrate. The amount of oxygen implanted into a layer below the insulator 282 can be controlled depending on the amount of RF power applied to the substrate. For example, the amount of oxygen implanted into the layer below the insulator 282 decreases as the RF power decreases, and the amount of oxygen is easily saturated even when the insulator 282 has a small thickness. Moreover, the amount of oxygen implanted into the layer below the insulator 282 increases as the RF power increases. With low RF power, the amount of oxygen implanted into the insulator 280 can be reduced. Alternatively, the insulator 282 may have a stacked-layer structure of two layers. In this case, for example, the lower layer of the insulator 282 is deposited with an RF power of 0 W/cm$^2$ applied to the substrate, and the upper layer of the insulator 282 is deposited with an RF power of 0.62 W/cm$^2$ applied to the substrate.

The RF frequency is preferably 10 MHz or higher. The typical frequency is 13.56 MHz. The higher the RF frequency is, the less damage the substrate receives.

When the insulator 282 is deposited by a sputtering method in an oxygen-containing atmosphere, oxygen can be added to the insulator 280 during the deposition. Thus, excess oxygen can be contained in the insulator 280. At this time, the insulator 282 is preferably formed while the substrate is being heated.

Note that heat treatment may be performed before the deposition of the insulator 282. The heat treatment may be performed under reduced pressure, and the insulator 282 may be successively deposited without exposure to the air. Such treatment can remove moisture and hydrogen adsorbed onto the surface of the insulator 280, and further can reduce the moisture concentration and the hydrogen concentration in the insulator 280. The heat treatment temperature is preferably higher than or equal to 100° C. and lower than or equal to 400° C. In this embodiment, the heat treatment is performed at 250° C.

Subsequently the insulator 283 is formed over the insulator 282. The insulator 283 can be deposited by a sputtering method, a CVD method, an MBE method, a PLD method, or an ALD method, for example. The insulator 283 is preferably deposited by a sputtering method. By using a sputtering method that does not need to use a molecule containing hydrogen as a deposition gas, the hydrogen concentration in the insulator 283 can be reduced. In this embodiment, for the insulator 283, silicon nitride is deposited by a sputtering method.

Here, it is preferable that the insulator 282 and the insulator 283 be successively deposited without being exposed to the atmospheric environment. By the deposition without exposure to the air, impurities or moisture from the atmospheric environment can be prevented from being attached onto the insulator 282 and the insulator 283, so that the vicinity of the interface between the insulator 282 and the insulator 283 can be kept clean.

Through the above steps, the semiconductor device illustrated in FIG. 2 can be manufactured.

By the method for processing the stack according to this embodiment, it is possible to manufacture an island-shaped stack in which the side end portion of the conductor and the side end portion of the oxide semiconductor are substantially aligned with each other. Manufacturing an OS transistor using such a stack having a minute structure can achieve miniaturization and high integration of the semiconductor device.

The semiconductor device of this embodiment includes OS transistors. Since the off-state current of the OS transistors is low, a semiconductor device or a memory device with low power consumption can be achieved. Since the OS transistors have excellent frequency characteristics, a semiconductor device or a memory device with high operating speed can be achieved. With the use of the OS transistors, a semiconductor device having favorable electrical characteristics, a semiconductor device with a small variation in electrical characteristics of transistors, a semiconductor device with a high on-state current, or a highly reliable semiconductor device or memory device can be achieved.

This embodiment can be combined with any of the other embodiments and examples as appropriate. In this specification, in the case where a plurality of structure examples are shown in one embodiment, the structure examples can be combined as appropriate.

Embodiment 2

In this embodiment, a memory device using the transistor of one embodiment of the present invention will be described with reference to FIG. 12 to FIG. 18.

In this embodiment, a specific structure example of a memory device using a memory cell including the transistor described in the above embodiment will be described. In this embodiment, a structure example of a memory device in which a layer including a functional circuit having functions of amplifying and outputting a data potential retained in a memory cell is provided between stacked layers including memory cells will be described.

[Structure Example of Memory Device]

FIG. 12 is a block diagram of a memory device of one embodiment of the present invention.

A memory device 300 illustrated in FIG. 12 includes a driver circuit 21 and a memory array 20. The memory array 20 includes a plurality of memory cells 10 and a functional layer 50 including a plurality of functional circuits 51.

FIG. 12 illustrates an example in which the memory array 20 includes the plurality of memory cells 10 arranged in a matrix of m rows and n columns (each of m and n is an integer greater than or equal to 2). In the example illustrated in FIG. 12, the functional circuit 51 is provided for each wiring BL functioning as a bit line, and the functional layer 50 includes the plurality of functional circuits 51 that are provided to correspond to n wirings BL.

In FIG. 12, the memory cell 10 in the first row and the first column is denoted as a memory cell 10[1,1], and the memory cell 10 in the m-th row and the n-th column is denoted as a memory cell 10[m,n]. In this embodiment and the like, a given row is denoted as an i-th row in some cases. A given column is denoted as a j-th column in some cases. Thus, i is an integer greater than or equal to 1 and less than or equal to m, and j is an integer greater than or equal to 1 and less than or equal to n. In this embodiment and the like, the memory cell 10 in the i-th row and the j-th column is denoted as a memory cell 10[i,j]. Note that in this embodiment and the like, "i+α" (α is a positive or negative integer) is not below 1 and does not exceed m. Similarly, "j+α" is not below 1 and does not exceed n.

The memory array 20 includes m wirings WL extending in the row direction, m wirings PL extending in the row direction, and the n wirings BL extending in the column direction. In this embodiment and the like, a first wiring WL (provided in the first row) is denoted as a wiring WL[1], and an m-th wiring WL (provided in the m-th row) is denoted as a wiring WL[m]. Similarly, a first wiring PL (provided in the first row) is denoted as a wiring PL[1], and an m-th wiring PL (provided in the m-th row) is denoted as a wiring PL[m]. Similarly, a first wiring BL (provided in the first column) is denoted as a wiring BL[1], and an n-th wiring BL (provided in the n-th column) is denoted as a wiring BL[n].

A plurality of the memory cells 10 provided in the i-th row are electrically connected to the wiring WL in the i-th row (wiring WL[i]) and the wiring PL in the i-th row (wiring PL[i]). A plurality of the memory cells 10 provided in the j-th column are electrically connected to the wiring BL in the j-th column (wiring BL[j]).

A DOSRAM (registered trademark) (Dynamic Oxide Semiconductor Random Access Memory) can be used for the memory array 20. A DOSRAM is a RAM including a 1T (transistor) 1C (capacitor) memory cell and refers to a memory in which an access transistor is an OS transistor. A current flowing between a source and a drain in an off state, that is, a leakage current, is extremely low in an OS transistor. A DOSRAM can retain electric charges corresponding to data stored in a capacitor for a long time by turning off an access transistor (by bring the access transistor into a non-conducting state). For this reason, the refresh operation frequency of a DOSRAM can be lower than that of a DRAM formed with a transistor containing silicon in its channel formation region (a Si transistor). As a result, power consumption can be reduced. The OS transistor also has excellent frequency characteristics and thus enables high-speed reading and writing of the memory device. Hence, a memory device that can operate at high speed can be provided.

In the memory array 20 illustrated in FIG. 12, a plurality of memory arrays 20[1] to 20[m] can be stacked. When the memory arrays 20[1] to 20[m] included in the memory array 20 are provided in the direction perpendicular to the surface of a substrate provided with the driver circuit 21, the memory density of the memory cells 10 can be increased.

The wiring BL functions as a bit line for writing and reading data. The wiring WL functions as a word line for controlling the on and off state (conducting and non-conducting state) of an access transistor serving as a switch. The wiring PL has a function of a constant potential line connected to a capacitor. Note that a wiring CL (not illustrated) can be additionally provided as a wiring having a function of supplying a back gate potential to a back gate of an OS transistor serving as the access transistor. Alternatively, the wiring PL may also have a function of supplying the back gate potential.

The memory cell 10 included in each of the memory arrays 20[1] to 20[m] is connected to the functional circuit 51 through the wiring BL. The wiring BL can be provided in the direction perpendicular to the surface of the substrate provided with the driver circuit 21. Since the wiring BL provided to extend from the memory cells 10 included in the memory arrays 20[1] to 20[m] is provided in the direction perpendicular to the surface of the substrate, the length of the wiring between the memory array 20 and the functional circuit 51 can be shortened. Accordingly, a signal transmission distance between the two circuits connected to the bit line can be shortened, and the resistance and parasitic capacitance of the bit line can be significantly reduced; thus, power consumption and signal delays can be reduced. Moreover, even when the capacitance of the capacitors included in the memory cells 10 is reduced, operation is possible.

The functional circuit 51 has functions of amplifying a data potential retained in the memory cell 10 and outputting the amplified data potential to a sense amplifier 46 included in the driver circuit 21 through a later-described wiring GBL (not illustrated). With this structure, a slight difference in the potential of the wiring BL can be amplified at the time of data reading. Like the wiring BL, the wiring GBL can be provided in the direction perpendicular to the surface of the substrate provided with the driver circuit 21. Since the wiring BL and the wiring GBL provided to extend from the memory cells 10 included in the memory arrays 20[1] to 20[m] are provided in the direction perpendicular to the surface of the substrate, the length of the wiring between the functional circuit 51 and the sense amplifier 46 can be shortened. Accordingly, a signal transmission distance between the two circuits connected to the wiring GBL can be shortened, and the resistance and parasitic capacitance of the wiring GBL can be significantly reduced; thus, power consumption and signal delays can be reduced.

Note that the wiring BL is provided in contact with a semiconductor layer of the transistor included in the memory cell 10. Alternatively, the wiring BL is provided in contact with a region functioning as a source or a drain in the semiconductor layer of the transistor included in the memory cell 10. Alternatively, the wiring BL is provided in contact with a conductor provided in contact with the region functioning as the source or the drain in the semiconductor layer of the transistor included in the memory cell 10. That is, the wiring BL is a wiring for electrically connecting one of the source and the drain of the transistor included in the memory cell 10 in each layer of the memory array 20 to the functional circuit 51 in the perpendicular direction.

The memory array 20 can be provided over the driver circuit 21 to overlap therewith. When the driver circuit 21 and the memory array 20 are provided to overlap with each other, a signal transmission distance between the driver circuit 21 and the memory array 20 can be shortened. Accordingly, resistance and parasitic capacitance between the driver circuit 21 and the memory array 20 are reduced, so that power consumption and signal delays can be reduced. In addition, the memory device 300 can be downsized.

The functional circuit 51 can be provided at any desired position, e.g., over a circuit that is formed using Si transistors in a manner similar to that of the memory arrays 20[1] to 20[m] when the functional circuit 51 is formed with an OS transistor like the transistor included in the memory cell 10 of the DOSRAM, whereby integration can be easily performed. With the structure in which a signal is amplified by the functional circuit 51, a circuit in a subsequent stage, such as the sense amplifier 46, can be downsized; hence, the memory device 300 can be downsized.

The driver circuit 21 includes a PSW 22 (power switch), a PSW 23, and a peripheral circuit 31. The peripheral circuit 31 includes a peripheral circuit 41, a control circuit 32, and a voltage generation circuit 33.

In the memory device 300, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signal BW, the signal CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 32.

The control circuit 32 is a logic circuit having a function of controlling the entire operation of the memory device 300. For example, the control circuit performs a logical operation on the signal CE, the signal GW, and the signal BW to determine an operation mode (e.g., a writing operation or a reading operation) of the memory device 300. Alternatively, the control circuit 32 generates a control signal for the peripheral circuit 41 so that the operation mode is executed.

The voltage generation circuit 33 has a function of generating a negative voltage. The signal WAKE has a function of controlling the input of the signal CLK to the voltage generation circuit 33. For example, when an H-level signal is supplied as the signal WAKE, the signal CLK is input to the voltage generation circuit 33, and the voltage generation circuit 33 generates a negative voltage.

The peripheral circuit 41 is a circuit for writing and reading data to/from the memory cells 10. Moreover, the peripheral circuit 41 is a circuit that outputs signals for controlling the functional circuits 51. The peripheral circuit 41 includes a row decoder 42, a column decoder 44, a row driver 43, a column driver 45, an input circuit 47 (Input Cir.), an output circuit 48 (Output Cir.), and the sense amplifier 46.

The row decoder 42 and the column decoder 44 have a function of decoding the signal ADDR. The row decoder 42 is a circuit for specifying a row to be accessed, and the column decoder 44 is a circuit for specifying a column to be accessed. The row driver 43 has a function of selecting the wiring WL specified by the row decoder 42. The column driver 45 has a function of writing data to the memory cells 10, a function of reading data from the memory cells 10, a function of retaining the read data, and the like.

The input circuit 47 has a function of retaining the signal WDA. Data retained by the input circuit 47 is output to the column driver 45. Data output from the input circuit 47 is data (Din) to be written to the memory cells 10. Data (Dout) read from the memory cells 10 by the column driver 45 is output to the output circuit 48. The output circuit 48 has a function of retaining Dout. In addition, the output circuit 48 has a function of outputting Dout to the outside of the memory device 300. Data output from the output circuit 48 is the signal RDA.

The PSW 22 has a function of controlling supply of VDD to the peripheral circuit 31. The PSW 23 has a function of controlling supply of VHM to the row driver 43. Here, in the memory device 300, a high power supply voltage is VDD and a low power supply voltage is GND (a ground potential). In addition, VHM is a high power supply voltage used to set the word line at high level and is higher than VDD. The on/off state of the PSW 22 is controlled by the signal PON1, and the on/off state of the PSW 23 is controlled by the signal PON2. The number of power domains to which VDD is supplied is one in the peripheral circuit 31 in FIG. 12 but can be more than one. In that case, a power switch is provided for each power domain.

In the memory array 20 including the memory arrays 20[1] to 20[m] (m is an integer greater than or equal to 2) and the functional layer 50, the memory arrays 20 can be provided in stacked layers over the driver circuit 21. Stacking the memory arrays 20 in the plurality of layers can increase the memory density of the memory cells 10. FIG. 13A is a perspective view of the memory device 300 that includes the functional layer 50 and five layers (m=5) of memory arrays 20[1] to 20[5], which overlap with each other, over the driver circuit 21.

In FIG. 13A, the memory array 20 in the first layer is denoted as the memory array 20[1], the memory array 20 in the second layer is denoted as the memory array 20[2], and the memory array 20 in the fifth layer is denoted as the memory array 20[5]. FIG. 13A also illustrates the wiring WL, the wiring CL, and the wiring PL provided to extend in the X direction and the wiring BL provided to extend in the Z direction (the direction perpendicular to the surface of the substrate provided with the driver circuit). For easy viewing of the drawing, some of the wirings WL and the wirings PL included in the memory arrays 20 are not illustrated.

FIG. 13B illustrates a schematic view for describing a structure example of the functional circuit 51, which is connected to the wiring BL, and the memory cells 10 included in the memory arrays 20[1] to 20[5], which are connected to the wiring BL, illustrated in FIG. 13A. FIG. 13B also illustrates the wiring GBL provided between the functional circuit 51 and the driver circuit 21. Note that a structure in which a plurality of memory cells (memory cells 10) are electrically connected to one wiring BL is also referred to as "memory string". In the drawings, the wiring GBL is sometimes represented by a bold line for increasing visibility.

FIG. 13B illustrates an example of a circuit configuration of the memory cell 10 connected to the wiring BL. The memory cell 10 includes a transistor 11 and a capacitor 12. As for the transistor 11, the capacitor 12, and the wirings (e.g., the wiring BL and the wiring WL), for example, the wiring BL[1] and the wiring WL[1] are referred to as the wiring BL and the wiring WL in some cases. Here, the transistor 11 corresponds to the transistor 200 described in Embodiment 1.

In the memory cell 10, one of a source and a drain of the transistor 11 is connected to the wiring BL. The other of the source and the drain of the transistor 11 is connected to one electrode of the capacitor 12. The other electrode of the capacitor 12 is connected to the wiring PL. A gate of the transistor 11 is connected to the wiring WL. A back gate of the transistor 11 is connected to the wiring CL.

The wiring PL is a wiring for supplying a constant potential for retaining the potential of the capacitor 12. The wiring CL has a constant potential for controlling the threshold voltage of the transistor 11. The wiring PL and the wiring CL may have the same potential. In that case, the number of wirings connected to the memory cell 10 can be reduced by connecting the two wirings.

The wiring GBL illustrated in FIG. 13B is provided to electrically connect the driver circuit 21 and the functional layer 50. FIG. 14A is a schematic view of the memory device 300 in which the functional circuit 51 and the memory arrays 20[1] to 20[m] are regarded as a repeating unit 70. Note that although FIG. 14A illustrates one of the wirings GBL, the wiring GBL is provided as appropriate depending on the number of functional circuits 51 provided in the functional layer 50.

Note that the wiring GBL is provided in contact with a semiconductor layer of a transistor included in the functional circuit 51. Alternatively, the wiring GBL is provided in contact with a region functioning as a source or a drain in the semiconductor layer of the transistor included in the functional circuit 51. Alternatively, the wiring GBL is provided in contact with a conductor provided in contact with the region functioning as the source or the drain in the semiconductor layer of the transistor included in the functional circuit 51. That is, the wiring GBL can be regarded as a wiring for electrically connecting the driver circuit 21 and one of the source and the drain of the transistor included in the functional circuit 51 in the functional layer 50 in the perpendicular direction.

The repeating unit 70 including the functional circuit 51 and the memory arrays 20[1] to 20[m] may have a stacked-layer structure. A memory device 300A of one embodiment of the present invention can include repeating units 70[1] to 70[p] (p is an integer greater than or equal to 2) as illustrated in FIG. 14B. The wiring GBL is connected to the functional layers 50 included in the repeating units 70. The wiring GBL is provided as appropriate depending on the number of functional circuits 51.

In one embodiment of the present invention, OS transistors are provided in stacked layers and a wiring functioning as a bit line is provided in the direction perpendicular to the surface of the substrate provided with the driver circuit 21. Since the wiring that is provided to extend from the memory array 20 and function as a bit line is provided in the direction perpendicular to the surface of the substrate, the length of the wiring between the memory array 20 and the driver circuit 21 can be shortened. Thus, the parasitic capacitance of the bit line can be significantly reduced.

In one embodiment of the present invention, the functional layer 50 including the functional circuit 51 having functions of amplifying and outputting a data potential retained in the memory cell 10 is provided in a layer where the memory array 20 is provided. With this structure, a slight difference in the potential of the wiring BL functioning as a bit line can be amplified at the time of data reading to drive the sense amplifier 46 included in the driver circuit 21. A circuit such as a sense amplifier can be downsized, so that the memory device 300 can be downsized. Moreover, even when the capacitance of the capacitors 12 included in the memory cells 10 is reduced, operation is possible.

Although an example in which the memory cell 10 has a 1T (transistor) 1C (capacitor) structure is described above, the present invention is not limited to this. For example, as illustrated in FIG. 18A, a 3T1C memory cell may be used for a memory device. The memory cell illustrated in FIG. 18A includes transistors 11*a*, 11*b*, and 11*c* and a capacitor 12*a*. Here, the transistors 11*a*, 11*b*, and 11*c* can have the same structure as the transistor 11, and the capacitor 12*a* can have the same structure as the capacitor 12. A RAM with such a configuration is sometimes referred to as a NOSRAM (registered trademark) (Nonvolatile Oxide Semiconductor RAM).

As illustrated in FIG. 18A, one of a source and a drain of the transistor 11*a* is electrically connected to one electrode of the capacitor 12*a* and a first gate of the transistor 11*b*. One of a source and a drain of the transistor 11*b* is electrically connected to one of a source and a drain of the transistor 11*c*. Note that wirings are provided as appropriate for a first gate, the other of the source and the drain, and a second gate of the transistor 11*a*; the other of the source and the drain and a second gate of the transistor 11*b*; a first gate, the other of the source and the drain, and a second gate of the transistor 11*c*; and the other electrode of the capacitor 12*a*. The structure of the memory device can be changed as appropriate depending on these wirings.

Alternatively, a 2T1C memory cell that includes only the transistors 11*a* and 11*b* and the capacitor 12*a* without including the transistor 11*c* as illustrated in FIG. 18B may be employed.

In the case where the parasitic capacitance of the transistor 11*a* and the transistor 11*b* is sufficiently large, the capacitor 12*a* may be omitted as illustrated in FIG. 18C. In that case, the memory cell is composed only of the transistor 11*a* and the transistor 11*b*.

[Configuration Examples of Memory Array 20 and Functional Circuit 51]

A configuration example of the functional circuit 51 and configuration examples of the memory array 20 and the sense amplifier 46 included in the driver circuit 21, which are described with reference to FIG. 12 to FIG. 14, will be described with reference to FIG. 15. FIG. 15 illustrates the driver circuit 21 connected to the wirings GBL (a wiring GBL_A and a wiring GBL_B) connected to the functional circuits 51 (a functional circuit 51_A and a functional circuit 51_B) connected to the memory cells 10 (a memory cell 10_A and a memory cell 10_B) connected to different wirings BL (a wiring BL_A and a wiring BL_B). FIG. 15 also illustrates, as the driver circuit 21, a precharge circuit 71_A, a precharge circuit 71_B, a switch circuit 72_A, a switch circuit 72_B, and a write/read circuit 73 in addition to the sense amplifier 46.

As the functional circuits 51_A and 51_B, transistors 52_*a*, 52_*b*, 53_*a*, 53_*b*, 54_*a*, 54_*b*, 55_*a*, and 55_*b* are illustrated. The transistors 52_*a*, 52_*b*, 53_*a*, 53_*b*, 54_*a*, 54_*b*, 55_*a*, and 55_*b* illustrated in FIG. 15 are OS transistors like the transistor 11 included in the memory cell 10. The functional layer 50 including the functional circuits 51 can be provided in stacked layers like the memory arrays 20[1] to 20[m].

The wiring BL_A is connected to a gate of the transistor 52_*a*, and the wiring BL_B is connected to a gate of the transistor 52_*b*. One of a source and a drain of each of the transistors 53_*a* and 54_*a* is connected to the wiring GBL_A. One of a source and a drain of each of the transistors 53_*b* and 54_*b* is connected to the wiring GBL_B. The wirings GBL_A and GBL_B are provided in the perpendicular direction like the wirings BL_A and BL_B and connected to transistors included in the driver circuit 21. As illustrated in FIG. 15, a selection signal MUX, a control signal WE, or a control signal RE is supplied to gates of the transistors 53_*a*, 53_*b*, 54_*a*, 54_*b*, 55_*a*, and 55_*b*.

Transistors 81_1 to 81_6 and 82_1 to 82_4 included in the sense amplifier 46, the precharge circuit 71_A, and the precharge circuit 71_B illustrated in FIG. 15 are Si transistors. Switches 83_A to 83_D included in the switch circuit 72_A and the switch circuit 72_B can also be Si transistors. The one of the source and the drain of each of the transistors 53_*a*, 53_*b*, 54_*a*, and 54_*b* is connected to the transistor or switch included in the precharge circuit 71_A, the precharge circuit 71_B, the sense amplifier 46, or the switch circuit 72_A.

The precharge circuit 71_A includes the n-channel transistors 81_1 to 81_3. The precharge circuit 71_A is a circuit for precharging the wiring BL_A and the wiring BL_B with an intermediate potential VPC corresponding to a potential VDD/2 between a high power supply potential (VDD) and a low power supply potential (VSS) in accordance with a precharge signal supplied to a precharge line PCL1.

The precharge circuit 71_B includes the n-channel transistors 81_4 to 81_6. The precharge circuit 71_B is a circuit for precharging the wiring GBL_A and the wiring GBL_B with the intermediate potential VPC corresponding to the potential VDD/2 between VDD and VSS in accordance with a precharge signal supplied to a precharge line PCL2.

The sense amplifier 46 includes the p-channel transistors 82_1 and 82_2 and the n-channel transistors 82_3 and 82_4, which are connected to a wiring VHH or a wiring VLL. The wiring VHH or the wiring VLL is a wiring having a function of supplying VDD or VSS. The transistors 82_1 to 82_4 are transistors that form an inverter loop. The potentials of the wiring BL_A and the wiring BL_B precharged by selecting the memory cells 10_A and 10_B are changed, and the potentials of the wiring GBL_A and the wiring GBL_B are set to VDD or VSS in accordance with the changes. The potentials of the wiring GBL_A and the wiring GBL_B can be output to the outside through the switch 83_C, the switch 83_D, and the write/read circuit 73. The wiring BL_A and the wiring BL_B correspond to a bit line pair, and the wiring GBL_A and the wiring GBL_B correspond to a bit line pair. Data signal writing of the write/read circuit 73 is controlled in accordance with a signal EN_data.

The switch circuit 72_A is a circuit for controlling electrical continuity between the sense amplifier 46 and each of the wiring GBL_A and the wiring GBL_B. The on and off states of the switch circuit 72_A are switched under the control of a switch signal CSEL1. In the case where the switches 83_A and 83_B are n-channel transistors, the switches 83_A and 83_B are turned on and off when the switch signal CSEL1 is at high level and low level, respectively. The switch circuit 72_B is a circuit for controlling electrical continuity between the write/read circuit 73 and the bit line pair connected to the sense amplifier 46. The on and off states of the switch circuit 72_B are switched under the control of a switching signal CSEL2. The switches 83_C and 83_D are similar to the switches 83_A and 83_B.

As illustrated in FIG. 15, the memory device 300 can have a configuration where the memory cell 10, the functional circuit 51, and the sense amplifier 46 are connected to each other through the wiring BL and the wiring GBL provided in the perpendicular direction, which is the shortest distance. Even with addition of the functional layer 50 including transistors included in the functional circuits 51, the loads of the wirings BL are reduced, whereby the writing time can be shortened and data reading can be facilitated.

As illustrated in FIG. 15, the transistors included in the functional circuits 51_A and 51_B are controlled in accordance with the control signals WE and RE and the selection signal MUX. The transistors can output the potential of the wiring BL through the wiring GBL to the driver circuit 21 in accordance with the control signals and the selection signal. The functional circuits 51_A and 51_B can each function as a sense amplifier that consists of OS transistors. With this structure, a slight difference in the potential of the wiring BL can be amplified at the time of reading to drive the sense amplifier 46 formed using Si transistors.

<Structure Example of Memory Cell>

A structure example of the memory cell 10 used in the above-described memory device will be described with reference to FIG. 16.

Note that in FIG. 16, the X direction is parallel to the channel width direction of an illustrated transistor, the Y direction is perpendicular to the X direction, and the Z direction is perpendicular to the X direction and the Y direction.

As illustrated in FIG. 16, the memory cell 10 includes the transistor 11 and the capacitor 12. An insulator 285 is provided over the transistor 11, and an insulator 284 is provided over the insulator 285. An insulator that can be used for the insulator 216 can be used for the insulator 285 and the insulator 284. Note that the transistor 11 has the same structure as the transistor 200 described in the above embodiment, and the same components are denoted by the same reference numerals. The above embodiment can be referred to for the details of the transistor 200. A conductor 240 is provided in contact with one of the source and the drain of the transistor 11 (the conductor 242*a*). The conductor 240 is provided to extend in the Z direction and functions as the wiring BL.

The capacitor 12 includes a conductor 153 over the conductor 242*b*, an insulator 154 over the conductor 153, and a conductor 160 (a conductor 160*a* and a conductor 160*b*) over the insulator 154.

At least parts of the conductor 153, the insulator 154, and the conductor 160 are positioned in an opening provided in the insulator 271*b*, the insulator 275, the insulator 280, the insulator 282, the insulator 283, and the insulator 285. End portions of the conductor 153, the insulator 154, and the conductor 160 are positioned at least over the insulator 282, and preferably positioned over the insulator 285. The insulator 154 is provided to cover the end portion of the conductor 153. This enables the conductor 153 and the conductor 160 to be electrically insulated from each other.

The deeper the opening provided in the insulator 271*b*, the insulator 275, the insulator 280, the insulator 282, the insulator 283, and the insulator 285 is (i.e., the larger the thickness of one or more of the insulator 271*b*, the insulator 275, the insulator 280, the insulator 282, the insulator 283, and the insulator 285 is), the larger the electrostatic capacitance of the capacitor 12 can be. Increasing the electrostatic capacitance per unit area of the capacitor 12 can achieve miniaturization or higher integration of the semiconductor device.

The conductor 153 includes a region functioning as one electrode (a lower electrode) of the capacitor 12. The insulator 154 includes a region functioning as a dielectric of the capacitor 12. The conductor 160 includes a region functioning as the other electrode (an upper electrode) of the capacitor 12. The capacitor 12 forms a MIM (Metal-Insulator-Metal) capacitor.

The conductor 242*b* provided over the oxide 230 to overlap with the oxide 230 functions as a wiring electrically connected to the conductor 153 of the capacitor 12.

Each of the conductor 153 and the conductor 160 included in the capacitor 12 can be formed using any of a variety of conductors that can be used for the conductor 205, the conductor 242, and the conductor 260. The conductor 153 and the conductor 160 are each preferably deposited by a deposition method that offers excellent coverage, such as an ALD method or a CVD method. For example, titanium nitride or tantalum nitride deposited by an ALD method or a CVD method can be used for the conductor 153.

The top surface of the conductor 242*b* is in contact with the bottom surface of the conductor 153. Here, the use of a conductive material with favorable conductivity for the conductor 242*b* can reduce the contact resistance between the conductor 153 and the conductor 242*b*.

Titanium nitride deposited by an ALD method or a CVD method can be used for the conductor 160*a*, and tungsten deposited by a CVD method can be used for the conductor 160*b*. Note that in the case where the adhesion of tungsten to the insulator 154 is sufficiently high, a single-layer structure of tungsten deposited by a CVD method may be used for the conductor 160.

For the insulator 154 included in the capacitor 12, a high dielectric constant (high-k) material (a material with a high relative permittivity) is preferably used. The insulator 154 is preferably deposited by a deposition method that offers excellent coverage, such as an ALD method or a CVD method.

Examples of insulators of the high dielectric constant (high-k) material include an oxide, an oxynitride, a nitride oxide, and a nitride containing one or more kinds of metal elements selected from aluminum, hafnium, zirconium, gallium, and the like. In addition, the oxide, the oxynitride, the nitride oxide, or the nitride may contain silicon. Stacked insulators formed of any of the above materials can also be used.

Examples of the insulators of the high dielectric constant (high-k) material include aluminum oxide, hafnium oxide, zirconium oxide, an oxide containing aluminum and hafnium, an oxynitride containing aluminum and hafnium, an oxide containing silicon and hafnium, an oxynitride containing silicon and hafnium, an oxide containing silicon and zirconium, an oxynitride containing silicon and zirconium, an oxide containing hafnium and zirconium, and an oxynitride containing hafnium and zirconium. Using such a high-k material allows the insulator 154 to be thick enough to inhibit a leakage current and the capacitor 12 to have a sufficiently large capacitance.

It is preferable to use stacked insulators formed of any of the above materials, and it is preferable to use a stacked-layer structure of a high dielectric constant (high-k) material and a material having higher dielectric strength than the high dielectric constant (high-k) material. For the insulator 154, an insulator in which zirconium oxide, aluminum oxide, and zirconium oxide are stacked in this order can be used, for example. As another example, an insulator in which zirconium oxide, aluminum oxide, zirconium oxide, and aluminum oxide are stacked in this order can be used. As another example, an insulating film in which hafnium zirconium oxide, aluminum oxide, hafnium zirconium oxide, and aluminum oxide are stacked in this order can be used. The stacking of such an insulator having relatively high dielectric strength, such as aluminum oxide, can increase the dielectric strength and inhibit electrostatic breakdown of the capacitor 12.

The deeper the opening provided in the insulator 271*b*, the insulator 275, the insulator 280, the insulator 282, the insulator 283, and the insulator 285 is (i.e., the larger the thickness of one or more of the insulator 271*b*, the insulator 275, the insulator 280, the insulator 282, the insulator 283, and the insulator 285 is), the larger the electrostatic capacitance of the capacitor 12 can be. Here, since the insulator 271*b*, the insulator 275, the insulator 282, and the insulator 283 function as barrier insulators, their thicknesses are preferably set in accordance with a barrier property required for the semiconductor device. The thickness of the conductor 260 functioning as a gate electrode depends on the thickness of the insulator 280; thus, the thickness of the insulator 280 is preferably set in accordance with the thickness of the conductor 260 required for the semiconductor device.

Accordingly, the electrostatic capacitance of the capacitor 12 is preferably set by adjusting the thickness of the insulator 285. For example, the thickness of the insulator 285 is set within the range from 50 nm to 250 nm inclusive, and the depth of the opening is approximately greater than or equal to 150 nm and less than or equal to 350 nm. When the capacitor 12 is formed within the above range, the capacitor 12 can have adequate electrostatic capacitance, and the height of one layer can be prevented from being excessively large in a semiconductor device in which a plurality of memory cell layers are stacked. Note that capacitors provided in memory cells may have different electrostatic capacitances between the plurality of memory cell layers. In this structure, the thicknesses of the insulators 285 provided in the memory cell layers vary, for example.

Note that the sidewall of an opening portion in which the capacitor 12 is positioned and which is provided in the insulator 285 and the like may be substantially perpendicular to the top surface of the insulator 222 or may be tapered. The tapered shape of the sidewall can improve the coverage with the conductor 153 and the like provided in the opening portion in the insulator 285 and the like; as a result, defects such as voids can be reduced.

The conductor 242*a* provided over the oxide 230 to overlap with the oxide 230 functions as a wiring electrically connected to the conductor 240. In FIG. 16, for example, the top surface and a side end portion of the conductor 242*a* are electrically connected to the conductor 240 extending in the Z direction.

When the conductor 240 is in direct contact with at least one of the top surface and the side end portion of the conductor 242*a*, an electrode for connection does not need to be provided additionally, so that the area occupied by the memory arrays can be reduced. In addition, the integration degree of the memory cells is increased, and the memory capacity of the memory device can be increased. Note that the conductor 240 is preferably in contact with the side end portion and part of the top surface of the conductor 242*a*. When the conductor 240 is in contact with a plurality of surfaces of the conductor 242*a*, the contact resistance between the conductor 240 and the conductor 242*a* can be reduced.

The conductor 240 is provided in an opening formed in the insulator 216, the insulator 222, the insulator 275, the insulator 280, the insulator 282, the insulator 283, the insulator 285, and the insulator 284.

The conductor 240 preferably has a stacked-layer structure of the conductor 240*a* and the conductor 240*b*. For example, as illustrated in FIG. 16, the conductor 240 can have a structure in which the conductor 240*a* is provided in contact with the inner wall of the opening portion and the conductor 240*b* is provided on the inner side. That is, the conductor 240*a* is positioned closer to the insulator 216, the insulator 222, the insulator 275, the insulator 280, the insulator 282, the insulator 283, the insulator 285, and the insulator 284 than the conductor 240*b* is. The conductor 240*a* is in contact with the top surface and the side end portion of the conductor 242*a*.

A conductive material having a function of inhibiting passage of impurities such as water and hydrogen is preferably used for the conductor 240*a*. The conductor 240*a* can have a single-layer structure or a stacked-layer structure including one or more of tantalum, tantalum nitride, titanium, titanium nitride, ruthenium, and ruthenium oxide, for example. Thus, impurities such as water and hydrogen can be inhibited from entering the oxide 230 through the conductor 240.

The conductor 240 also functions as a wiring and thus is preferably formed using a conductor having high conductivity. For example, a conductive material containing tungsten, copper, or aluminum as its main component can be used for the conductor 240*b*.

For example, it is preferable to use titanium nitride for the conductor 240*a* and tungsten for the conductor 240*b*. In that case, the conductor 240*a* is a conductor that contains titanium and nitrogen, and the conductor 240*b* is a conductor that contains tungsten.

Note that the conductor 240 may have a single-layer structure or a stacked-layer structure of three or more layers.

As illustrated in FIG. 16, an insulator 241 is preferably provided in contact with a side surface of the conductor 240. Specifically, the insulator 241 is provided in contact with the inner wall of an opening in the insulator 216, the insulator 222, the insulator 275, the insulator 280, the insulator 282, the insulator 283, the insulator 285, and the insulator 284. The insulator 241 is formed also on side surfaces of the insulator 224, the oxide 230, and the conductor 242*a* that are formed to protrude in the opening. Here, at least part of the conductor 242*a* is exposed from the insulator 241 and is in contact with the conductor 240. That is, the conductor 240 is provided to fill the opening with the insulator 241 therebetween.

As illustrated in FIG. 16, the uppermost portion of the insulator 241 formed below the conductor 242*a* is preferably positioned below the top surface of the conductor 242*a*. With this structure, the conductor 240 can be in contact with at least part of the side end portion of the conductor 242*a*. Note that the insulator 241 formed below the conductor 242*a* preferably includes a region in contact with a side surface of the oxide 230. With this structure, impurities such as water and hydrogen contained in the insulator 280 and the like can be inhibited from entering the oxide 230 through the conductor 240.

For the insulator 241, a barrier insulating film that can be used for the insulator 275 or the like is used. For the insulator 241, an insulator such as silicon nitride, aluminum oxide, or silicon nitride oxide is used, for example. With this structure, impurities such as water and hydrogen contained in the insulator 280 and the like can be inhibited from entering the oxide 230 through the conductor 240. In particular, silicon nitride is suitable because of its high blocking property against hydrogen. Furthermore, oxygen contained in the insulator 280 can be inhibited from being absorbed by the conductor 240.

Note that although the insulator 241 has a single-layer structure in FIG. 16, the present invention is not limited thereto. The insulator 241 may have a stacked-layer structure of two or more layers.

In the case where the insulator 241 has a two-layer stacked structure, a barrier insulating film against oxygen is used for a first layer in contact with the inner wall of the opening in the insulator 280 and the like, and a barrier insulating film against hydrogen is used for a second layer positioned inward from the first layer. For example, aluminum oxide deposited by an ALD method is used for the first layer, and silicon nitride deposited by a PEALD method is used for the second layer. With this structure, oxidation of the conductor 240 can be inhibited, and hydrogen can be inhibited from entering the oxide 230 and the like from the conductor 240. Thus, the transistor 11 can have improved electrical characteristics and reliability.

Note that the sidewall of the opening portion in which the conductor 240 and the insulator 241 are positioned may be substantially perpendicular to the top surface of the insulator 222 or may be tapered. The tapered sidewall can improve the coverage with the insulator 241 and the like provided in the opening portion.

<Structure Example of Memory Device 300>

A structure example of the memory device 300 will be described with reference to FIG. 17.

The memory device 300 includes the driver circuit 21 that is a layer including a transistor 310 and the like, the functional layer 50 that is over the driver circuit 21 and is a layer including transistors 52, 53, 54, 55, and the like, and the memory arrays 20[1] to 20[m] over the functional layer 50 (only the memory arrays 20[1] and 20[2] are illustrated in FIG. 17). Note that the transistor 52 corresponds to the transistors 52_*a* and 52_*b*, the transistor 53 corresponds to the transistors 53_*a* and 53_*b*, the transistor 54 corresponds to the transistors 54_*a* and 54_*b*, and the transistor 55 corresponds to the transistors 55_*a* and 55_*b*.

FIG. 17 illustrates the transistor 310 included in the driver circuit 21 as an example. The transistor 310 is provided on a substrate 311 and includes a conductor 316 functioning as a gate, an insulator 315 functioning as a gate insulator, a semiconductor region 313 including part of the substrate 311, and a low-resistance region 314*a* and a low-resistance region 314*b* functioning as a source region and a drain region. The transistor 310 can be a p-channel transistor or an n-channel transistor. As the substrate 311, a single crystal silicon substrate can be used, for example.

Here, in the transistor 310 illustrated in FIG. 17, the semiconductor region 313 (part of the substrate 311) in which a channel is formed has a protruding shape. The conductor 316 is provided to cover a side surface and the top surface of the semiconductor region 313 with the insulator 315 therebetween. Note that a material for adjusting the work function may be used as the conductor 316. Such a transistor 310 is also referred to as a FIN-type transistor because it utilizes a protruding portion of a semiconductor substrate. Note that an insulator functioning as a mask for forming the protruding portion may be included in contact with an upper portion of the protruding portion. Although the case where the protruding portion is formed by processing part of the semiconductor substrate is described here, a semiconductor film having a protruding shape may be formed by processing an SOI (Silicon on Insulator) substrate.

Note that the transistor 310 illustrated in FIG. 17 is an example and the structure is not limited thereto; an appropriate transistor can be used in accordance with a circuit configuration or a driving method.

A wiring layer provided with an interlayer film, a wiring, a plug, and the like may be provided between the components. A plurality of wiring layers can be provided in accordance with design. Furthermore, in this specification and the like, a wiring and a plug electrically connected to the wiring may be a single component. That is, part of a conductor functions as a wiring in some cases and part of the conductor functions as a plug in other cases.

For example, an insulator 320, an insulator 322, an insulator 324, and an insulator 326 are sequentially stacked over the transistor 310 as interlayer films. A conductor 328 and the like are embedded in the insulator 320 and the insulator 322. A conductor 330 and the like are embedded in the insulator 324 and the insulator 326. Note that the conductor 328 and the conductor 330 function as a contact plug or a wiring.

The insulator functioning as the interlayer film may also function as a planarization film that covers an uneven shape thereunder. For example, the top surface of the insulator 322 may be planarized by planarization treatment using a chemical mechanical polishing (CMP) method or the like to have improved planarity.

FIG. 17 illustrates the transistors 52, 53, and 55 included in the functional layer 50 as an example. Each of the transistors 52, 53, and 55 has the same structure as the transistor 11 included in the memory cell 10. Sources and drains of the transistors 52, 53, and 55 are connected in series.

An insulator 208 is provided over the transistors 52, 53, and 55, and a conductor 207 is provided in an opening formed in the insulator 208. Furthermore, an insulator 210 is provided over the insulator 208, and a conductor 209 is provided in an opening formed in the insulator 210. Moreover, an insulator 212 is provided over the insulator 210, and the insulator 214 is provided over the insulator 212. Part of the conductor 240 provided in the memory array 20[1] is embedded in an opening formed in the insulator 212 and the insulator 214. Here, for the insulator 208 and the insulator 210, an insulator that can be used for the insulator 216 can be used. For the insulator 212, an insulator that can be used for the insulator 283 can be used. For the insulator 214, an insulator that can be used for the insulator 282 can be used.

The bottom surface of the conductor 207 is provided in contact with the top surface of the conductor 260 of the transistor 52. The top surface of the conductor 207 is provided in contact with the bottom surface of the conductor 209. The top surface of the conductor 209 is provided in contact with the bottom surface of the conductor 240 provided in the memory array 20[1]. With such a structure, the conductor 240 corresponding to the wiring BL and a gate of the transistor 52 can be electrically connected to each other.

Each of the memory arrays 20[1] to 20[m] includes a plurality of the memory cells 10. The conductor 240 included in each memory cell 10 is electrically connected to the conductor 240 in an upper layer and the conductor 240 in a lower layer.

As illustrated in FIG. 17, the conductor 240 is shared between the adjacent memory cells 10. In the adjacent memory cells 10, the components in the right memory cell and the components in the left memory cell are arranged symmetrically about the conductor 240.

Here, the conductor 160 that functions as the upper electrode of the capacitor 12 in a lower layer (e.g., the layer of the memory array 20[1]) and a conductor 261 that functions as the second gate electrode of the transistor 11 in an upper layer (e.g., the layer of the memory array 20[2]) can be formed in the same layer. In other words, the conductor 160 of the capacitor 12 in the lower layer and the conductor 261 of the transistor 11 in the upper layer can be formed to be embedded in respective openings formed in the same insulator 216. The above-described structure is obtained by forming the conductor 160 of the capacitor 12 in the lower layer and the conductor 261 of the transistor 11 in the upper layer by processing one conductive film. At this time, the conductor 160 of the capacitor 12 in the lower layer includes the same material as the conductor 261 of the transistor 11 in the upper layer.

The conductor 160 of the capacitor 12 in the lower layer and the conductor 261 of the transistor 11 in the upper layer are formed at the same time in the above manner, whereby the number of steps for manufacturing the memory device of this embodiment can be reduced and the productivity of the memory device can be increased.

In the above-described memory array 20, the plurality of memory arrays 20[1] to 20[m] can be provided in stacked layers. When the memory arrays 20[1] to 20[m] included in the memory array 20 are provided in the direction perpendicular to the surface of the substrate provided with the driver circuit 21, the memory density of the memory cells 10 can be increased. Moreover, the memory array 20 can be formed by repeating the same manufacturing process in the perpendicular direction. The manufacturing cost of the memory array 20 in the memory device 300 can be reduced.

This embodiment can be combined with any of the other embodiments and examples as appropriate.

Embodiment 3

In this embodiment, an example of a chip on which the memory device of one embodiment of the present invention is mounted will be described with reference to FIG. 19.

A plurality of circuits (systems) are mounted on a chip 1200 illustrated in FIG. 19A and FIG. 19B. A technique for integrating a plurality of circuits (systems) into one chip is referred to as system on chip (SoC) in some cases.

As illustrated in FIG. 19A, the chip 1200 includes a CPU 1211, a GPU 1212, one or more of analog arithmetic units 1213, one or more of memory controllers 1214, one or more of interfaces 1215, one or more of network circuits 1216, and the like.

The chip 1200 is provided with bumps (not illustrated) and is connected to a first surface of a package substrate 1201 as illustrated in FIG. 19B. A plurality of bumps 1202 are provided on a rear side of the first surface of the package substrate 1201, and the package substrate 1201 is connected to a motherboard 1203.

Memory devices such as a DRAM 1221 and a flash memory 1222 may be provided over the motherboard 1203. For example, the DOSRAM described in the above embodiment can be used as the DRAM 1221. This can make the DRAM 1221 have low power consumption, operate at high speed, and have a large capacity.

The CPU 1211 preferably includes a plurality of CPU cores. The GPU 1212 preferably includes a plurality of GPU cores. The CPU 1211 and the GPU 1212 may each include a memory for temporarily storing data. Alternatively, a common memory for the CPU 1211 and the GPU 1212 may be provided in the chip 1200. The DOSRAM described above can be used as the memory. Moreover, the GPU 1212 is suitable for parallel computation of a number of data and thus can be used for image processing or product-sum operation. When an image processing circuit or a product-sum operation circuit using the OS transistor described in the above embodiment is provided in the GPU 1212, image processing or product-sum operation can be performed with low power consumption.

Since the CPU 1211 and the GPU 1212 are provided in the same chip, a wiring between the CPU 1211 and the GPU 1212 can be shortened; accordingly, data transfer from the CPU 1211 to the GPU 1212, data transfer between memories included in the CPU 1211 and the GPU 1212, and transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit for a LAN (Local Area Network) or the like. The network circuit 1216 may also include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the package substrate 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

This embodiment can be combined with any of the other embodiments and examples as appropriate.

Embodiment 4

In this embodiment, examples of electronic components incorporating the memory device of one embodiment of the present invention will be described.

[Electronic Components]

FIG. 20A is a perspective view of an electronic component 700 and a substrate (circuit board 704) on which the electronic component 700 is mounted. The electronic component 700 illustrated in FIG. 20A includes the memory device 300, which is the memory device of one embodiment of the present invention, in a mold 711. FIG. 20A omits some components to show the inside of the electronic component 700. The electronic component 700 includes a land 712 outside the mold 711. The land 712 is electrically connected to an electrode pad 713, and the electrode pad 713 is electrically connected to the memory device 300 via a wire 714. The electronic component 700 is mounted on a printed circuit board 702, for example. A plurality of such electronic components are combined and electrically connected to each other on the printed circuit board 702, so that the circuit board 704 is completed.

As described in the above embodiment, the memory device 300 includes the driver circuit 21 and the memory array 20.

FIG. 20B is a perspective view of an electronic component 730. The electronic component 730 is an example of a SiP (System in package) or an MCM (Multi Chip Module). In the electronic component 730, an interposer 731 is provided over a package substrate 732 (a printed circuit board) and a semiconductor device 735 and a plurality of memory devices 300 are provided over the interposer 731.

An integrated circuit (a semiconductor device) such as a CPU, a GPU, or an FPGA can be used as the semiconductor device 735. When the OS transistor described in the above embodiment is used in the integrated circuit such as a CPU, a GPU, or an FPGA, power consumption can be reduced.

As the package substrate 732, a ceramic substrate, a plastic substrate, or a glass epoxy substrate can be used, for example. As the interposer 731, a silicon interposer or a resin interposer can be used, for example.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided over the interposer 731 to an electrode provided over the package substrate 732. Accordingly, the interposer is sometimes referred to as a "redistribution substrate" or an "intermediate substrate". A through electrode may be provided in the interposer 731 to be used for electrically connecting the integrated circuit and the package substrate 732. In a silicon interposer, a TSV (Through Silicon Via) can also be used as the through electrode.

A silicon interposer is preferably used as the interposer 731. The silicon interposer can be manufactured at lower cost than an integrated circuit because it is not necessary to provide an active element. Moreover, since wirings of a silicon interposer can be formed through a semiconductor process, formation of minute wirings, which is difficult for a resin interposer, is easily achieved.

The memory device 300 needs to be connected to many wirings to achieve a wide memory bandwidth. Therefore, an interposer on which the memory device 300 is mounted requires minute and densely formed wirings. For this reason, a silicon interposer is preferably used as the interposer on which the memory device 300 is mounted.

In a SiP, an MCM, or the like using a silicon interposer, a decrease in reliability due to a difference in expansion coefficient between an integrated circuit and the interposer is less likely to occur. Furthermore, a surface of a silicon interposer has high planarity, so that poor connection between the silicon interposer and an integrated circuit provided over the silicon interposer is less likely to occur. It is particularly preferable to use a silicon interposer for a 2.5D package (2.5-dimensional mounting) in which a plurality of integrated circuits are arranged side by side over the interposer.

A heat sink (radiator plate) may be provided to overlap with the electronic component 730. In the case of providing a heat sink, the heights of integrated circuits provided over the interposer 731 are preferably the same. For example, in the electronic component 730 of this embodiment, the heights of the memory device 300 and the semiconductor device 735 are preferably equal to each other.

An electrode 733 may be provided on the bottom portion of the package substrate 732 to mount the electronic component 730 on another substrate. FIG. 20B illustrates an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. Examples of a mounting method include SPGA (Staggered Pin Grid Array), LGA (Land Grid Array), QFP (Quad Flat Package), QFJ (Quad Flat J-leaded package), and QFN (Quad Flat Non-leaded package).

This embodiment can be combined with any of the other embodiments and examples as appropriate.

Embodiment 5

In this embodiment, application examples of the memory device of one embodiment of the present invention will be described.

The memory device of one embodiment of the present invention can be used as memory devices of a variety of electronic devices (e.g., information terminals, computers, smartphones, e-book readers, digital still cameras, video cameras, video recording/reproducing devices, navigation systems, and game machines). In addition, the memory device can also be used for image sensors, IoT (Internet of Things), healthcare-related devices, and the like. This enables electronic devices to achieve low power consumption. When the OS transistor described in the above embodiment is used in an integrated circuit such as a CPU or a GPU of the electronic devices, power consumption can be further reduced. Note that here, computers refer not only to tablet computers, laptop computers, and desktop computers, but also to large computers such as server systems.

Examples of electronic devices including the memory device of one embodiment of the present invention will be described. Note that FIG. 21A to FIG. 21J and FIG. 22A to FIG. 22E each illustrate a state where the electronic component 700 or the electronic component 730, which is described in the above embodiment and includes the memory device, is included in an electronic device.

[Mobile Phone]

Figure 21A:
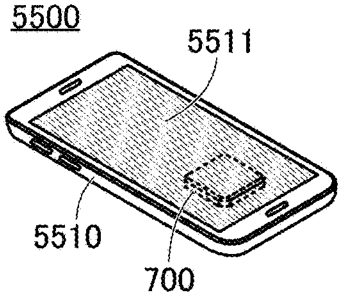

An information terminal 5500 illustrated in FIG. 21A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the memory device of one embodiment of the present invention, the information terminal 5500 can retain a temporary file generated at the time of executing an application (e.g., a web browser's cache or the like).

[Wearable Terminal]

Figure 21B:
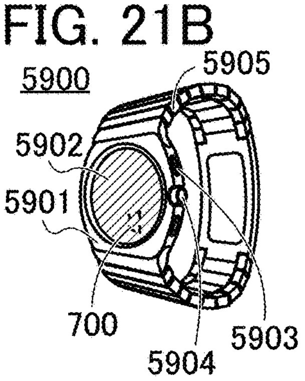

FIG. 21B illustrates an information terminal 5900 as an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application by using the memory device of one embodiment of the present invention.

[Information Terminal]

Figure 21C:
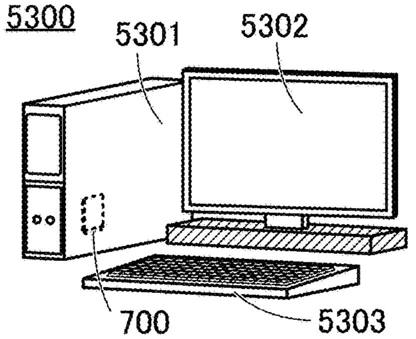

FIG. 21C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application by using the memory device of one embodiment of the present invention.

FIG. 21A to FIG. 21C illustrate the smartphone, the wearable terminal, and the desktop information terminal as electronic devices, and other examples of information terminals include a PDA (Personal Digital Assistant), a laptop information terminal, and a workstation.

[Household Appliance]

Figure 21D:
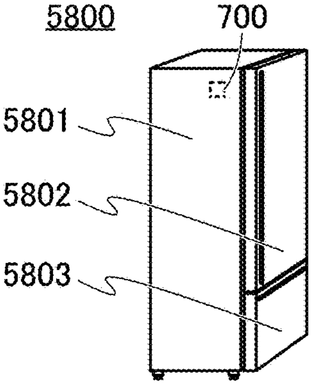

FIG. 21D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The memory device of one embodiment of the present invention can be used in the electric refrigerator-freezer 5800. The electric refrigerator-freezer 5800 can transmit and receive information on food stored in the electric refrigerator-freezer 5800 and food expiration dates, for example, to and from an information terminal or the like via the Internet or the like. In the electric refrigerator-freezer 5800, the memory device of one embodiment of the present invention can retain a temporary file generated at the time of transmitting the information.

FIG. 21D illustrates the electric refrigerator-freezer as a household appliance, and other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machines]

Figure 21E:
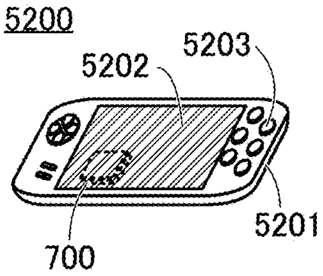

FIG. 21E illustrates a portable game machine 5200 as an example of a game machine. The portable game machine 5200 includes a housing 5201, a display portion 5202, a button 5203, and the like.

Figure 21F:
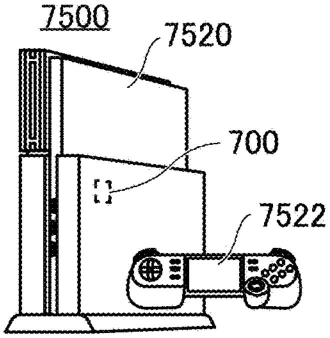

FIG. 21F illustrates a stationary game machine 7500 as an example of a game machine. The stationary game machine 7500 can be especially referred to as a home-use stationary game machine. The stationary game machine 7500 includes a main body 7520 and a controller 7522. Note that the controller 7522 can be connected to the main body 7520 with or without a wire. Although not illustrated in FIG. 21F, the controller 7522 can include a display portion that displays a game image, and an input interface besides a button, such as a touch panel, a stick, a rotating knob, or a sliding knob. The shape of the controller 7522 is not limited to that illustrated in FIG. 21F, and can be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include one or more of a camera, a depth sensor, and a microphone so that the game player can play a game using a gesture or a voice instead of a controller.

In addition, videos displayed on the game machine can be output with a display device such as a television device, a personal computer display, a game display, or a head-mounted display.

By using the memory device of one embodiment of the present invention, the portable game machine 5200 or the stationary game machine 7500 can achieve low power consumption. Moreover, heat generation from a circuit can be reduced owing to low power consumption; thus, the influence of heat generation on the circuit itself, a peripheral circuit, and a module can be reduced.

Moreover, by using the memory device of one embodiment of the present invention, the portable game machine 5200 or the stationary game machine 7500 can retain a temporary file necessary for arithmetic operation that occurs during game play.

FIG. 21E and FIG. 21F illustrate the portable game machine and the home-use stationary game machine as examples of game machines; other examples of game machines include an arcade game machine installed in an entertainment facility (e.g., a game center and an amusement park) and a throwing machine for batting practice, installed in sports facilities.

[Moving Vehicle]

The memory device of one embodiment of the present invention can be used in an automobile, which is a moving vehicle, and the periphery of a driver's seat in the automobile.

Figure 21G:
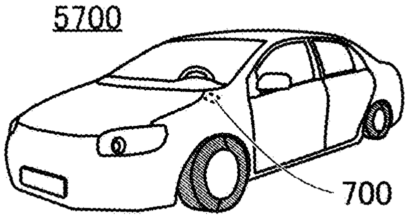

FIG. 21G illustrates an automobile 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the automobile 5700. In addition, a memory device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety. That is, displaying an image taken by the imaging device provided on the exterior of the automobile 5700 can compensate for blind areas and improve safety.

The memory device of one embodiment of the present invention can temporarily retain information; thus, the memory device can be used to retain temporary information necessary in a system conducting automatic driving, navigation, and risk prediction for the automobile 5700, for example. The display device may be configured to display temporary information regarding navigation, risk prediction, or the like. Moreover, the memory device may be configured to retain a video of a driving recorder provided in the automobile 5700.

Although the automobile is described above as an example of a moving vehicle, the moving vehicle is not limited to the automobile. Examples of the moving vehicle include a train, a monorail train, a ship, and a flying object (a helicopter, an unmanned aircraft (drone), an airplane, and a rocket).

[Camera]

The memory device of one embodiment of the present invention can be used in a camera.

Figure 21H:
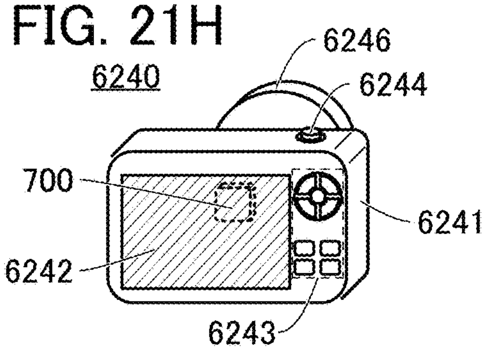

FIG. 21H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Note that the digital camera 6240 is configured here such that the lens 6246 is detachable from the housing 6241 for replacement; alternatively, the lens 6246 may be integrated with the housing 6241. In addition, the digital camera 6240 may be configured to be additionally equipped with a stroboscope, a viewfinder, or the like.

By using the memory device of one embodiment of the present invention, the digital camera 6240 can have low power consumption. Moreover, heat generation from a circuit can be reduced owing to low power consumption; thus, the influence of heat generation on the circuit itself, a peripheral circuit, and a module can be reduced.

[Video Camera]

The memory device of one embodiment of the present invention can be used in a video camera.

Figure 21I:
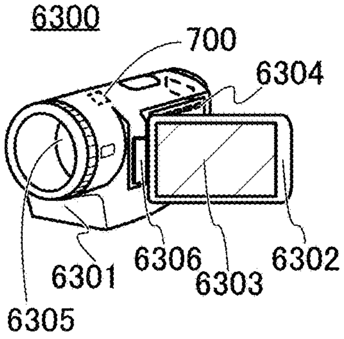

FIG. 21I illustrates a video camera 6300 as an example of an imaging device. The video camera 6300 includes a first housing 6301, a second housing 6302, a display portion 6303, operation switches 6304, a lens 6305, a connection portion 6306, and the like. The operation switch 6304 and the lens 6305 are provided in the first housing 6301, and the display portion 6303 is provided in the second housing 6302. The first housing 6301 and the second housing 6302 are connected to each other with the connection portion 6306, and the angle between the first housing 6301 and the second housing 6302 can be changed with the connection portion 6306. Videos displayed on the display portion 6303 may be switched in accordance with the angle at the connection portion 6306 between the first housing 6301 and the second housing 6302.

When a video taken by the video camera 6300 is recorded, the video needs to be encoded in accordance with a data recording format. With the use of the memory device of one embodiment of the present invention, the video camera 6300 can retain a temporary file generated at the time of encoding.

[ICD]

The memory device of one embodiment of the present invention can be used in an implantable cardioverter-defibrillator (ICD).

Figure 21J:
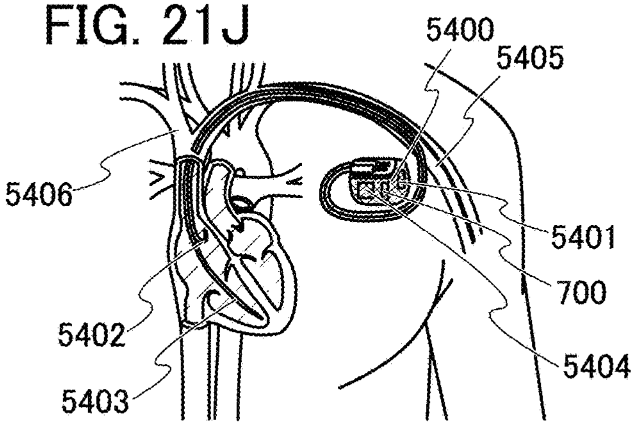

FIG. 21J is a schematic cross-sectional view illustrating an example of an ICD. An ICD main unit 5400 includes at least a battery 5401, the electronic component 700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 700.

The antenna 5404 can receive electric power, and the battery 5401 is charged with the electric power. When the ICD main unit 5400 includes a plurality of batteries, the safety can be improved. Specifically, even when some of the batteries in the ICD main unit 5400 are dead, the other batteries can work properly; hence, the batteries also function as an auxiliary power source.

In addition to the antenna 5404 capable of receiving electric power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The memory device of one embodiment of the present invention can be used in a computer such as a PC (Personal Computer) and an expansion device for an information terminal.

Figure 22A:
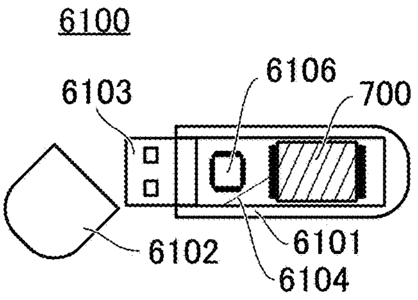

FIG. 22A illustrates, as an example of the extension device, a portable extension device 6100 that includes a chip capable of retaining information and is externally provided on a PC. The expansion device 6100 can store information using the chip when connected to a PC with a USB (Universal Serial Bus) or the like, for example. Note that although FIG. 22A illustrates the portable expansion device 6100, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device of one embodiment of the present invention or the like. For example, the electronic component 700 and a controller chip 6106 are attached to the substrate 6104. The USB connector 6103 functions as an interface for connection to an external device.

[SD Card]

The memory device of one embodiment of the present invention can be used in an SD card that can be attached to an electronic device such as an information terminal or a digital camera.

Figure 22B:
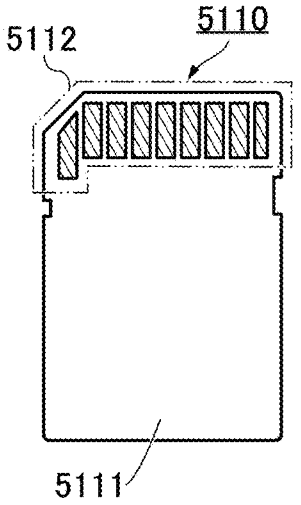
Figure 22C:
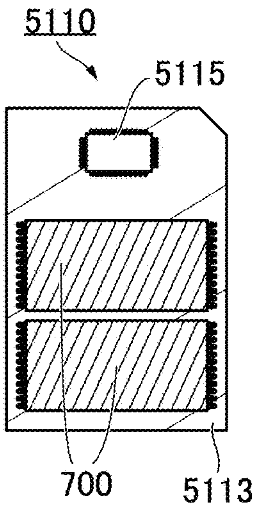

FIG. 22B is a schematic external view of an SD card, and FIG. 22C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the electronic components 700 and a controller chip 5115 are attached to the substrate 5113. Note that the circuit configurations of the electronic component 700 and the controller chip 5115 are not limited to those described above, and the circuit configurations may be changed as appropriate depending on circumstances. For example, a write circuit, a row driver, a read circuit, and the like that are provided in an electronic component may be incorporated into the controller chip 5115 instead of the electronic component 700.

When the electronic component 700 is also provided on the back surface side of the substrate 5113, the capacity of the SD card 5110 can be increased. In addition, a wireless chip with a wireless communication function may be provided on the substrate 5113. This enables wireless communication between an external device and the SD card 5110, making it possible to write and read data to/from the electronic component 700.

[SSD]

The memory device of one embodiment of the present invention can be used in an SSD (Solid State Drive) that can be attached to an electronic device such as an information terminal.

Figure 22D:
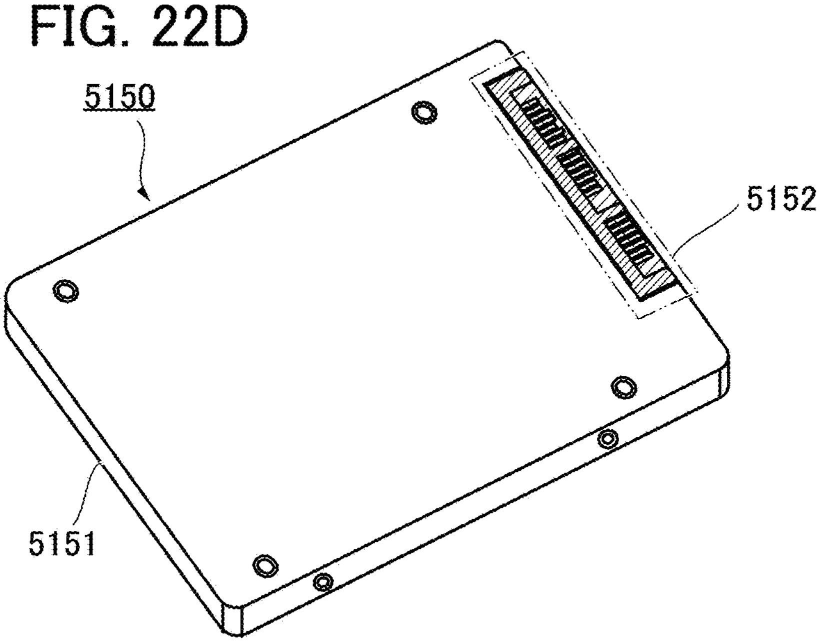
Figure 22E:
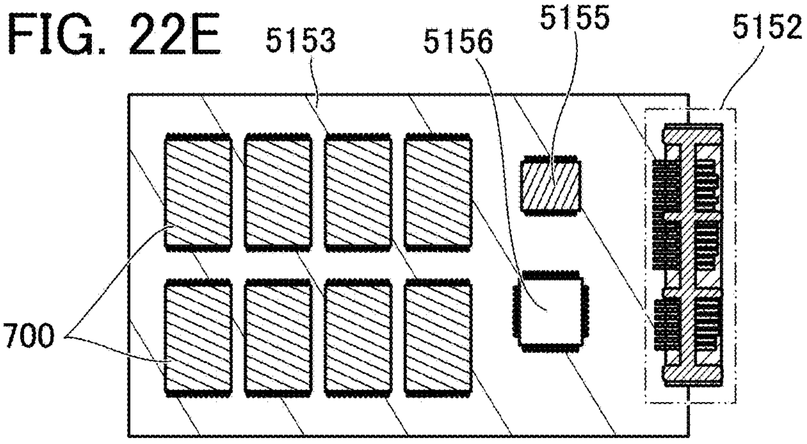

FIG. 22D is a schematic external view of an SSD, and FIG. 22E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the electronic components 700, a memory chip 5155, and a controller chip 5156 are attached to the substrate 5153. When the electronic component 700 is also provided on the back surface side of the substrate 5153, the capacity of the SSD 5150 can be increased. A work memory is incorporated into the memory chip 5155. For example, a DRAM chip can be used as the memory chip 5155. A processor, an ECC (Error Check and Correct) circuit, and the like are incorporated in the controller chip 5156. Note that the circuit configurations of the electronic component 700, the memory chip 5155, and the controller chip 5115 are not limited to those described above, and the circuit configurations may be changed as appropriate depending on circumstances. For example, a memory functioning as a work memory may also be provided in the controller chip 5156.

[Computer]

A computer 5600 illustrated in FIG. 23A is an example of a large computer. In the computer 5600, a plurality of rack mount computers 5620 are stored in a rack 5610.

The computer 5620 can have a structure in a perspective view illustrated in FIG. 23B, for example. In FIG. 23B, the computer 5620 includes a motherboard 5630, and the motherboard 5630 includes a plurality of slots 5631 and a plurality of connection terminals. A PC card 5621 is inserted in the slot 5631. The PC card 5621 includes a connection terminal 5623, a connection terminal 5624, and a connection terminal 5625, each of which is connected to the motherboard 5630.

The PC card 5621 illustrated in FIG. 23C is an example of a processing board provided with a CPU, a GPU, a memory device, and the like. The PC card 5621 includes a board 5622. The board 5622 includes the connection terminal 5623, the connection terminal 5624, the connection terminal 5625, a semiconductor device 5626, a semiconductor device 5627, a semiconductor device 5628, and a connection terminal 5629. Note that FIG. 23C also illustrates semiconductor devices other than the semiconductor device 5626, the semiconductor device 5627, and the semiconductor device 5628; the following description of the semiconductor device 5626, the semiconductor device 5627, and the semiconductor device 5628 can be referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe.

The connection terminal 5623, the connection terminal 5624, and the connection terminal 5625 can serve as, for example, an interface for performing power supply, signal input, or the like to the PC card 5621. As another example, they can serve as an interface for outputting a signal computed by the PC card 5621. Examples of the standard for each of the connection terminal 5623, the connection terminal 5624, and the connection terminal 5625 include USB (Universal Serial Bus), SATA (Serial ATA), and SCSI (Small Computer System Interface). In the case where video signals are output from the connection terminal 5623, the connection terminal 5624, and the connection terminal 5625, an example of the standard therefor is HDMI (registered trademark).

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, and a CPU. As the semiconductor device 5627, the electronic component 730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a memory device. As the semiconductor device 5628, the electronic component 700 can be used, for example.

The computer 5600 can also function as a parallel computer. When the computer 5600 is used as a parallel computer, large-scale computation necessary for artificial intelligence learning and inference can be performed, for example.

The memory device of one embodiment of the present invention is used in a variety of electronic devices or the like described above, whereby a reduction in size and a reduction in power consumption of the electronic devices can be achieved. In addition, since the memory device of one embodiment of the present invention has low power consumption, heat generation from a circuit can be reduced. Accordingly, it is possible to reduce adverse effects of the heat generation on the circuit itself, a peripheral circuit, and a module. Furthermore, the use of the memory device of one embodiment of the present invention can achieve an electronic device that operates stably even in a high-temperature environment. Thus, the reliability of the electronic device can be improved.

This embodiment can be combined with any of the other embodiments and examples as appropriate.

Embodiment 6

In this embodiment, a specific example of the case where the semiconductor device of one embodiment of the present invention is used in a device for space will be described with reference to FIG. 24.

The semiconductor device of one embodiment of the present invention includes an OS transistor. A change in electrical characteristics of the OS transistor due to exposure to radiation is small. That is, the OS transistor is highly resistant to radiation, and thus can be suitably used in an environment where radiation can enter. For example, the OS transistor can be suitably used in outer space. Specifically, the OS transistor can be used as a transistor included in a semiconductor device provided in a space shuttle, an artificial satellite, or a space probe. Examples of radiation include X-rays and a neutron beam. Note that outer space refers to, for example, space at an altitude greater than or equal to 100 km, and outer space in this specification may also include one or more of the thermosphere, mesosphere, and stratosphere.

FIG. 24 illustrates an artificial satellite 6800 as an example of a device for space. The artificial satellite 6800 includes a body 6801, a solar panel 6802, an antenna 6803, a secondary battery 6805, and a control device 6807. Note that in FIG. 24, a planet 6804 in outer space is illustrated as an example.

The amount of radiation in outer space is 100 or more times that on the ground. Note that examples of radiation include electromagnetic waves (electromagnetic radiation) typified by X-rays and gamma rays and particle radiation typified by alpha rays, beta rays, neutron beams, proton beams, heavy-ion beams, and meson beams.

When the solar panel 6802 is irradiated with sunlight, electric power required for the operation of the artificial satellite 6800 is generated. However, for example, in the situation where the solar panel is not irradiated with sunlight or the amount of sunlight with which the solar panel is irradiated is small, the amount of generated electric power is small. Accordingly, a sufficient amount of electric power required for the operation of the artificial satellite 6800 might not be generated. In order to operate the artificial satellite 6800 even with a small amount of generated electric power, the artificial satellite 6800 is preferably provided with the secondary battery 6805. Note that a solar panel is referred to as a solar cell module in some cases.

The artificial satellite 6800 can generate a signal. The signal is transmitted through the antenna 6803, and the signal can be received by a ground-based receiver or another artificial satellite, for example. When the signal transmitted by the artificial satellite 6800 is received, the position of a receiver that receives the signal can be measured. Thus, the artificial satellite 6800 can construct a satellite positioning system.

The control device 6807 has a function of controlling the artificial satellite 6800. The control device 6807 is formed with one or more selected from a CPU, a GPU, and a memory device, for example. Note that the semiconductor device including the OS transistor of one embodiment of the present invention is suitably used in the control device 6807. A change in electrical characteristics due to exposure to radiation is smaller in an OS transistor than in a Si transistor. That is, the OS transistor has high reliability and thus can be suitably used even in an environment where radiation can enter.

The artificial satellite 6800 can include a sensor. For example, with a structure including a visible light sensor, the artificial satellite 6800 can have a function of sensing sunlight reflected by a ground-based object. Alternatively, with a structure including a thermal infrared sensor, the artificial satellite 6800 can have a function of sensing thermal infrared rays emitted from the surface of the earth. Thus, the artificial satellite 6800 can have a function of an earth observing satellite, for example.

Although the artificial satellite is described as an example of a device for space in this embodiment, one embodiment of the present invention is not limited thereto. The semiconductor device of one embodiment of the present invention can be suitably used for a device for space, such as a spacecraft, a space capsule, or a space probe, for example.

Alternatively, for example, OS transistors can be used as transistors included in semiconductor devices provided in working robots in a nuclear power plant and a treatment plant or a disposal plant for radioactive wastes. In particular, OS transistors can be suitably used as transistors included in semiconductor devices provided in remote control robots that are controlled remotely in demolishment of a reactor facility, taking out of a nuclear fuel or a fuel debris, a field investigation on a space with a large amount of radioactive substance, and the like.

This embodiment can be combined with any of the other embodiments and examples as appropriate.

Example 1

This example will describe the results of manufacturing a structure body including the oxide 230 illustrated in FIG. 1A to FIG. 1F and performing cross-sectional SEM observation. The structure body corresponds to the stack described in Embodiment 1.

In this example, a sample was prepared in which a base silicon oxide film, a hafnium oxide film (hereinafter referred to as an HfOx film), a silicon oxide film (hereinafter referred to as a SiOx film), an In—Ga—Zn oxide film (hereinafter referred to as an IGZO film), a stacked film of tantalum nitride and tungsten (hereinafter referred to as a TaNx\W film), a stacked film of silicon nitride and silicon oxide (hereinafter referred to as a SiNx\SiOx film), a tungsten film (hereinafter referred to as a W film), an SOC film, and an SOG film were stacked in this order over a silicon substrate. A resist mask was provided over the sample, and the etching treatment illustrated in FIG. 1A to FIG. 1F was performed.

Here, the base silicon oxide film corresponds to the insulator 216 illustrated in FIG. 1A to FIG. 1F. The HfOx film corresponds to the insulator 222. The SiOx film corresponds to the insulating film 224*f* and the insulator 224. The IGZO film corresponds to a stacked film of the oxide film 230*af* and the oxide film 230*bf* and a stacked film of the oxide 230*a* and the oxide 230*b*. The TaNx\W film corresponds to the conductive film 242*f* and the conductor 242. The SiNx\SiOx film corresponds to a stacked film of the insulating film 271_1*f* and the insulating film 271_2*f* and a stacked film of the insulator 271_1 and the insulator 271_2. The W film corresponds to the inorganic film 276*f* and the inorganic film 276. The SOC film corresponds to the coating film 277*f* and the coating film 277. The SOG film corresponds to the coating film 278*f* and the coating film 278.

First, the etching conditions necessary in the steps illustrated in FIG. 1A to FIG. 1F were selected. As in FIG. 1C, the SOC film needs to function as a mask at the time of etching of the TaNx\W film. If the SOC film is removed during the etching of the TaNx\W film, the W film provided under the SOC film is also removed.

In view of the above, a TaNx film and a W film included in the TaNx\W film and the SOC film were subjected to dry etching treatment to measure their etching rates. Furthermore, the etching selectivity of the TaNx film to the SOC film (hereinafter referred to as TaNx/SOC selectivity) and the etching selectivity of the W film to the SOC film (hereinafter referred to as W/SOC selectivity) were calculated.

The above-described dry etching treatment was performed using a CCP etching apparatus. As for the etching conditions, a $CHF_3$ gas at 35 sccm, a $Cl_2$ gas at 15 sccm, and an Ar gas at 10 sccm were used as an etching gas; the pressure was 0.6 Pa; the interelectrode distance was 80 mm; the top electrode power was 1000 W; and the substrate temperature was 60° C. The etching rates were measured under the conditions where the bottom electrode power was 10 W, 25 W, 50 W, and 100 W.

FIG. 25A shows the measurement results of the etching rates, and FIG. 25B shows the etching selectivities. Here, in FIG. 25A, the horizontal axis denotes the bottom electrode power (Btm Power [W]), and the vertical axis denotes the etching rate [nm/min]. In FIG. 25B, the horizontal axis denotes the bottom electrode power (Btm Power [W]), and the vertical axis denotes the etching selectivity.

As shown in FIG. 25A, the etching rates of the TaNx film and the W film were substantially equal to or lower than the etching rate of the SOC film under the conditions where the bottom electrode power was higher than or equal to 25 W. In FIG. 25B, the TaNx/SOC selectivity and the W/SOC selectivity were lower than or equal to 1.0. In contrast, under the condition where the bottom electrode power was 10 W, the etching rates of the TaNx film and the W film were higher than the etching rate of the SOC film. Under the condition where the bottom electrode power was 10 W, the TaNx/SOC selectivity was 1.38 and the W/SOC selectivity was 1.42.

As described above, the bottom electrode power is at least lower than 25 W, preferably lower than or equal to 10 W in the etching of the TaNx\W film. By etching the TaNx\W film under such a condition, the TaNx\W film can be removed without disappearance of the SOC film.

Next, a method for manufacturing Sample 1A and Sample 1B in each of which the above-described structure body was formed will be described.

First, a silicon substrate was prepared, and a base silicon oxide film was deposited over the silicon substrate by a CVD method. Next, a 20-nm-thick HfOx film was formed over the base silicon oxide film by an ALD method.

Subsequently, a SiOx film was formed over the HfOx film, and then an IGZO film was formed over the SiOx film. The SiOx film and the IGZO film were successively formed without exposure to the air. The SiOx film was formed to a thickness of 20 nm by a sputtering method using a Si target.

Here, the IGZO film has a stacked-layer structure of a 10-nm-thick IGZO(132) film and a 15-nm-thick IGZO(111) film over the IGZO(132) film. The IGZO(132) film corresponds to the oxide film 230*af* and the oxide 230*a* illustrated in FIG. 1A to FIG. 1F. The IGZO(111) film corresponds to the oxide film 230*bf* and the oxide 230*b* illustrated in FIG. 1A to FIG. 1F. The IGZO film (132) was formed by a sputtering method using a target with In:Ga:Zn=1:3:2 [atomic ratio], and the IGZO film (111) was formed by a sputtering method using a target with In:Ga:Zn=1:1:1.2 [atomic ratio].

Next, a TaNx\W film was formed over the IGZO film by a sputtering method. The TaNx\W film is a stacked film of a 5-nm-thick TaNx film and a 15-nm-thick W film over the TaNx film. The TaNx film was formed using a tantalum target in an atmosphere containing a nitrogen gas. The W film was formed using a tungsten target.

Then, a SiNx\SiOx film was formed over the TaNx\W film by a sputtering method. The SiNx\SiOx film is a stacked film of a 5-nm-thick SiNx film and a 10-nm-thick SiOx film over the SiNx film. The SiNx film was formed using a silicon target in an atmosphere containing a nitrogen gas. The SiOx film was formed using a silicon target in an atmosphere containing an oxygen gas.

Subsequently, a 15-nm-thick W film was formed over the SiNx\SiOx film by a sputtering method. Next, an SOC film was formed over the W film by a spin coating method. Then, an SOG film was formed over the SOC film by a spin coating method.

Over the stack manufactured in the above manner, a negative resist film was formed as in FIG. 1A. The resist film was irradiated with an electron beam, thereby forming island-shaped resist masks. Note that in each of Sample 1A and Sample 1B, a region with island-shaped resist masks having a width of 30 nm and a region with island-shaped resist masks having a width of 60 nm were formed.

Next, dry etching treatment corresponding to FIG. 1B to FIG. 1F was performed using the island-shaped resist masks. The dry etching treatment was performed using a CCP etching apparatus. Table 1 shows the conditions of the dry etching treatment. Table 1 shows the interelectrode distance (Gap (mm)), top electrode power (Top Power (W)), bottom electrode power (Btm Power (W)), pressure (Press (Pa)), gas flow rate (Gas (sccm)), and substrate temperature (Tsub (° C.)) for the dry etching of each film.

TABLE 1

| | Gap (mm) | Top Power (W) | Btm Power (W) | Press (Pa) | Gas (sccm) | Tsub (° C.) |
|---|---|---|---|---|---|---|
| SOG | 45 | 800 | 150 | 10.6 | $CHF_3$ = 67<br>$O_2$ = 13 | 40 |
| SOC | 25 | 1000 | 200 | 6.6 | $H_2$ = 500<br>$N_2$ = 150 | 40 |
| W_1 | 80 | 1000 | 25 | 0.6 | $CF_4$ = 30<br>$Cl_2$ = 20 | 60 |
| SiNx\SiOx | 80 | 500 | 50 | 0.6 | $CHF_3$ = 67<br>$O_2$ = 13 | 60 |
| TaNx\W | 80 | 1000 | 10 or 25 | 0.6 | $CHF_3$ = 35<br>$Cl_2$ = 15<br>Ar = 10 | 60 |
| IGZO | 120 | 1000 | 400 | 1.2 | $CH_4$ = 18<br>Ar = 42 | 60 |
| SiOx | 80 | 500 | 50 | 0.6 | $CHF_3$ = 10<br>Ar = 70 | 60 |

TABLE 1-continued

| | Gap (mm) | Top Power (W) | Btm Power (W) | Press (Pa) | Gas (sccm) | Tsub (° C.) |
|---|---|---|---|---|---|---|
| W_2 | 120 | 500 | 25 | 1.3 | $CF_4$ = 22<br>$Cl_2$ = 11<br>$O_2$ = 22 | 60 |

First, as in FIG. 1B, under the conditions shown in Table 1, the SOG film was etched and then the SOC film was etched.

Next, as in FIG. 1C, under the conditions shown in Table 1, the W film was etched (denoted as W_1 in Table 1), and then the SiNr\SiOx film was etched, and subsequently the TaNx\W film was etched. Here, the bottom electrode power was 10 W in the etching of the TaNx\W film in Sample 1A, and the bottom electrode power was 25 W in the etching of the TaNx\W film in Sample 1B.

Then, as in FIG. 1D, the IGZO film was etched under the conditions shown in Table 1. Next, as in FIG. 1E, the SiOx film was etched under the conditions shown in Table 1.

Lastly, as in FIG. 1F, the W film remaining over the SiNx\SiOx film was removed by etching under the conditions shown in Table 1 (denoted as W_2 in Table 1).

Cross-sectional SEM images of Sample 1A and Sample 1B manufactured in the above manner were taken. The cross-sectional SEM images were taken at an acceleration voltage of 5 kV using "SU8030" produced by Hitachi High-Tech Corporation.

FIG. 26A to FIG. 27B show cross-sectional SEM images of Sample 1A and Sample 1B. Here, FIG. 26A is a cross-sectional SEM image of Sample 1A in a region where the width of the structure body is 30 nm, and FIG. 26B is a cross-sectional SEM image of Sample 1B in a region where the width of the structure body is 30 nm. FIG. 27A is a cross-sectional SEM image of Sample 1A in a region where the width of the structure body is 60 nm, and FIG. 27B is a cross-sectional SEM image of Sample 1B in a region where the width of the structure body is 60 nm.

As shown in FIG. 26A to FIG. 27B, in Sample 1B, the TaNx\W film formed with a bottom electrode power of 25 W receded significantly compared to that formed with a bottom electrode power of 10 W in Sample 1A, and thus the width of the structure body was narrowed. That is, the assumption is made that as shown in FIG. 25A and FIG. 25B, lowering the bottom electrode power makes the SOC film remain during the etching of the TaNx\W film and thus the W film is not etched. Accordingly, in one embodiment of the present invention, the TaNx\W film and the IGZO film can be collectively processed by the method illustrated in FIG. 1A to FIG. 1F, whereby the productivity of the semiconductor device can be increased.

In particular, the TaNx\W film receded largely in Sample 1B in the region where the width of the structure body was 30 nm, whereas the recession of the TaNx\W film was inhibited in Sample 1A in the region where the width of the structure body was 30 nm. Accordingly, as described in the above embodiment, even in a semiconductor device having a minute structure, processing can be performed as designed by employing the conditions described in this example.

This example can be combined with the embodiments and the other example as appropriate.

Example 2

In this example, the results of manufacturing the structure body illustrated in FIG. 8A to FIG. 8D (hereinafter referred to as Sample 2A) will be described.

In Sample 2A, a silicon nitride film (hereinafter referred to as a barrier SiNx film) and a silicon oxide film (hereinafter referred to as an interlayer SiOx film) were formed in this order over a structure body similar to that in Sample 1A, and an opening was formed as illustrated in FIG. 8A to FIG. 8D. Here, the barrier SiNx film corresponds to the insulator 275, and the interlayer SiOx film corresponds to the insulator 280. Note that the components corresponding to those in Sample 1A are hereinafter called in the same manner as Example 1.

First, the etching conditions necessary in the step illustrated in FIG. 8A to FIG. 8D were selected. As illustrated in FIG. 8A to FIG. 8D, the surface of the IGZO film needs to be prevented from being etched when the TaNx\W film is etched. Thus, etching needs to be performed so that the etching selectivity of the TaNx\W film to the IGZO film is high.

In view of the above, a TaNx film and a W film included in the TaNx\W film and the IGZO film were subjected to dry etching treatment to measure their etching rates. Furthermore, the etching selectivity of the TaNx film to the IGZO film (hereinafter referred to as TaNx/IGZO selectivity) and the etching selectivity of the W film to the IGZO film (hereinafter referred to as W/IGZO selectivity) were calculated.

The above-described dry etching treatment was performed using an ICP etching apparatus. As for the etching conditions, a $CF_4$ gas at 40 sccm and a $Cl_2$ gas at 60 sccm were used as an etching gas, the pressure was 0.67 Pa, the ICP power was 1000 W, and the substrate temperature was −10° C. The etching rates were measured under the conditions where the bias power was 10 W, 50 W, and 100 W.

FIG. 28A shows the measurement results of the etching rates, and FIG. 28B shows the etching selectivities. Here, in FIG. 28A, the horizontal axis denotes the bias power (Bias [W]), and the vertical axis denotes the etching rate [nm/min]. In FIG. 28B, the horizontal axis denotes the bias power (Bias [W]), and the vertical axis denotes the etching selectivity.

As shown in FIG. 28A, the etching rates of the TaNx film and the W film increased as the bias power increased, whereas the etching rate of the IGZO film hardly changed. As shown in FIG. 28B, the TaNx/IGZO selectivity and the W/IGZO selectivity were higher than 1.0 under any of the conditions. The TaNx/IGZO selectivity and the W/IGZO selectivity were significantly high even with a bias power of 100 W, with which the etching rates of the TaNx film and the W film were maximum. Thus, in manufacture of Sample 2A, the bias power was set to 100 W when the TaNx\W film was etched.

Next, a method for manufacturing Sample 2A in which the above-described structure body was formed will be described.

First, a structure body similar to that in Sample 1A was prepared, and a barrier SiNx film was formed to cover the structure body formed of a stack including a SiOx film, an IGZO film, a TaNx\W film, and a SiNx\SiOx film. The barrier SiNx film was formed to a thickness of 5 nm by a PEALD method. Note that like Sample 1A, Sample 2A includes a region where the width of the structure body is 30 nm and a region where the width of the structure body is 60 nm.

Next, an interlayer SiOx film was formed over the barrier SiNx film by a sputtering method. The interlayer SiOx film was formed using a silicon target in an atmosphere containing an oxygen gas. The top surface of the interlayer SiOx film was planarized by CMP treatment after the film formation. The interlayer SiOx film was made such that its thickness over the SiNx\SiOx film was 45 nm.

Subsequently, dry etching treatment was performed to process the interlayer SiOx film, the barrier SiNx film, and the SiNx\SiOx film, thereby forming an opening reaching the TaNx\W film.

Figure 8A:
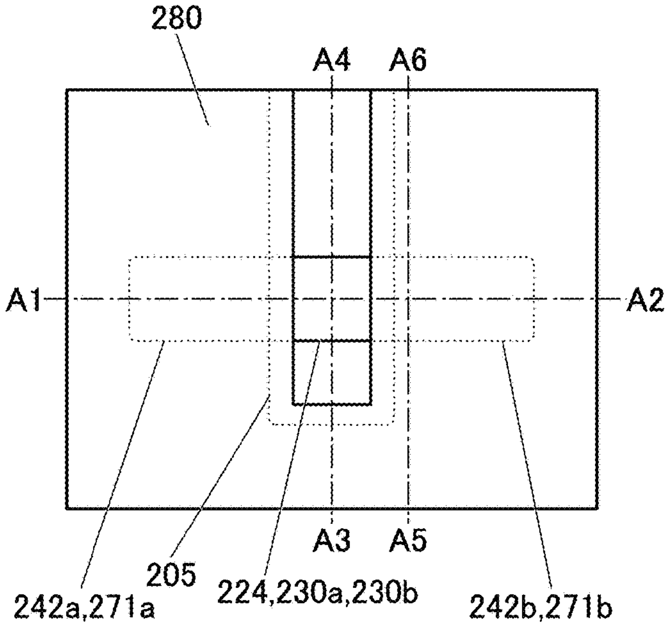
FIG. 8A is a plan view illustrating an example of a method for manufacturing a semiconductor device.
Figure 8C:
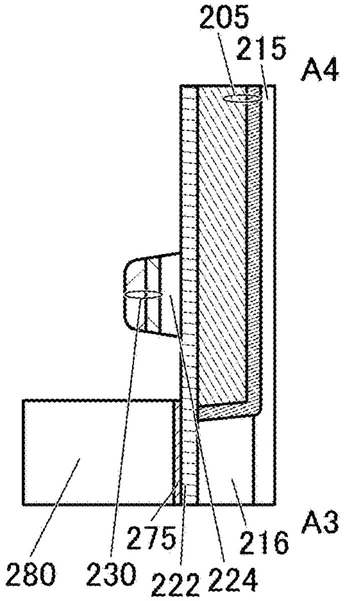
FIG. 8B to FIG. 8D are cross-sectional views illustrating an example of a method for manufacturing a semiconductor apparatus.
Figure 8B:
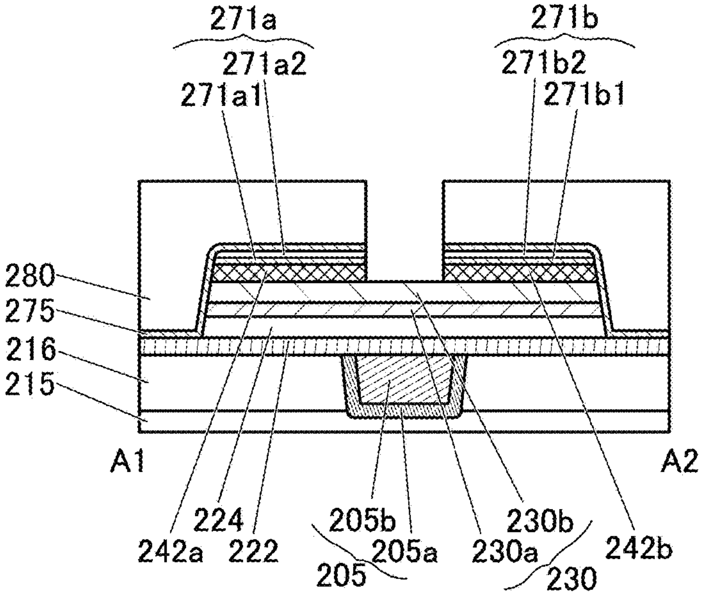
Figure 8D:
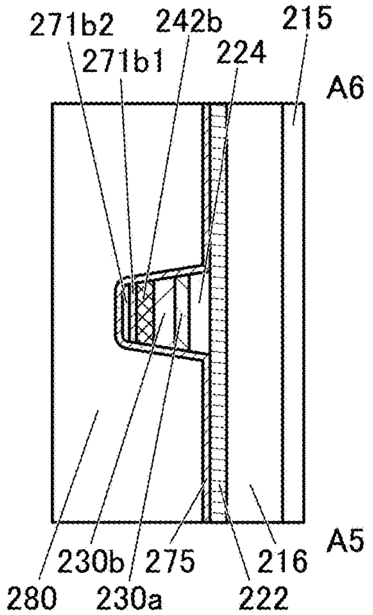
Figure 9A:
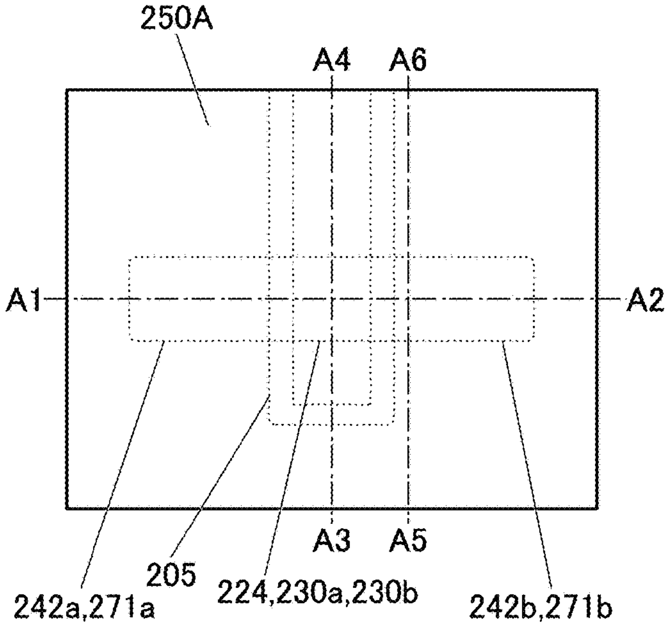
FIG. 9A is a plan view illustrating an example of a method for manufacturing a semiconductor device.
Figure 9C:
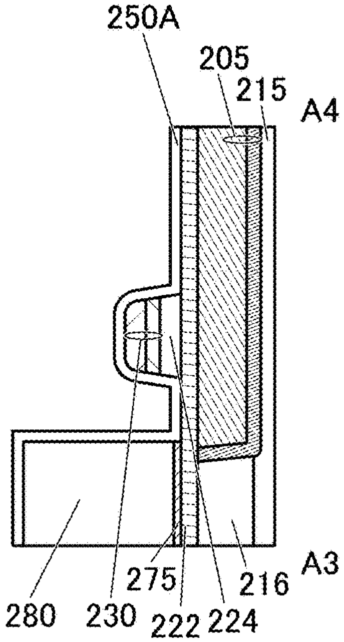
FIG. 9B to FIG. 9D are cross-sectional views illustrating an example of a method for manufacturing a semiconductor apparatus.
Figure 9B:
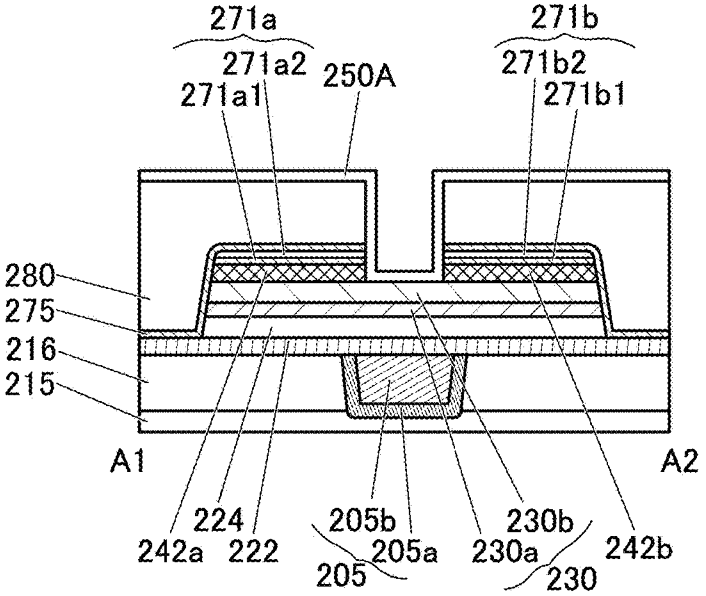
Figure 9D:
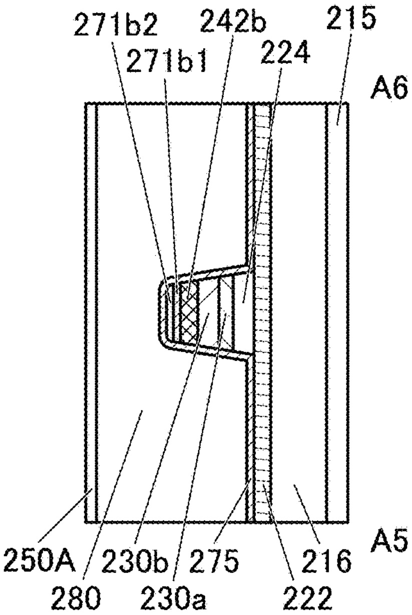

Then, the TaNx\W film was divided by dry etching treatment, whereby the conductors 242*a* and 242*b* illustrated in FIG. 8B, i.e., the source electrode and the drain electrode were formed. Here, the dry etching treatment was performed using an ICP etching apparatus. As for the etching conditions, a $CF_4$ gas at 40 sccm and a $Cl_2$ gas at 60 sccm were used as an etching gas, the pressure was 0.67 Pa, the ICP power was 1000 W, the bias power was 100 W, and the substrate temperature was −10° C.

Note that the above-described opening was made to have a width of 30 nm in the region where the width of the structure body was 30 nm, and have a width of 60 nm in the region where the width of the structure body was 60 nm. In other words, a transistor having a channel length L/channel width W of 30 nm/30 nm was assumed in the region where the width of the structure body was 30 nm, and a transistor having a channel length L/channel width W of 60 nm/60 nm was assumed in the region where the width of the structure body was 60 nm.

Cross-sectional SEM images of Sample 2A manufactured in the above manner were taken. The cross-sectional SEM images were taken at an acceleration voltage of 5 kV using "SU8030" produced by Hitachi High-Tech Corporation.

FIG. 29A to FIG. 30B show cross-sectional SEM images of Sample 2A. Here, FIG. 29A is a cross-sectional SEM image in the channel length direction of the region where the width of the structure body is 30 nm, and FIG. 29B is a cross-sectional SEM image in the channel width direction of the region where the width of the structure body is 30 nm. FIG. 30A is a cross-sectional SEM image in the channel length direction of the region where the width of the structure body is 60 nm, and FIG. 30B is a cross-sectional SEM image in the channel width direction of the region where the width of the structure body is 60 nm.

As shown in FIG. 29A and FIG. 29B, in the region where the width of the structure body is 30 nm, neither a portion where the TaNx\W film remained nor a portion where the IGZO film was excessively etched was observed. Similarly, as shown in FIG. 30A and FIG. 30B, also in the region where the width of the structure body is 60 nm, neither a portion where the TaNx\W film remained nor a portion where the IGZO film was excessively etched was observed.

Accordingly, by processing the TaNx\W film under the above-described conditions, the source electrode and the drain electrode can be formed as designed.

This example can be combined with the embodiments and the other example as appropriate.

REFERENCE NUMERALS

BL[1]: wiring, BL[j]: wiring, BL[n]: wiring, BL_A: wiring, BL_B: wiring, BL: wiring, BW: signal, CE: signal, CLK: signal, EN_data: signal, GBL_A: wiring, GBL_B: wiring, GBL: wiring, GW: signal, MUX: selection signal, PL[1]: wiring, PL[i]: wiring, PL[m]: wiring, PL: wiring, RDA: signal, RE: control signal, VHH: wiring, VLL: wiring, VPC: intermediate potential, WAKE: signal, WDA: signal, WE: control signal, WL[1]: wiring, WL[i]: wiring, WL[m]: wiring, WL: wiring, 10[1,1]: memory cell, 10[i,j]: memory cell, 10[m,n]: memory cell, 10_A: memory cell, 10_B: memory cell, 10: memory cell, 11*a*: transistor, 11*b*: transistor, 11*c*: transistor, 11: transistor, 12*a*: capacitor, 12: capacitor, 20[1]: memory array, 20[2]: memory array, 20[5]: memory array, 20[m]: memory array, 20: memory array, 21: driver circuit, 22: PSW, 23: PSW, 31: peripheral circuit, 32: control circuit, 33: voltage generation circuit, 41: peripheral circuit, 42: row decoder, 43: row driver, 44: column decoder, 45: column driver, 46: sense amplifier, 47: input circuit, 48: output circuit, 50: functional layer, 51_A: functional circuit, 51_B: functional circuit, 51: functional circuit, 52_*a*: transistor, 52_*b*: transistor, 52: transistor, 53_*a*: transistor, 53_*b*: transistor, 53: transistor, 54_*a*: transistor, 54_*b*: transistor, 54: transistor, 55_*a*: transistor, 55_*b*: transistor, 55: transistor, 70[1]: repeating unit, 70: repeating unit, 71_A: precharge circuit, 71_B: precharge circuit, 72_A: switch circuit, 72_B: switch circuit, 73: write/read circuit, 81_1: transistor, 81_3: transistor, 81_4: transistor, 81_6: transistor, 82_1: transistor, 82_2: transistor, 82_3: transistor, 82_4: transistor, 83_A: switch, 83_B: switch, 83_C: switch, 83_D: switch, 153: conductor, 154: insulator, 160*a*: conductor, 160*b*: conductor, 160: conductor, 200: transistor, 205*a*: conductor, 205*b*: conductor, 205: conductor, 207: conductor, 208: insulator, 209: conductor, 210: insulator, 212: insulator, 214: insulator, 215: insulator, 216: insulator, 222: insulator, 224*f*: insulating film, 224: insulator, 230*a*: oxide, 230*af*: oxide film, 230*b*: oxide, 230*ba*: region, 230*bb*: region, 230*bc*: region, 230*bf*: oxide film, 230: oxide, 240*a*: conductor, 240*b*: conductor, 240: conductor, 241: insulator, 242*a*: conductor, 242*a*1: conductor, 242*a*2: conductor, 242*b*: conductor, 242*b*1: conductor, 242*b*2: conductor, 242*f*: conductive film, 242: conductor, 250*a*: insulator, 250A: insulating film, 250*b*: insulator, 250*c*: insulator, 250*d*: insulator, 250: insulator, 260*a*: conductor, 260A: conductive film, 260*b*: conductor, 260B: conductive film, 260: conductor, 261: conductor, 271_1: insulator, 271_1*f*: insulating film, 271_2: insulator, 271_2*f*: insulating film, 271*a*: insulator, 271*a*1: insulator, 271*a*2: insulator, 271*b*: insulator, 271*b*1: insulator, 271*b*2: insulator, 271: insulator, 275: insulator, 276*f*: inorganic film, 276: inorganic film, 277*f*: coating film, 277: coating film, 278*f*: coating film, 278: coating film, 279: resist mask, 280: insulator, 282: insulator, 283: insulator, 284: insulator, 285: insulator, 300A: memory device, 300: memory device, 310: transistor, 311: substrate, 313: semiconductor region, 314*a*: low-resistance region, 314*b*: low-resistance region, 315: insulator, 316: conductor, 320: insulator, 322: insulator, 324: insulator, 326: insulator, 328: conductor, 330: conductor, 700: electronic component, 702: printed circuit board, 704: circuit board, 711: mold, 712: land, 713: electrode pad, 714: wire, 730: electronic component, 731: interposer, 732: package substrate, 733: electrode, 735: semiconductor device, 1200: chip, 1201: package substrate, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display portion, 5303: keyboard, 5400: ICD main unit, 5401: battery, 5402: wire, 5403: wire, 5404: antenna, 5405: subclavian vein, 5406: superior vena cava, 5500: information terminal, 5510: housing, 5511: display portion, 5600: computer, 5610: rack, 5620: computer, 5621: PC card, 5622: board, 5623: connection terminal, 5624: connection terminal, 5625: connection terminal, 5626: semiconductor device, 5627: semiconductor device, 5628: semiconductor device, 5629: connection terminal, 5630: motherboard, 5631: slot, 5700: automobile, 5800: electric refrigerator-freezer, 5801: housing, 5802: refrigerator door, 5803: freezer door, 5900: information terminal, 5901: housing, 5902: display portion, 5903: operation switch, 5904: operation switch, 5905: band, 6100: expansion device, 6101: housing, 6102: cap, 6103: USB connector, 6104: substrate, 6106: controller chip, 6240: digital camera, 6241: housing, 6242: display portion, 6243: operation switch, 6244: shutter button, 6246: lens, 6300: video camera, 6301: first housing, 6302: second housing, 6303: display portion, 6304: operation switch, 6305: lens, 6306: connection portion, 6800: artificial satellite, 6801: body, 6802: solar panel, 6803: antenna, 6804: planet, 6805: secondary battery, 6807: control device, 7500: stationary game machine, 7520: main body, 7522: controller

The invention claimed is:

1. A method for manufacturing a stack, comprising:

forming an oxide semiconductor, a first conductor, a first insulator comprising a nitride, a second insulator comprising an oxide, an inorganic film, a first coating film, and a second coating film in this order over a substrate;

forming a resist mask over the second coating film;

processing the second coating film by a dry etching method using the resist mask as a mask, thereby forming an island-shaped second coating film;

processing the first coating film by a dry etching method using the island-shaped second coating film as a mask, thereby forming an island-shaped first coating film and removing the resist mask;

processing the inorganic film, the second insulator, the first insulator, and the first conductor in this order by a dry etching method using the island-shaped first coating film as a mask, thereby forming an island-shaped inorganic film, an island-shaped second insulator, an island-shaped first insulator, and an island-shaped first conductor and removing the island-shaped second coating film;

processing the oxide semiconductor by a dry etching method using the island-shaped inorganic film as a mask, thereby forming an island-shaped oxide semiconductor and removing the island-shaped first coating film; and removing the island-shaped inorganic film by a dry etching method.

2. The method for manufacturing a stack, according to claim 1, wherein the oxide semiconductor comprises indium, gallium, and zinc.

3. The method for manufacturing a stack, according to claim 1, wherein the first conductor comprises tantalum nitride.

4. The method for manufacturing a stack, according to claim 1, wherein the first conductor has a stacked-layer structure of a layer comprising tantalum nitride and a layer comprising tungsten over the layer comprising the tantalum nitride.

5. The method for manufacturing a stack, according to claim 1, wherein the first insulator comprises silicon nitride.

6. The method for manufacturing a stack, according to claim 1, wherein the second insulator comprises silicon oxide.

7. The method for manufacturing a stack, according to claim 1, wherein the inorganic film comprises tungsten.

8. The method for manufacturing a stack, according to claim 1, wherein the first coating film comprises carbon.

9. The method for manufacturing a stack, according to claim 1, wherein the second coating film comprises silicon and oxygen.

10. The method for manufacturing a stack, according to claim 1, further comprising:

depositing a third insulator and a fourth insulator in this order between the substrate and the oxide semiconductor; and processing the fourth insulator by a dry etching method using the island-shaped inorganic film as a mask after the island-shaped oxide semiconductor is formed, thereby forming an island-shaped fourth insulator.

11. The method for manufacturing a stack, according to claim 10, wherein the third insulator comprises hafnium oxide; and wherein the fourth insulator comprises silicon oxide.

12. A method for manufacturing a semiconductor device, comprising:

after manufacturing a stack by the method for manufacturing a stack, according to claim 1, dividing the first conductor into a second conductor and a third conductor; and forming a fifth insulator and a fourth conductor over the fifth insulator to overlap with a region between the second conductor and the third conductor.

* * * * *